United States Patent
Kambara et al.

(10) Patent No.: US 12,355,154 B2
(45) Date of Patent: Jul. 8, 2025

(54) ELECTROMAGNETIC WAVE REFLECTOR, ELECTROMAGNETIC WAVE REFLECTIVE FENCE, AND METHOD OF ASSEMBLING ELECTROMAGNETIC WAVE REFLECTOR

(71) Applicant: AGC Inc., Tokyo (JP)

(72) Inventors: Kumiko Kambara, Tokyo (JP); Koji Ikawa, Tokyo (JP)

(73) Assignee: AGC Inc., Tokyo (JP)

( * ) Notice: Subject to any disclaimer, the term of this patent is extended or adjusted under 35 U.S.C. 154(b) by 196 days.

(21) Appl. No.: 17/932,829

(22) Filed: Sep. 16, 2022

(65) Prior Publication Data

US 2023/0023706 A1 Jan. 26, 2023

Related U.S. Application Data

(63) Continuation of application No. PCT/JP2020/045591, filed on Dec. 8, 2020.

(30) Foreign Application Priority Data

Mar. 31, 2020 (JP) .................. 2020-064577
Oct. 14, 2020 (JP) .................. 2020-173308

(51) Int. Cl.
*H01Q 15/14* (2006.01)
*H01Q 15/00* (2006.01)

(52) U.S. Cl.
CPC ....... *H01Q 15/0086* (2013.01); *H01Q 15/142* (2013.01)

(58) Field of Classification Search
CPC .......... H01Q 15/14; H01Q 15/00; H01Q 19/10
See application file for complete search history.

(56) References Cited

U.S. PATENT DOCUMENTS

| 5,191,350 A | 3/1993 | Hemmie |
| 5,202,700 A * | 4/1993 | Miller .................... H01Q 19/17 |
| | | 343/840 |
| 10,257,965 B1 | 4/2019 | Hansen et al. |
| 12,040,544 B2 * | 7/2024 | Luo .................... H01Q 15/0013 |

(Continued)

FOREIGN PATENT DOCUMENTS

| JP | 1-233798 A | 9/1989 |
| JP | 2003-32165 A | 1/2003 |

(Continued)

OTHER PUBLICATIONS

3rd Generation Partnership Project; Technical Specification Group Services and System Aspects; Service requirements for cyber-physical control applications in vertical domains; Stage 1 (Release 17), 3GPP TS 22.104 V17.2.0 (Dec. 2019) 76 pages.

(Continued)

*Primary Examiner* — Hasan Islam
(74) *Attorney, Agent, or Firm* — Oblon, McClelland, Maier & Neustadt, L.L.P.

(57) ABSTRACT

An electromagnetic wave reflector includes a panel having a reflective surface that reflects a radio wave of a frequency band selected from 1 GHz to 170 GHz, and a support body that supports the panel. The support body has a connector part electrically connected to the reflective surface, the connector part being configured to propagate a reference potential of a reflection having occurred at the reflective surface.

19 Claims, 42 Drawing Sheets

(56) References Cited

U.S. PATENT DOCUMENTS

2010/0097290 A1    4/2010  Legay et al.
2019/0036226 A1    1/2019  Ding et al.
2019/0123448 A1    4/2019  Taraschi et al.

FOREIGN PATENT DOCUMENTS

| JP | 2007-35767 A  | 2/2007 |
| JP | 4892207 B2    | 3/2012 |
| JP | 2013-143562 A | 7/2013 |

OTHER PUBLICATIONS

Kwon, D. et al. "Arbitrary beam control using passive lossless metasurfaces enabled by orthogonally polarized custom surface waves" Physical Review B 97, 035439 (2018), 11 pages.

Asadchy, V.S. et al. "Perfect control of reflection and refraction using spatially dispersive metasurfaces" Physical Review B 94.075142 (2016), 14 pages.

\* cited by examiner $\theta$ in = $\theta$ ref $\theta$ in ≠ $\theta$ ref

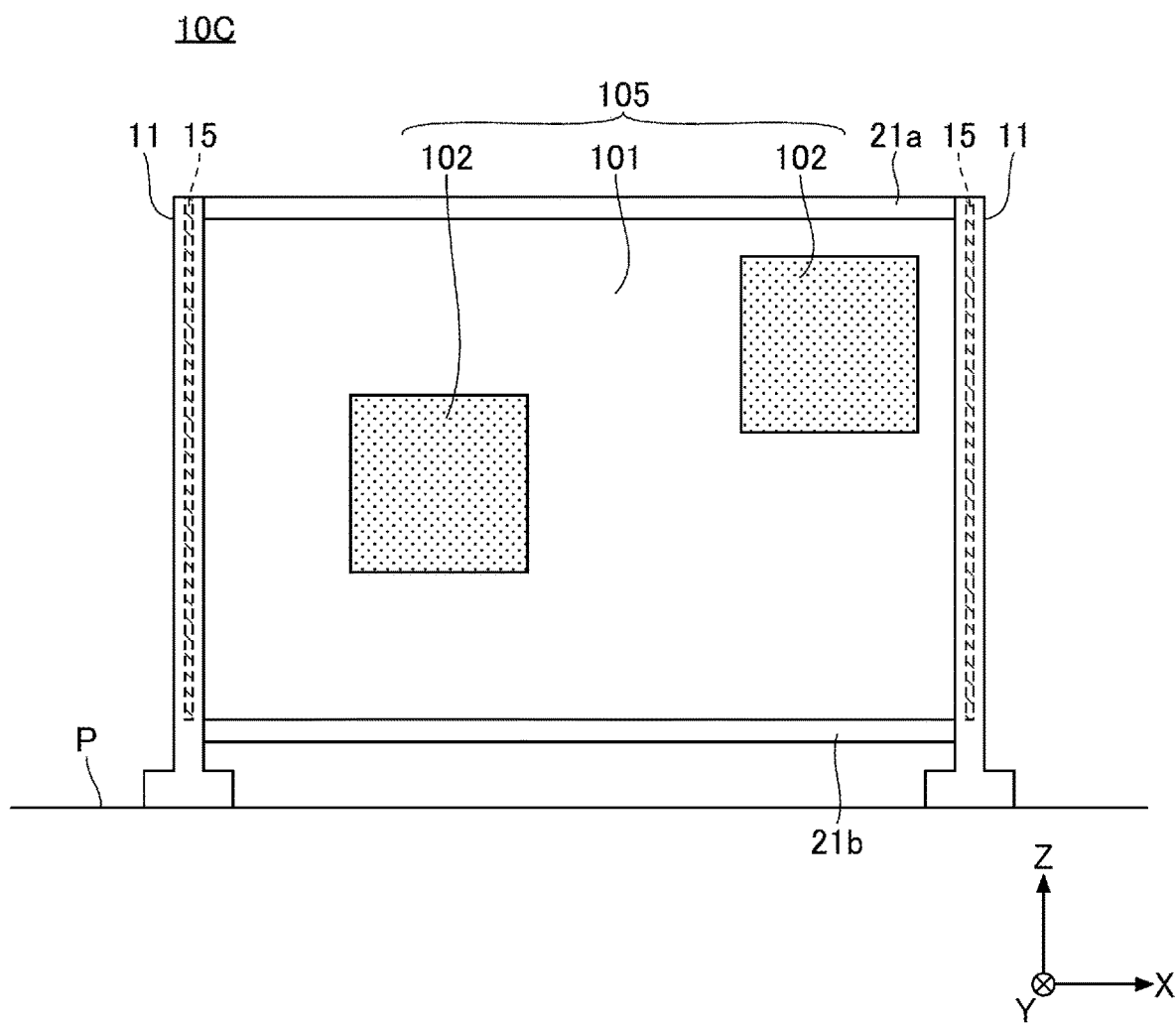

13A

13B

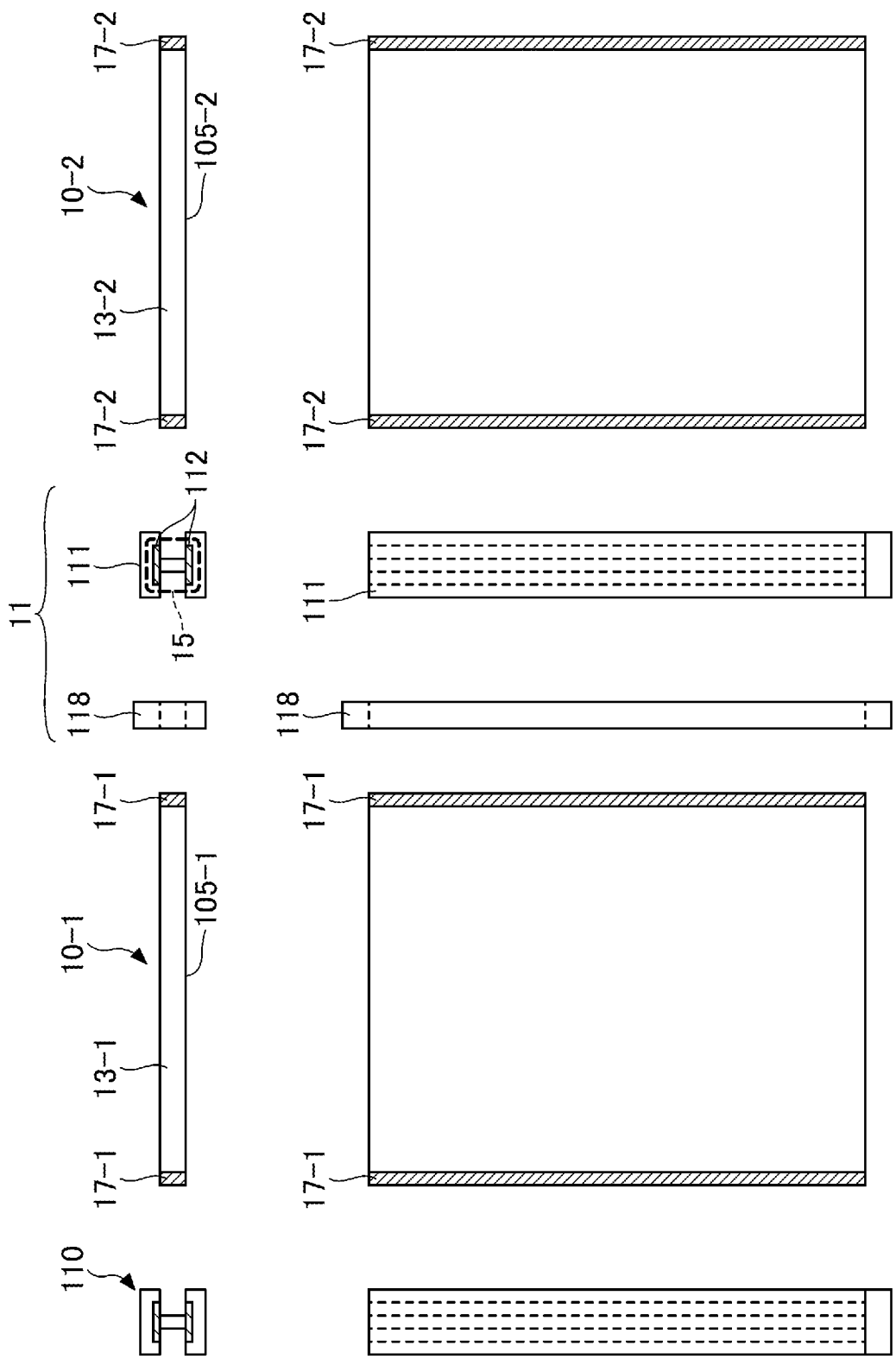

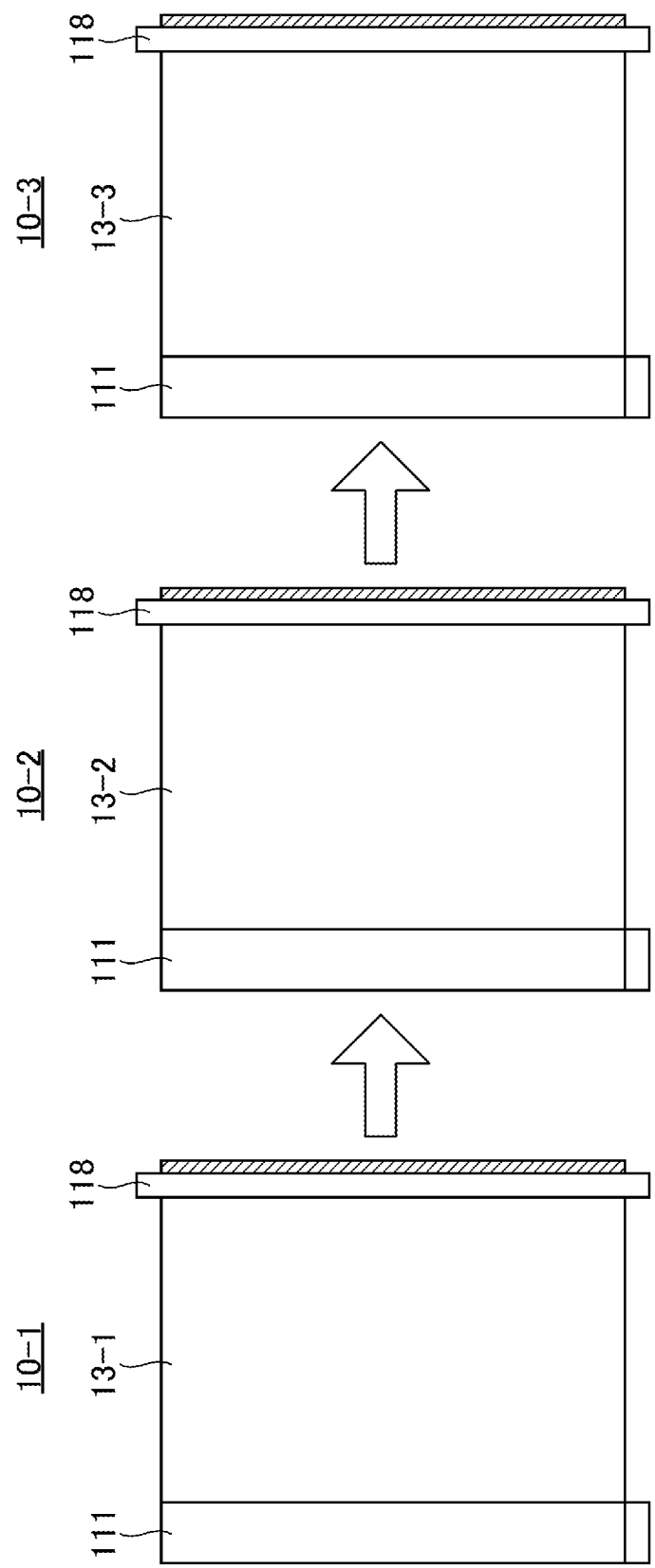

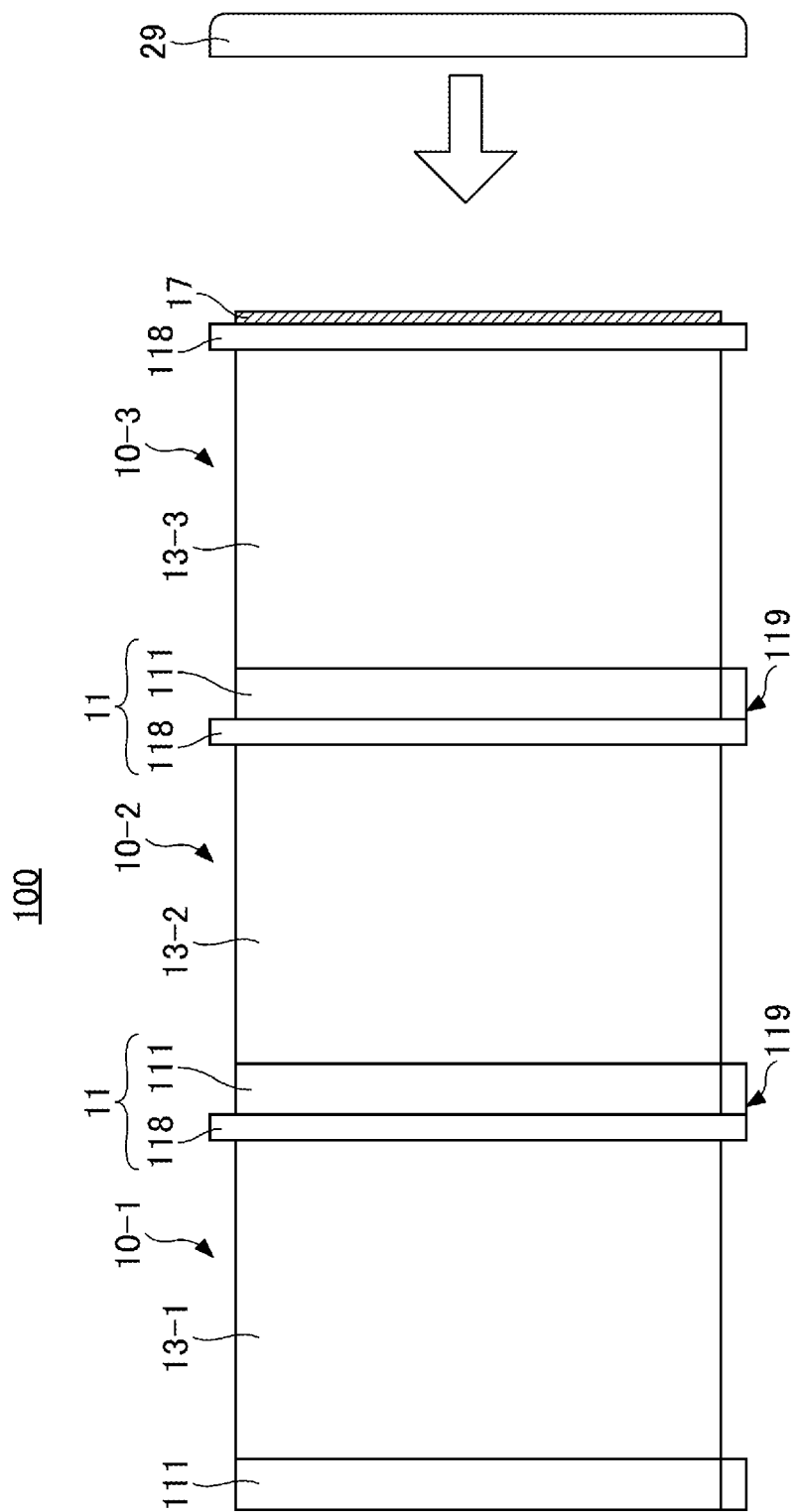

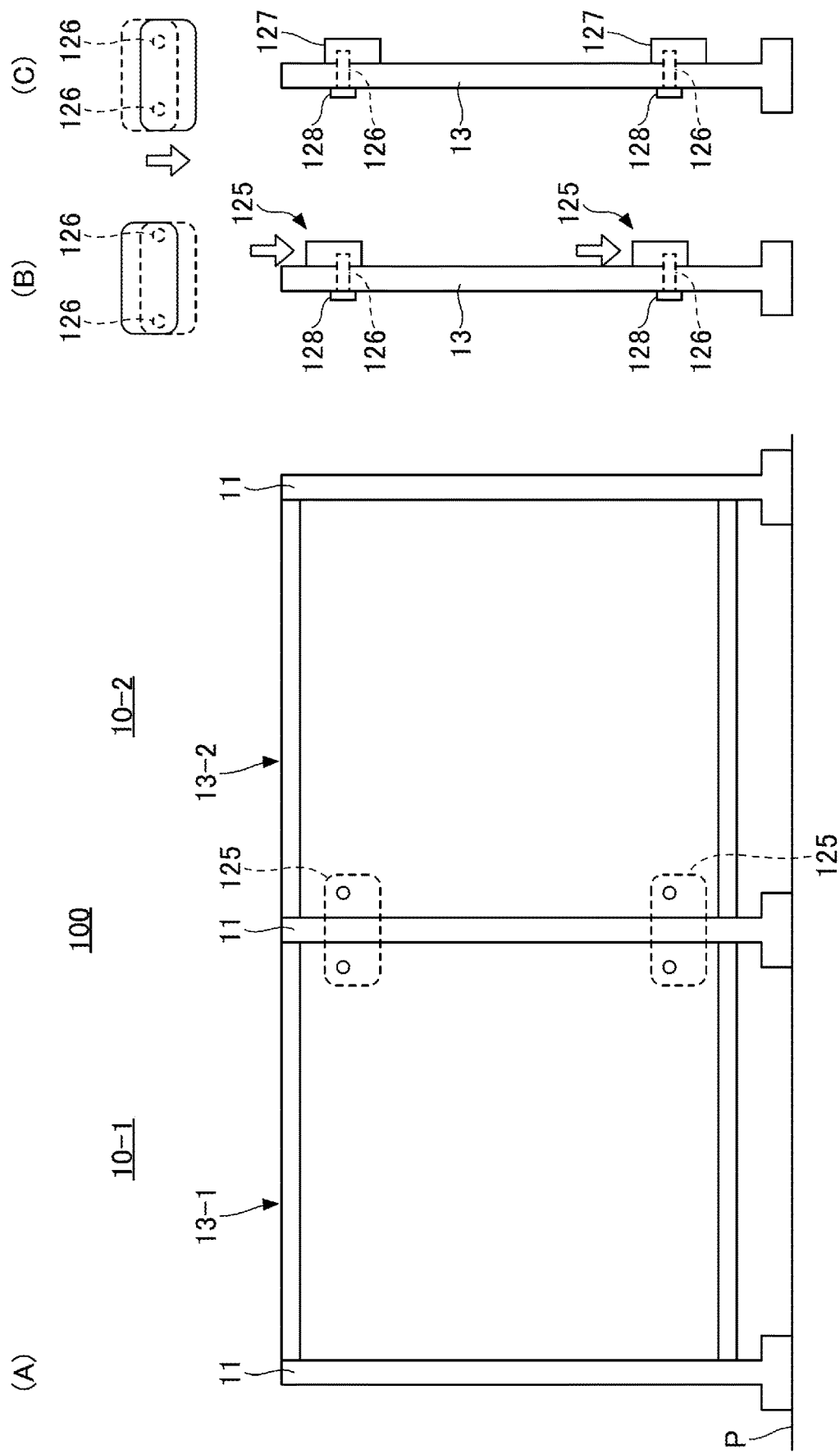

FIG.13
FRONT VIEW
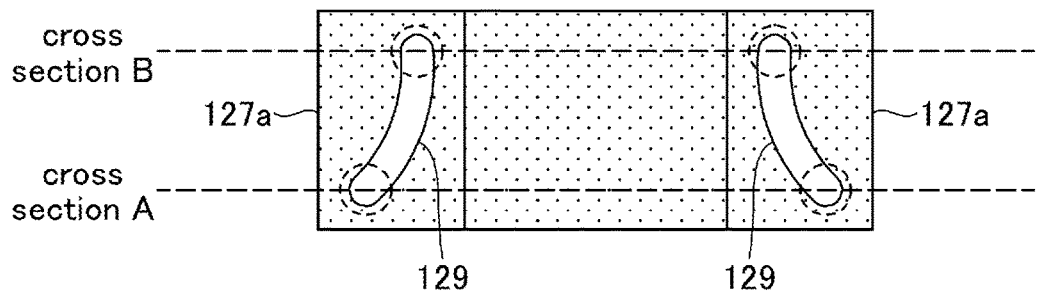
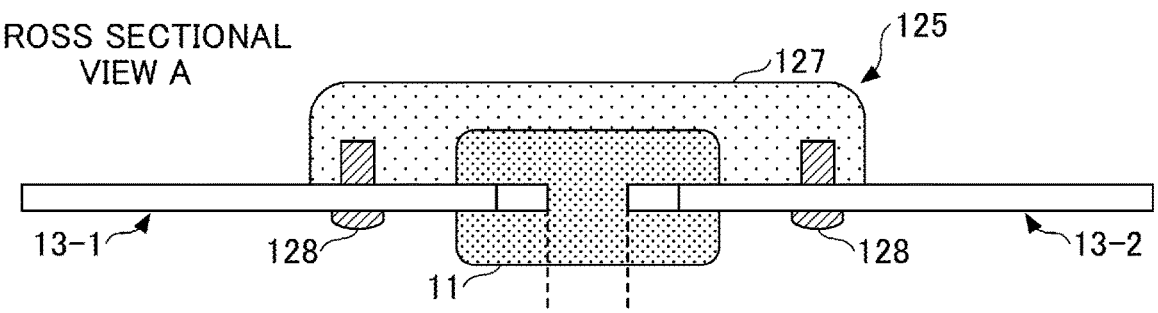
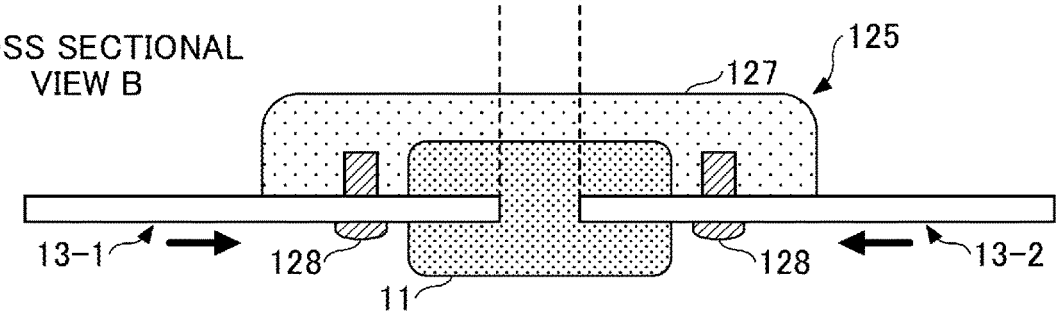

FIG.15
INCIDENT ANGLE 0°
(A) FRAME WIDTH
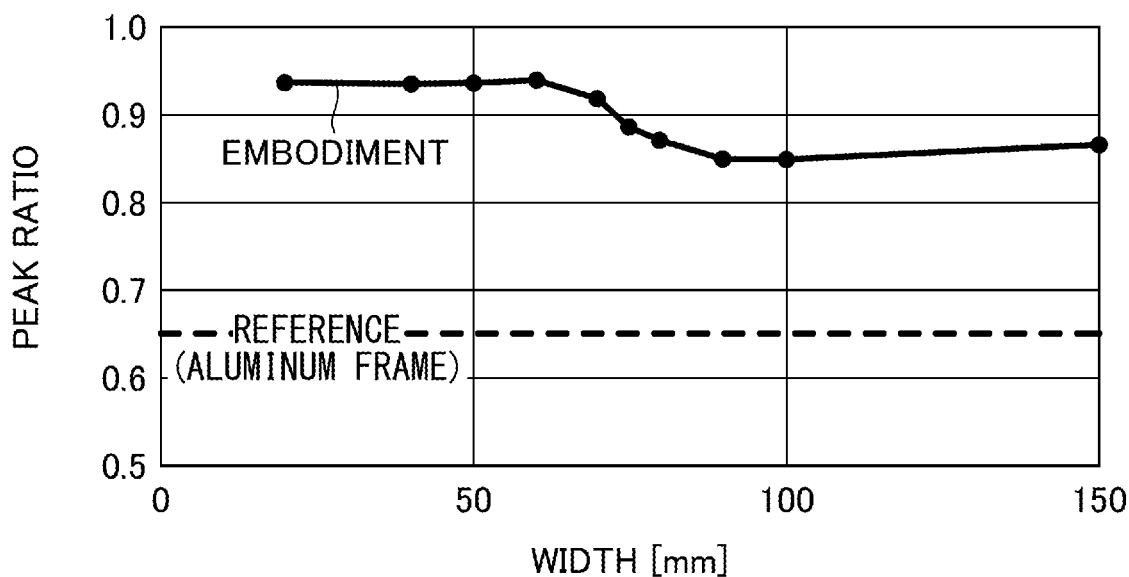
(B) FRAME THICKNESS
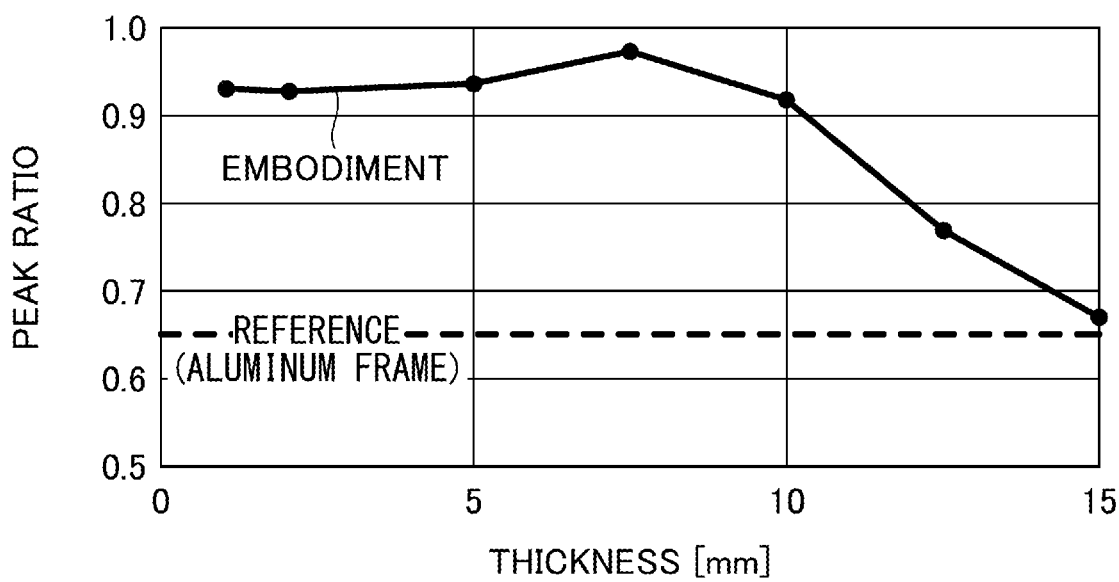

FIG.16
INCIDENT ANGLE 45°
(A) FRAME WIDTH
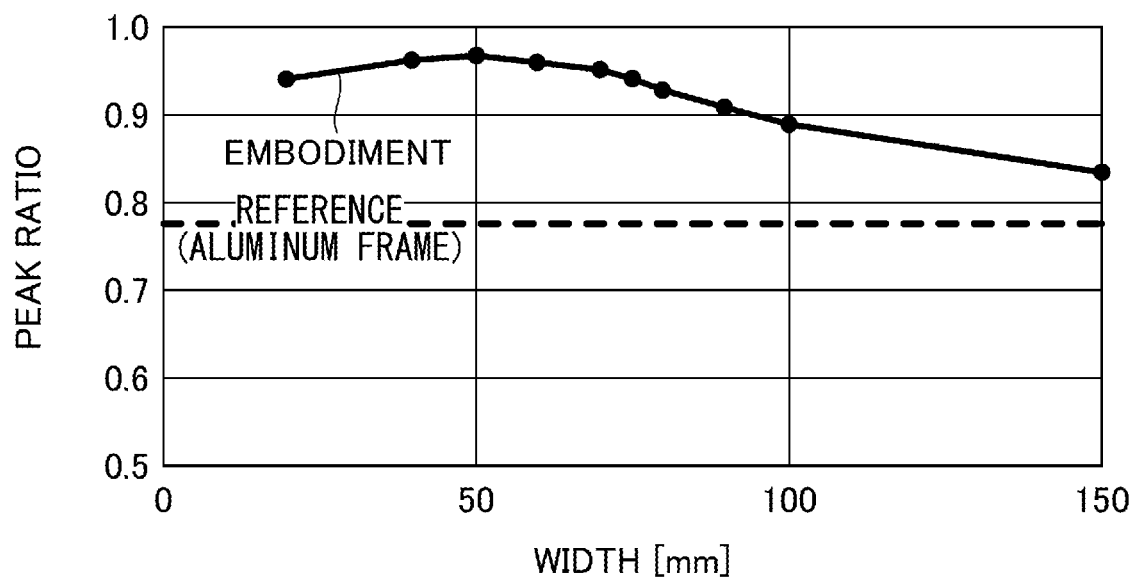
(B) FRAME THICKNESS
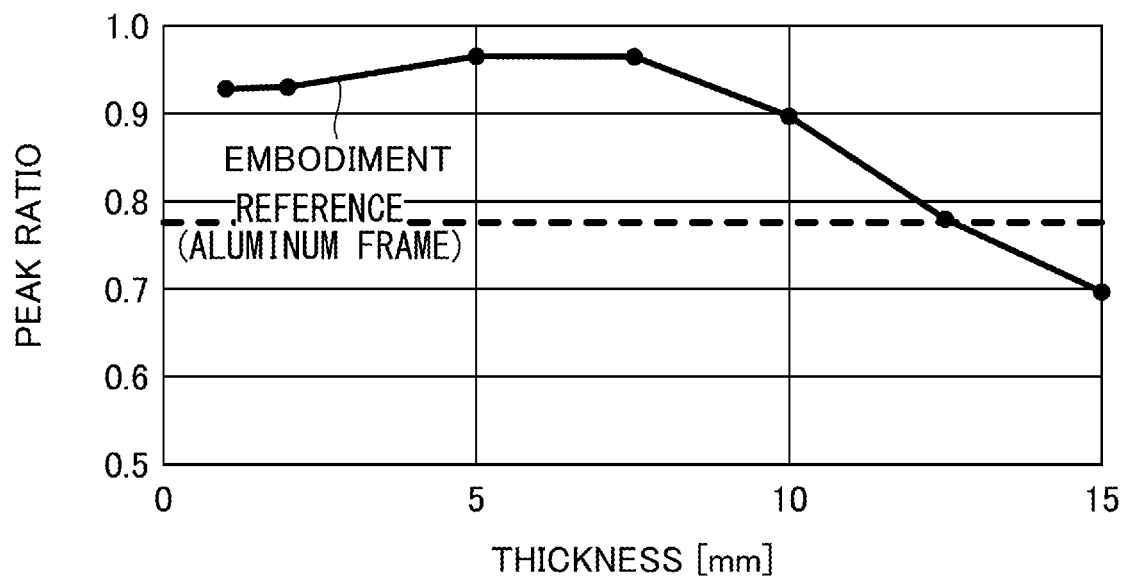

FIG.17
INCIDENT ANGLE 0°
(A) BRIDGE WIDTH
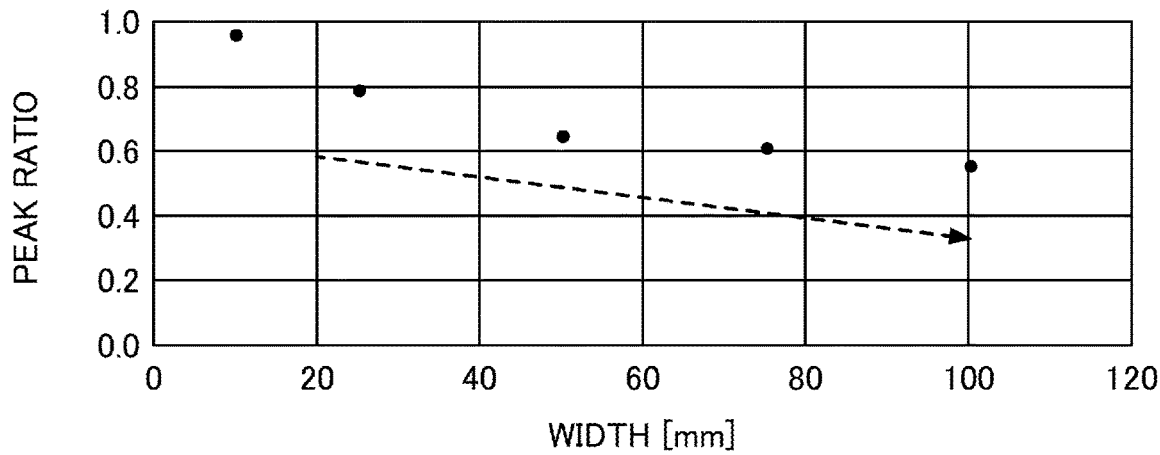
(B) BRIDGE THICKNESS
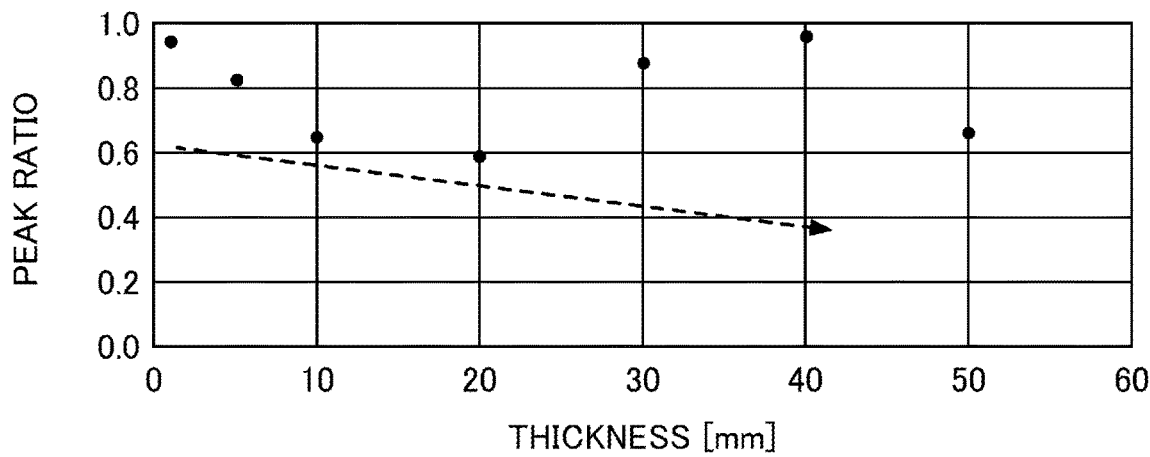
(C) ELECTRODE MATERIAL
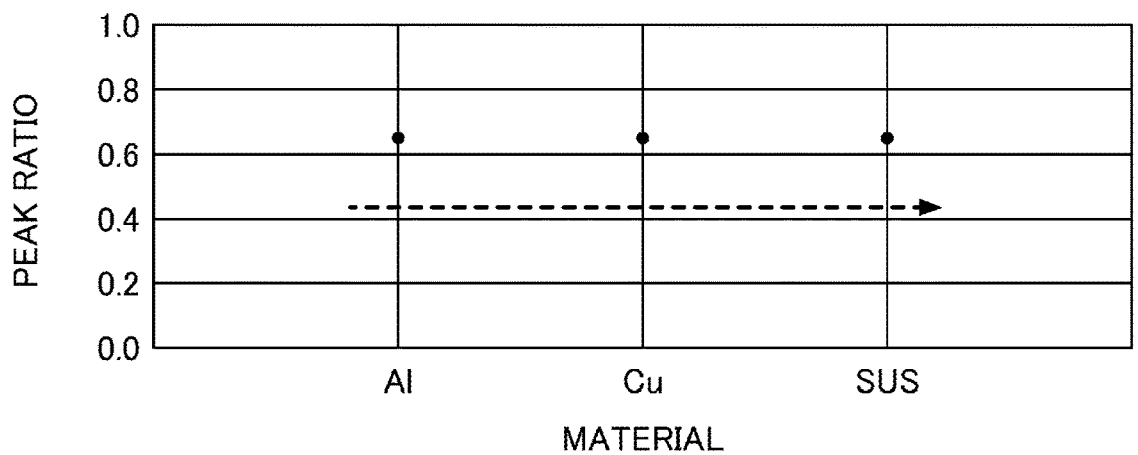

FIG.18
INCIDENT ANGLE 45°
(A) BRIDGE WIDTH
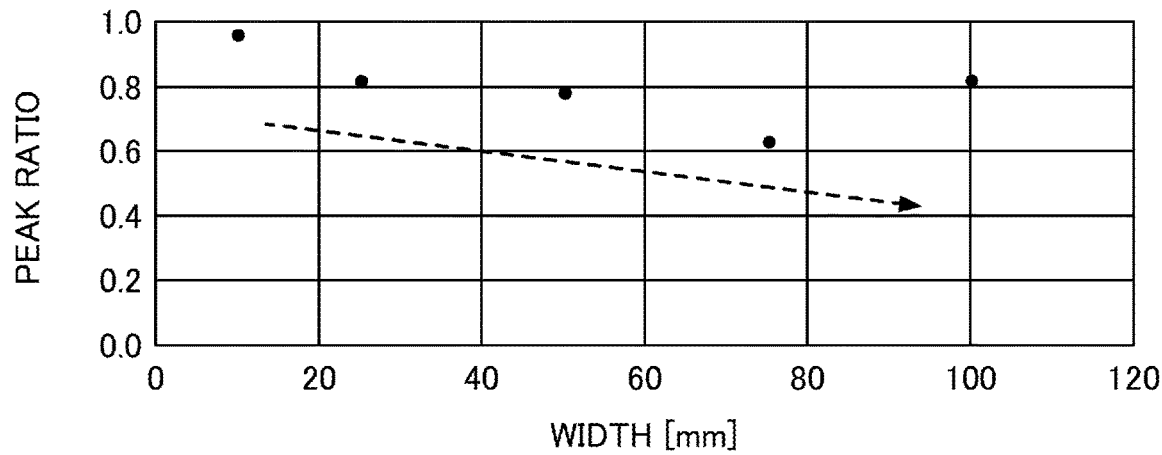
(B) BRIDGE THICKNESS
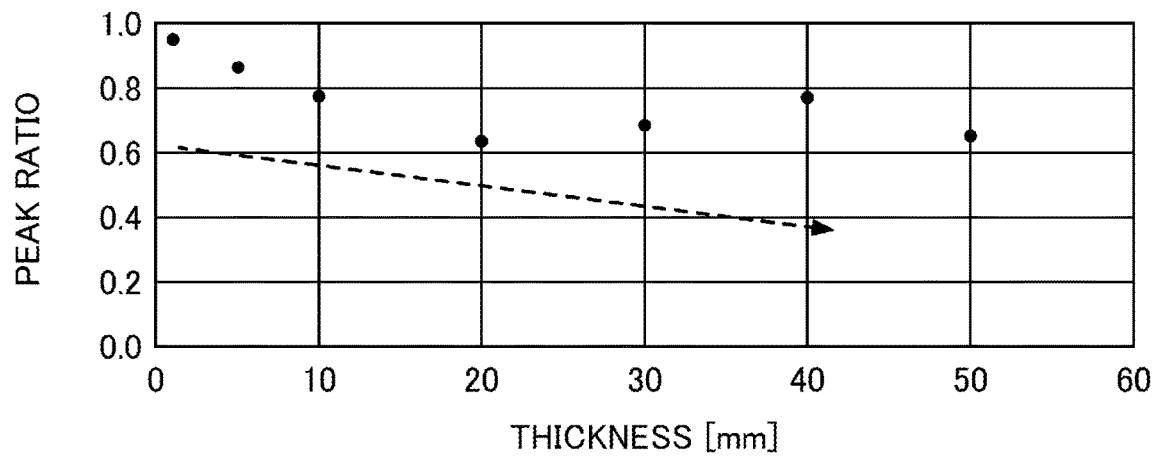
(C) ELECTRODE MATERIAL
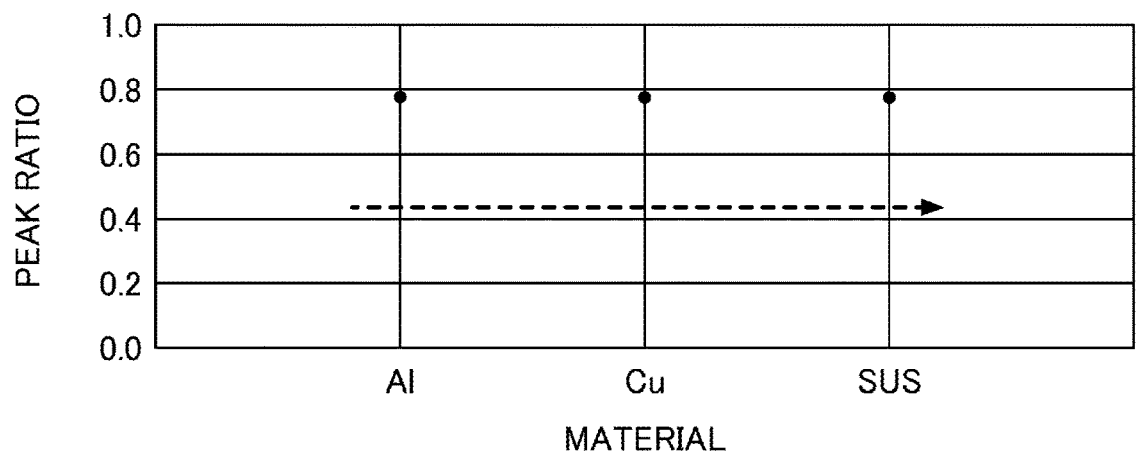

REFERENCED CONFIGURATION 1

REFERENCED CONFIGURATION 2

| Freq. | d1 [m] | d2 [m] | R [m] |
|---|---|---|---|
| 28 [GHz] | 30 | 10 | 0.283 |
| | 35 | 5 | 0.216 |
| 3.8 [GHz] | 30 | 10 | 0.770 |
| | 35 | 5 | 0.588 |

PATTERN 1: Deep in Shallow out

PATTERN 2: Shallow in Deep out

FIG.31A
PATTERN 1: Deep in Shallow out
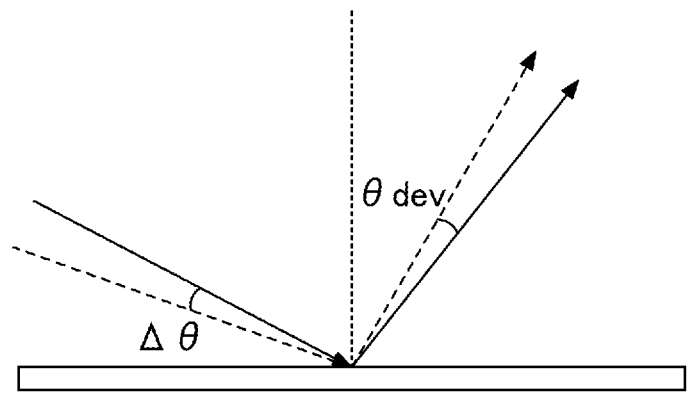
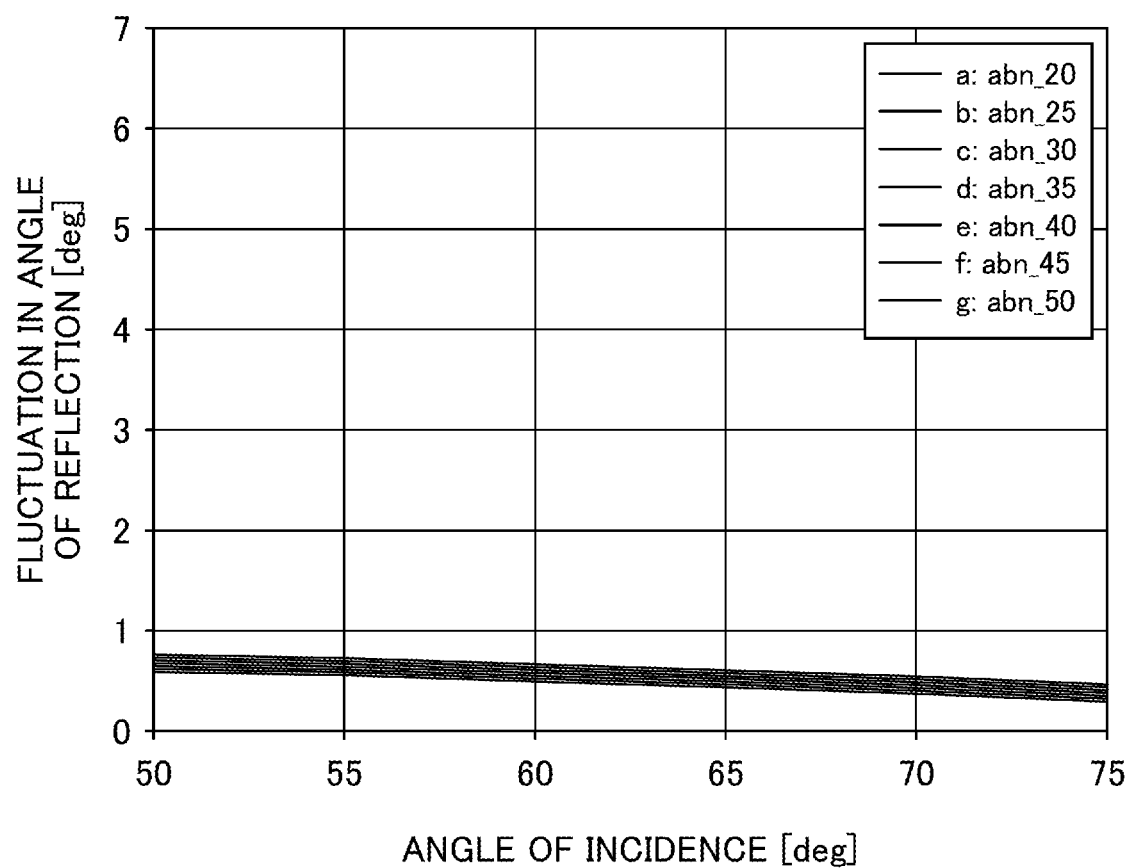

FIG.31B
PATTERN 2: Shallow in Deep out
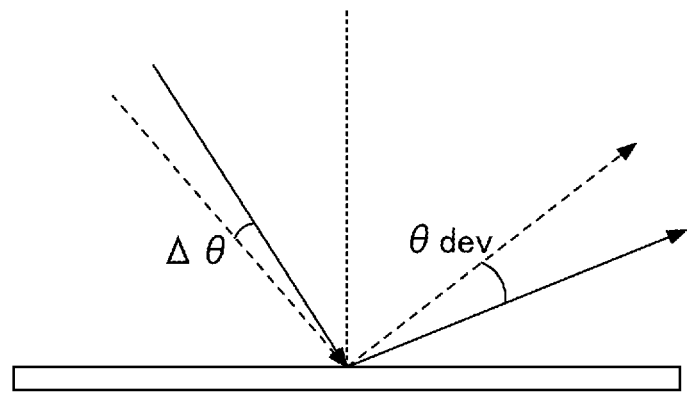
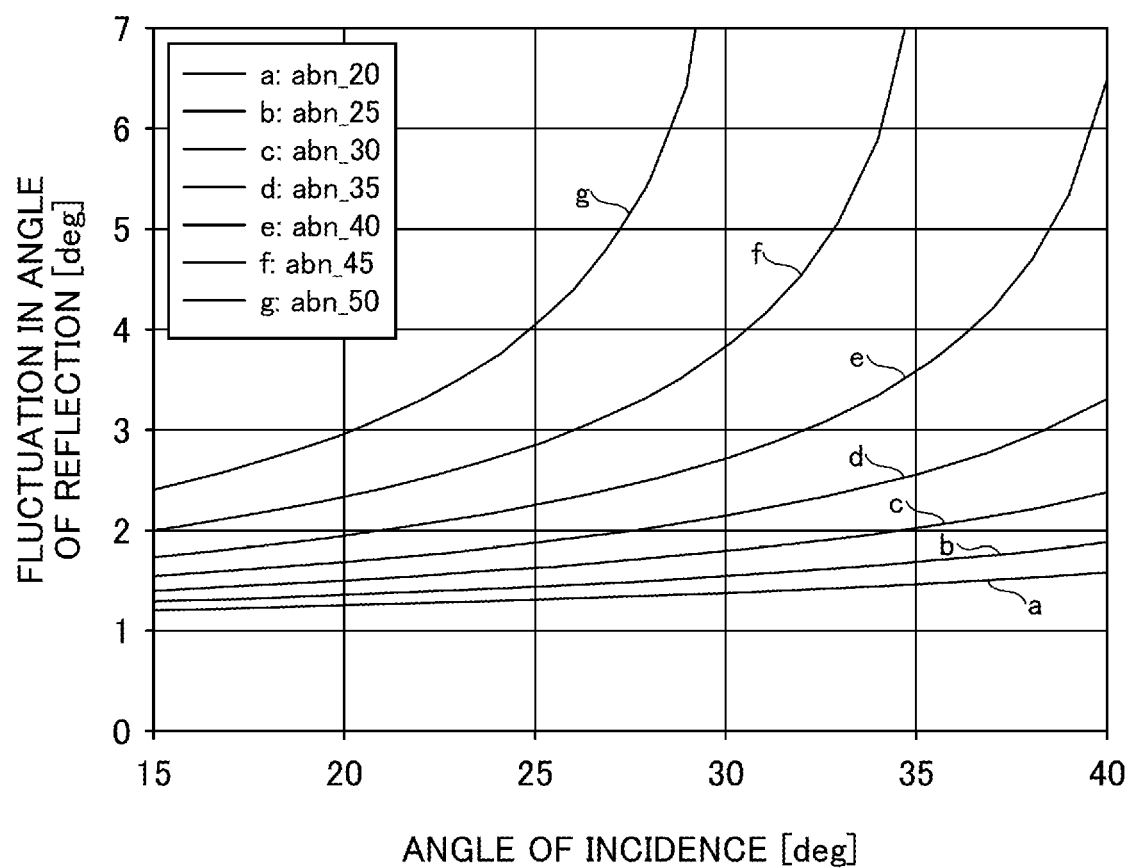

FIG.32

QUANTIFICATION OF ROBUSTNESS

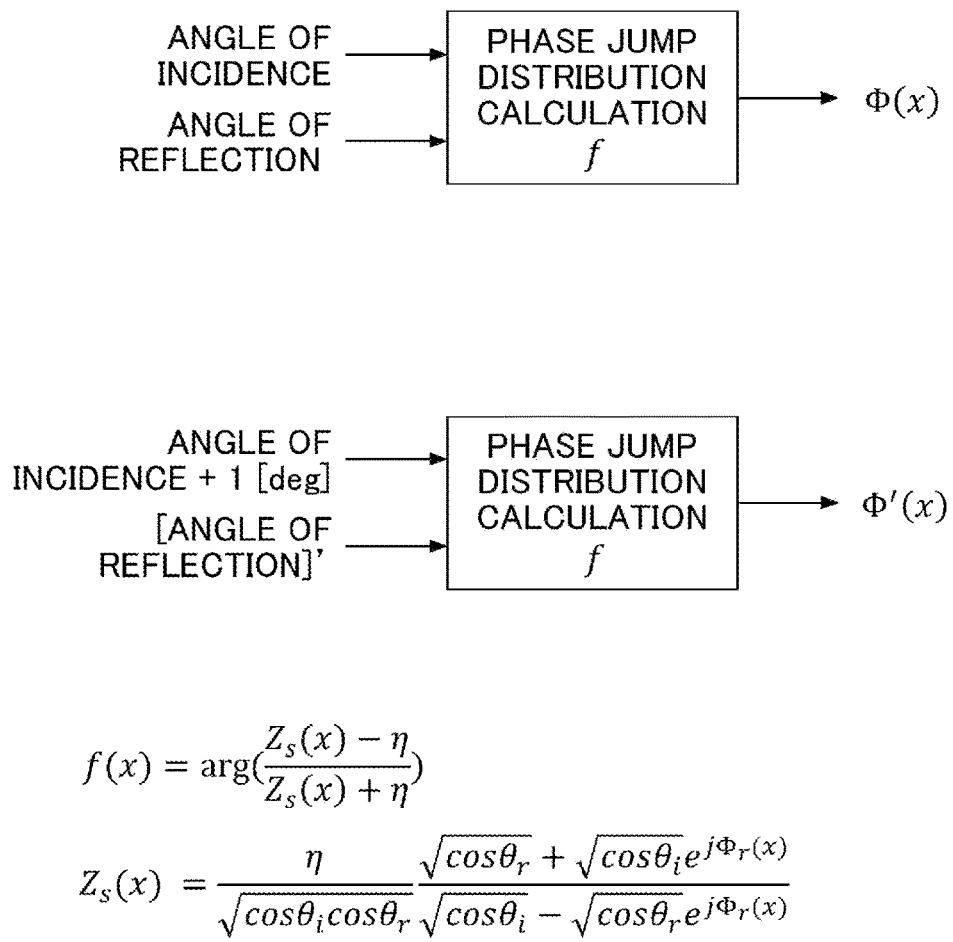

$$f(x) = \arg\left(\frac{Z_s(x) - \eta}{Z_s(x) + \eta}\right)$$

$$Z_s(x) = \frac{\eta}{\sqrt{\cos\theta_i \cos\theta_r}} \frac{\sqrt{\cos\theta_r} + \sqrt{\cos\theta_i} e^{j\Phi_r(x)}}{\sqrt{\cos\theta_i} - \sqrt{\cos\theta_r} e^{j\Phi_r(x)}}$$

Determine [angle of reflection]' that minimizes $\Phi'(x) - \Phi(x)$, which is regarded as fluctuation with respect to the angle of incidence.

PATTERN 1: Deep in Shallow out

PATTERN 2: Shallow in Deep out

ELECTROMAGNETIC WAVE REFLECTOR, ELECTROMAGNETIC WAVE REFLECTIVE FENCE, AND METHOD OF ASSEMBLING ELECTROMAGNETIC WAVE REFLECTOR

CROSS-REFERENCE TO RELATED APPLICATION(S)

This application is a continuation application filed under 35 U.S.C. 111(a), and claims benefit under 35 U.S.C. 120 and 365(c) of PCT International Application No. PCT/JP2020/045591 filed Dec. 8, 2020 and designating the United States. This PCT International Application claims priority to earlier Japanese Patent Application Nos. 2020-064577 and 2020-173308 filed Mar. 31, 2020 and Oct. 14, 2020, respectively, both applications being entirely incorporated herein by reference.

TECHNICAL FIELD

The present invention relates to an electromagnetic wave reflector, an electromagnetic wave reflective fence, and a method of assembling an electromagnetic wave reflector.

BACKGROUND

The industrial internet of things (IoT), which is adapted to automate manufacturing processes and introduce advanced production/process control and predictive maintenance into production sites, is progressing. Among industrial IoT, "smart factory" connects devices, equipment, and management systems in the factory to the cloud and/or edge artificial intelligence (AI) to streamline the manufacturing process. It is expected that a high-speed, low-latency, and large-capacity mobile communication technology of multi-connectivity, such as the fifth generation networks (5G), is to be introduced into industrial IoT communication networks to deal with a huge amount of data. In addition to the inherent mobility and flexibility of the mobile communication technology, low latency of the 5G networks is considered to be suitable for industrial IoT.

A joint structure for translucent electromagnetic shielding plates has been proposed, which is used in facilities such as intelligent buildings. See, for example, Patent Document 1 presented below.

The radio communication environments in production facilities such as factories or plants are different from the environment of the public cellular communication networks. There are various machines and structures in production facilities, which cause interference with radio propagation and make it difficult to achieve high quality wireless communication.

A technique is demanded for improving radio propagation in mobile communications in production facilities.

Prior Art Document(s) described above is

Patent Document 1: JP 4892207 B.

SUMMARY

In one aspect of the disclosure, an electromagnetic wave reflector includes a panel having a reflective surface that reflects a radio wave of a desired band selected from a frequency band of 1 GHz to 170 GHz, and a support body that supports the panel, wherein the support body has a connector part electrically connected to the reflective surface, the connector part being configured to propagate a reference potential of a reflection having occurred at the reflective surface.

The electromagnetic wave reflector with the above-described configuration can improve radio propagation in mobile communications at production facilities such as factories or plants.

BRIEF DESCRIPTION OF DRAWINGS

FIG. 5C shows yet another modification of the electromagnetic wave reflector;

FIG. 11A illustrates how multiple panels are connected;

FIG. 11B shows the state of the electromagnetic wave reflectors before connection;

FIG. 11C shows the state of the electromagnetic wave reflectors after connection;

FIG. 12 shows an example of reinforcement of the connected electromagnetic wave reflectors;

FIG. 13 shows an example of a fastening mechanism;

FIG. 15 shows the relationship between frame width and the reflection characteristic and the relationship between frame thickness and reflection characteristic at an angle of incidence of 0°;

FIG. 16 shows the relationship between frame width and the reflection characteristic and the relationship between frame thickness and reflection characteristic at an angle of incidence of 45°;

FIG. 17 shows the reflection characteristics as a function of frame width, frame thickness, and material at an angle of incidence of 0°;

FIG. 18 shows the reflection characteristics as a function of frame width, frame thickness, and material at an angle of incidence of 45°;

FIG. 31A shows reference robustness of reflection pattern 1;

FIG. 31B shows reference robustness of reflection pattern 2;

FIG. 32 shows quantification of the baseline robustness;

EMBODIMENTS

<Overview of the System>

Figure 1:
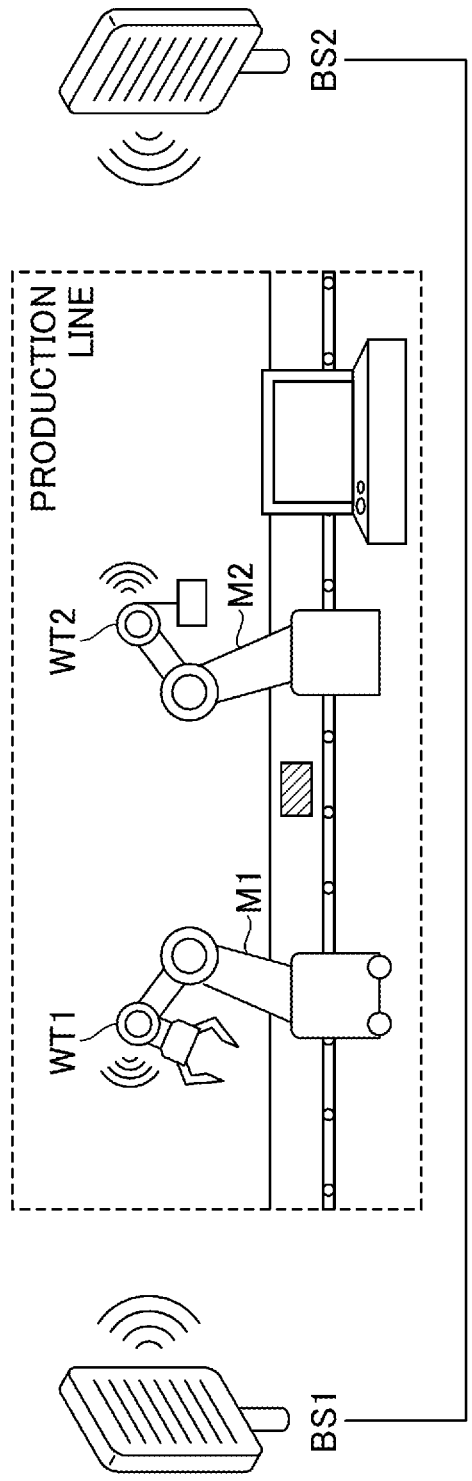
FIG. 1 is a schematic diagram of a production line in a factory, to which the present disclosure is applied.

FIG. 1 is a schematic diagram of a production line in a factory to which the present disclosure may be applied. A production line is a belt-like production site in which facilities and equipment for assembling or manufacturing are provided as a sequence of flow. Industrial IoT improves production efficiency and ensures on-site safety by connecting industrial machines, equipment, and management systems used in production lines to networks.

Base stations BS1 and BS2 are provided to connect the machines and equipment in the production line to the network. Machines M1 and M2 used in the production line are equipped with wireless transceiver units WT1 and WT2, respectively, to access at least one of the base stations BS1 and BS2 for the connection to the network.

In order to establish wireless connection between the equipment in the production line and the network, the base stations BS1 and BS2 (hereinafter referred to collectively as "BS" as necessary) are adapted to form a horizontally elongated rectangular service area. According to the technical specifications (TS22.104) of the 3rd Generation Partnership Project (3GPP), a mobile communications standardization organization, the aspect ratio of 3 to 5 of the rectangular area in a horizontal plane is stipulated as a system requirement. For example, dimensions (length)×(width)×(height) of a use case named "Motion Control" are defined as 50 m×10 m×10 m.

It may be effective to locate the base stations BS1 and BS2 at both ends of the elongated production line in terms of the coverage, so as to cover the production line and establish network connections for the machines M1 and M1 within the service areas provided by the base stations BS1 and BS2. The base stations BS1 and BS2 may cooperate with each other to improve the coverage and the quality of radio communication. The details of the positional relationship of the base stations BS with respect to the production line will be described later.

Figure 2:
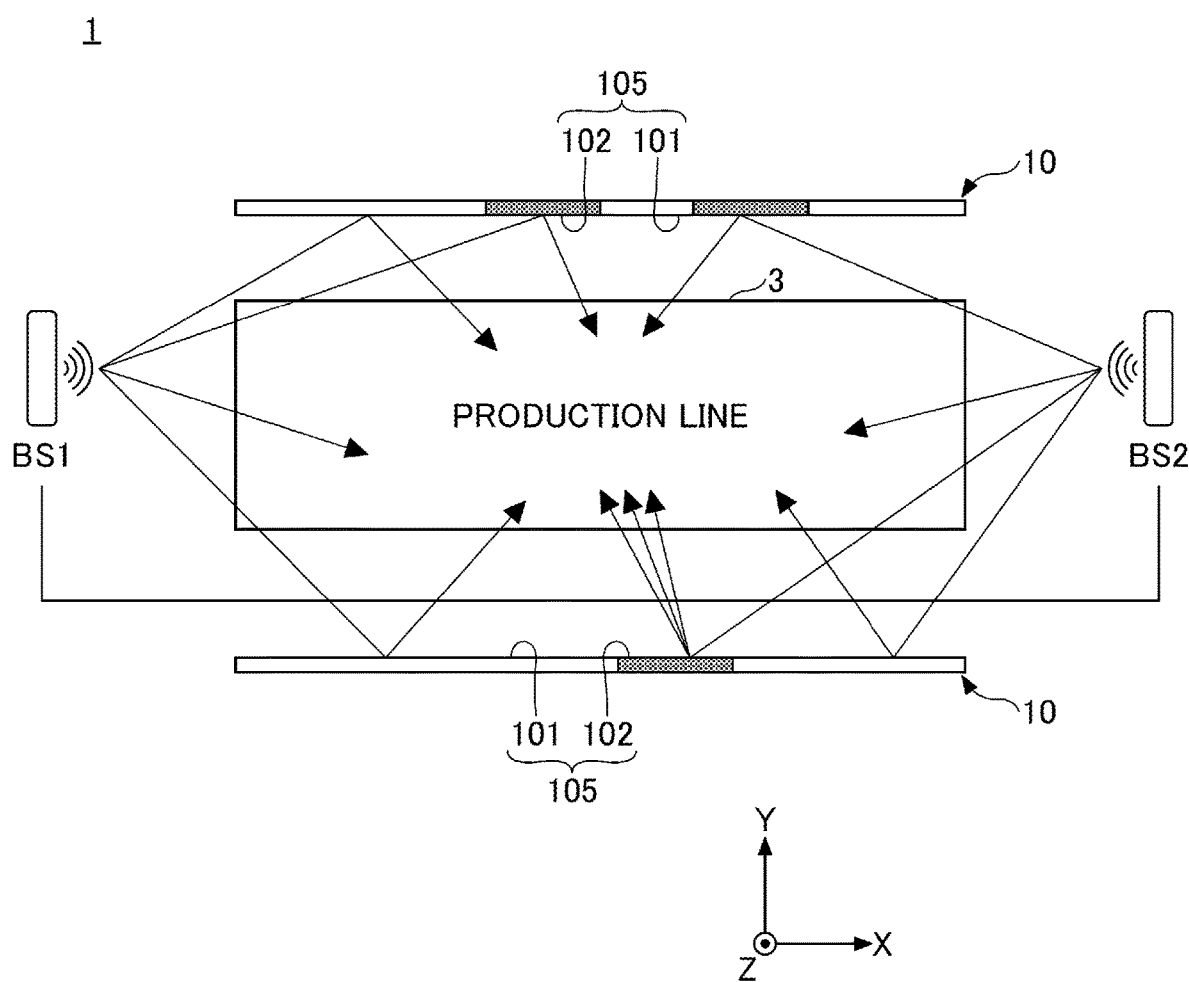
FIG. 2 is a schematic plan view of a wireless transmission system using an electromagnetic wave reflector according to an embodiment.

FIG. 2 is a schematic plan view of a wireless transmission system 1 using an electromagnetic wave reflector 10 according to an embodiment. The wireless transmission system 1 includes a production line 3, in which production equipment capable of transmitting and receiving radio waves is provided, a base station BS that wirelessly communicates with the equipment in the production line 3, and one or more electromagnetic wave reflectors 10 provided along the production line 3. The electromagnetic wave reflector 10 has a reflective surface 105 that reflects radio waves. The plane in which the production line is provided is the XY plane, and the height direction perpendicular to the XY plane is the Z direction.

Equipment used in the production line 3 includes all kinds of equipment involved in the production, such as microdevices including sensors and actuators, assembling equipment, manufacturing machines, or management systems. The equipment in the production line 3 is not limited to static devices or machines, but includes mobile devices and machines capable of moving freely in the production line 3.

The base stations BS1 and BS2 transmit and receive radio waves to and from the machines M1 and M2 (see FIG. 1) having wireless communication functions, at a specific frequency band selected from the range of 1 GHz to 170 GHz. The in-line objects and the peripheral structures (such as ducts or pipes) of the production line are often made of metal, and the radio waves are reflected or shielded by the metal objects or structures. Besides, straightness of a high-frequency radio wave such as millimeter wave causes little diffraction, which makes it difficult for the radio wave to reach far. For the equipment located at or near the center of the production line 3, the communication environment tends to be deteriorated due to interference with the radio waves reflected from the nearby equipment or metal products being manufactured in the production line 3.

The wireless communication quality could be maintained by providing a large number of base stations along the longitudinal axis of the production line 3; however, efficient use of the work space is disturbed and installation cost will increase. The wireless transmission system 1 solves these problems by providing an electromagnetic wave reflector 10 along the longitudinal axis of the production line 3, and by providing a base station BS at an end of the production line 3 in the longitudinal direction. Owing to the electromagnetic wave reflector 10, the number of base stations installed in the production facility can be reduced, and the wireless communication environment between the base station BS and equipment and devices in the production line 3 can be improved.

The electromagnetic wave reflector 10 may be installed along at least a part of the production line 3 so as to be substantially parallel to the long axis of the production line 3. In the context of the term "substantially parallel", it is unnecessary for the electromagnetic wave reflector 10 to be arranged strictly parallel to the long axis of the production line 3. The electromagnetic wave reflector 10 may be slightly tilted with respect to the long axis of the production line 3 within an acceptable range as long as the radio waves are efficiently transmitted and received between the base station BS and the equipment or devices in the production line 3.

The reflective surface 105 of the electromagnetic wave reflector 10 is configured to reflect the radio waves in the frequency band from 1 GHz to 170 GHz. The reflective surface 105 may include a normal reflector 101, which provides regular reflection with an angle of reflection the same as the angle of incidence, and/or a meta-reflector 102, which has an artificial surface capable of controlling the reflection characteristics of the incident electromagnetic waves. A "meta-reflector" is a kind of "metasurface" representing an artificial surface that regulates the transmission and/or reflection characteristics of the incident electromagnetic waves. A large number of scatterers sufficiently smaller than the wavelength are arranged in the meta-reflector to regulate the reflection phase distribution and the amplitude distribution, thereby reflecting the incident radio waves in a direction other than that of specular reflection. The meta-reflector 102 may be designed so as to provide diffusion and wave-front formation at a predetermined angular distribution, in addition to the meta-reflection in directions other than the specular reflection.

Figure 3A:
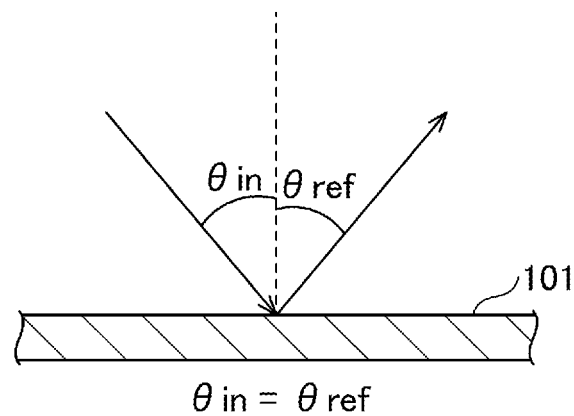
FIG. 3A is a diagram showing regular reflection with the angle of reflection equal to the angle of incidence.
Figure 3B:
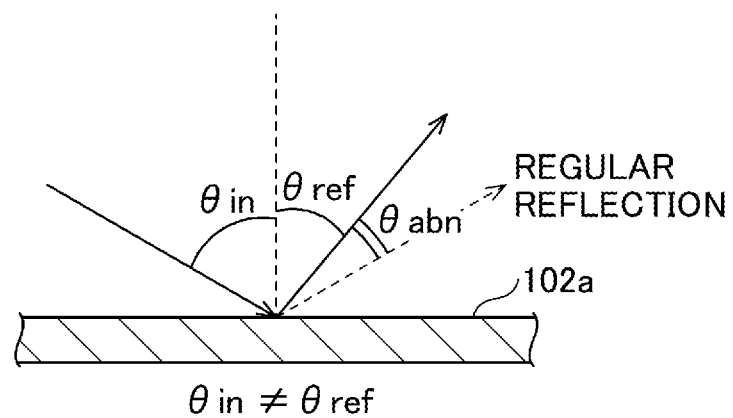
FIG. 3B is a diagram showing reflection at an angle of reflection different from the angle of incidence.
Figure 3C:
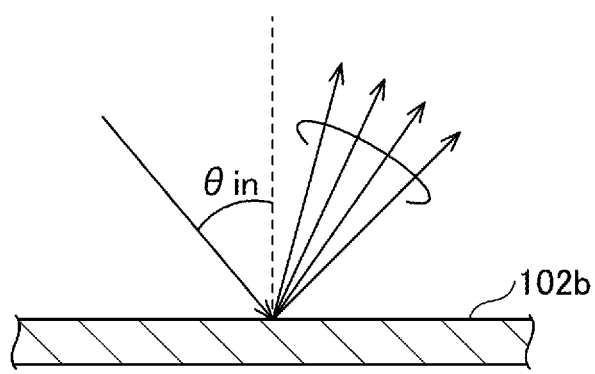
FIG. 3C is a diagram showing diffusion in a plurality of directions.

FIG. 3A to FIG. 3C show reflection modes on the reflective surface 105 of the electromagnetic wave reflector 10. In FIG. 3A, the electromagnetic wave incident onto the normal reflector 101 is reflected at the angle of reflection θref the same as the angle of incident θin.

In FIG. 3B, the electromagnetic wave incident onto the meta-reflector 102a is reflected at an angle of reflection θref different from the angle of incidence θin. The absolute value of the difference between the angle of reflection θref at the meta-reflector 102 and the angle of reflection by specular reflection may be called an anomalous angle θabn. As has been described above, metal patches sufficiently smaller than the operating wavelength are formed on the surface of the meta-reflector 102a to produce a surface impedance so as to control the reflection phase distribution, thereby reflecting the incident electromagnetic wave into a desired direction. For the application of the electromagnetic wave reflector 10 to the elongated production line 3, it is desirable to guide the radio wave from the base station BS to the wireless transceiver unit WT of the equipment in the production line 3 at an angle of reflection θref smaller than the angle of incidence θin, as illustrated in FIG. 3B. The reason for this will be described later.

The electromagnetic wave reflected by the meta-reflector is not always a plane wave with a single angle of reflection. The incident electromagnetic wave may be diffused in a plurality of directions at different angles of reflection θref, as shown in FIG. 3C, by well-designing the surface impedance produced on the surface of the meta-reflector 102b. A technique for achieving the reflection shown in FIG. 3C is described in, for example, PHYSICAL REVIEW B 97, "ARBITRARY BEAM CONTROL USING PASSIVE LOSSLESS METASURFACES ENABLED BY ORTHOGONALLY POLARIZED CUSTOM SURFACE WAVES". The intensity of the diffused electromagnetic wave may be uniform, or may have a predetermined intensity distribution according to the diffusion angle.

A plurality of electromagnetic wave reflectors 10 may be arranged along the production line 3. The electromagnetic wave reflector may be used as a guard fence for safety as long as the communication quality between the base station BS and the equipment in the production line 3 is maintained. Prior to describing the optimal placement of the base station BS with respect to the production line 3, detailed configurations of the electromagnetic wave reflector 10 are described below.

<Configuration of Electromagnetic Wave Reflector>

Figure 4:
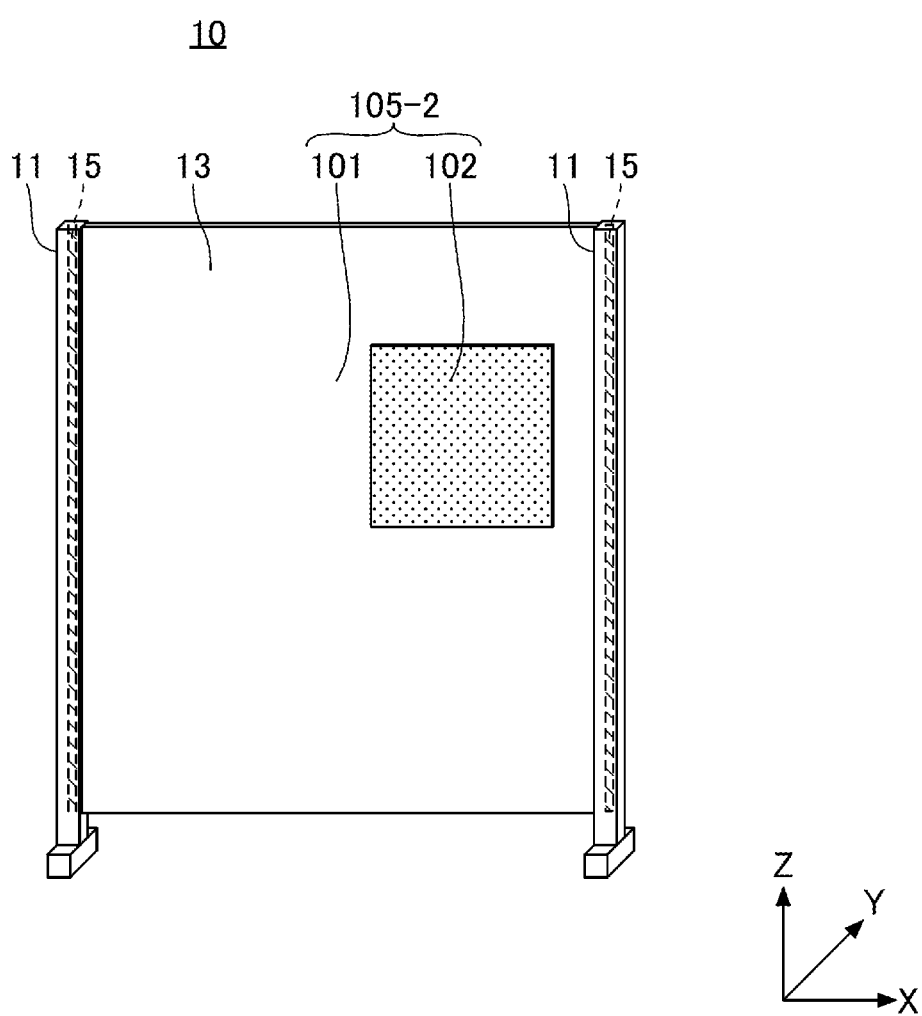
FIG. 4 is a diagram showing the basic concept of the electromagnetic wave reflector according to an embodiment.

FIG. 4 is a diagram showing the basic concept of the electromagnetic wave reflector 10 according to the embodiment. The electromagnetic wave reflector 10 is placed upright on the XY plane in which the production line is provided. The height direction of the electromagnetic wave reflector 10 is the Z direction. The electromagnetic wave reflector 10 has a panel 13, which has a reflective surface 105 configured to reflect radio waves of a desired frequency band ranging from 1 GHz to 170 GHz, and a support body 11 that supports the panel 13.

The reflective surface 105 of the panel 13 reflects electromagnetic waves in a desired direction. The reflective surface 105 can be formed of at least one of a normal reflector 101 and a meta reflector 102. The normal reflector 101 provides regular reflection. The meta reflector 102 has an artificial surface that regulates the reflection characteristics of the incident electromagnetic waves. The normal reflector 101 may include a reflective surface made of an inorganic conductive material or a conductive polymeric material.

Any material, any surface shape, any manufacturing process may be employed to form the meta-reflector 102, as long as the incident electromagnetic waves can be reflected to a desired direction or diffused at a desired angular distribution. In general, a metasurface is fabricated by forming metal patches, which are sufficiently smaller than the operating wavelength, over the surface of a conductor such as a metal surface, via a dielectric layer between them. The meta-reflector 102 can be arranged at any position on the reflective surface 105, depending on which direction the electromagnetic wave is to be reflected.

The size of the panel 13 can be appropriately designed according to the environment in which the electromagnetic wave reflector 10 is installed. The panel 13 has, for example, a width of 0.5 m to 3.0 m, a height of 1.0 m to 2.5 m, and a thickness of 3.0 mm to 9.0 mm. In order for facilitating transportation and installation into the factory and simplifying the assembling, the dimensions of the panel 13 may be about 1.4 m×1.8 m×5.0 mm in width×height×thickness. A part of the panel 13 may be transparent to visible light.

The panel 13 is held by the support body 11 so that the electromagnetic wave reflector 10 can stand independently. The mechanical structure of the support body 11 may be of any structure as long as the panel 13 can stably stand up with respect to the installation surface (for example, the XY plane). A plurality of electromagnetic wave reflectors 10 may be connected in actual use, as will be described later. The height of the electromagnetic wave reflector 10 as a whole including the panel 13 and the support body 11 is, for example, 1.5 m to 2.5 m, and it may be set to about 2.0 m from the installation surface.

In addition to the mechanical design to support and set the panel 13 upright, the support body 11 has an electrical connector part 15 to keep the electric potential the reflection having occurred on the reflective surface 105 of the panel 13 continuous. With the configuration of multiple electromagnetic wave reflectors 10 connected in series, if the current flow induced by the incident electromagnetic waves (which may be called a reflected current wave) is interrupted between the panels 13 of adjacent electromagnetic wave reflectors 10, the energy of the reflected electromagnetic waves is attenuated or radiated in unwanted directions, and consequently, the quality of wireless communication will deteriorate.

In order to ensure the continuity of the reflected current waves between the adjacent panels, it is desirable that the reference potential for reflection is transmitted from one panel to the other panel through the support body 11 at a high frequency such that the reference potential is shared between the panels in a high frequency manner. It is also desirable that the continuity of the reflected current wave is as uniform as possible in the connector area of the support body 11. This configuration of the support body to propagate the reference potential of reflection having occurred on the reflective surface of the panel may be rephrased as a configuration to "refer to" the reference potential.

In order to allow the electrical connector part 15 of the support body 11 to propagate the reference potential from one panel to the other so that the reference potential is shared between the panels, some ingenuity such as edge processing of the panel 13 or reduction of the influence on the reflection characteristics is desired. The "edge" of the panel 13 is an end face that connects two opposing major surfaces. Specific configurations of the electrical connector part will be described later with reference to FIG. 7 to FIG. 9D.

FIG. 5A to FIG. 5D show alterations of the electromagnetic wave reflector 10. The plane on which the electromagnetic wave reflector 10 is installed is labelled as "P". In the electromagnetic wave reflector 10A of FIG. 5A, a meta-reflector 102 is movably provided. Any configuration for making the meta-reflector 102 movable on the reflective surface 105 may be employed as long as undesirable interference is suppressed between the meta-reflector 102 and the reflective surface 105. For example, a rod 16 holding the meta-reflector 102 may be attached to the panel 13 so as to be slidable in the horizontal direction, and the meta-reflector 102 may be held on the rod 16 so as to be vertically movable along the rod 16.

The rod 16 may be made of a non-metallic material with a low dielectric constant so as not to interfere with the reflection characteristics of the normal reflector 101 or the meta-reflector 102. The rod 16 may be designed so that the optical interface and mechanical interference are minimized at the panel surface. The meta-reflector 102 can be moved to the optimum position on the panel 13 according to the actual environment where the electromagnetic wave reflector 10 is installed, or the positional relationship with respect to the base station BS. The support body 11 has an electrical connector part 15 inside, as illustrated in FIG. 4.

Figure 5A:
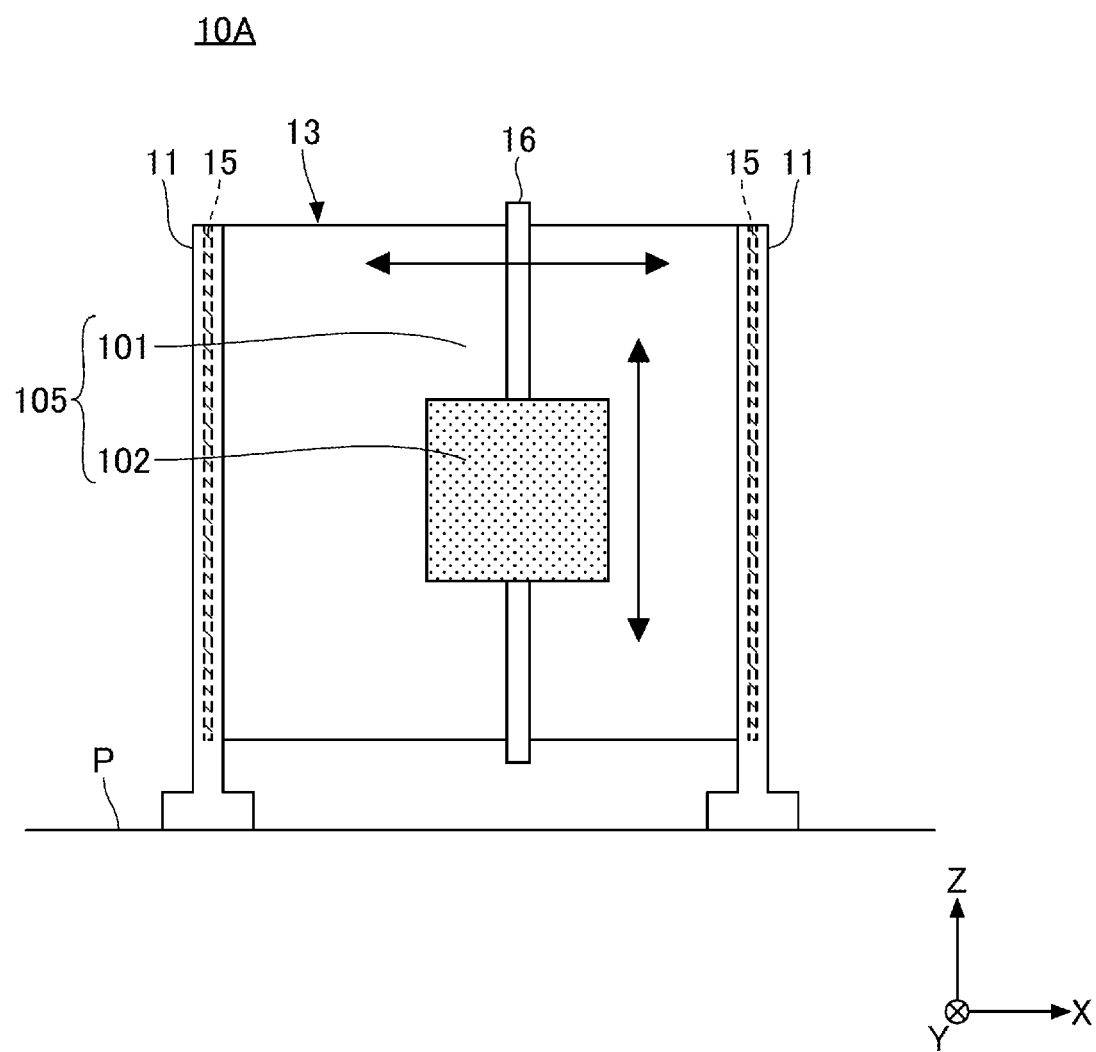
FIG. 5A shows a modification of the electromagnetic wave reflector.
Figure 5B:
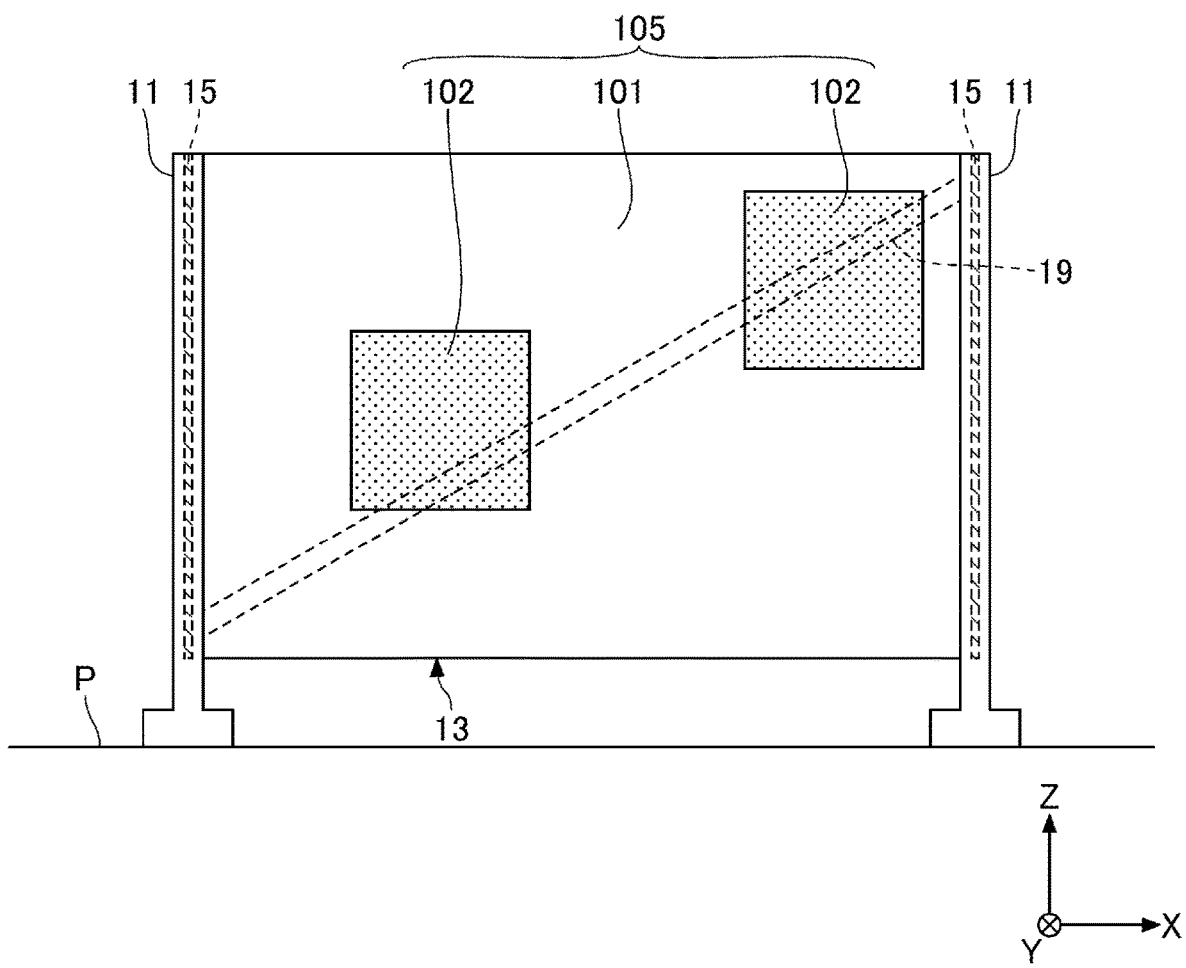
FIG. 5B shows another modification of the electromagnetic wave reflector.

FIG. 5B shows an electromagnetic wave reflector 10B, in which a brace 19 is provided on the back surface of the panel 13, opposite to the reflective surface 105, to reinforce or increase the rigidity of the panel 13 of the electromagnetic wave reflector 10B. The brace 19 may be bridged between the support bodies 11 holding opposite edges of the panel 13.

In an electromagnetic wave reflector 10C of FIG. 5C, reinforcement beams 21a and 21b are provided to the top and the bottom of the panel 13. Reinforcement beams 21a and 21b may be installed so as to extend between the support bodies 11 holding the two opposed edges of the panel 13.

Figure 5D:
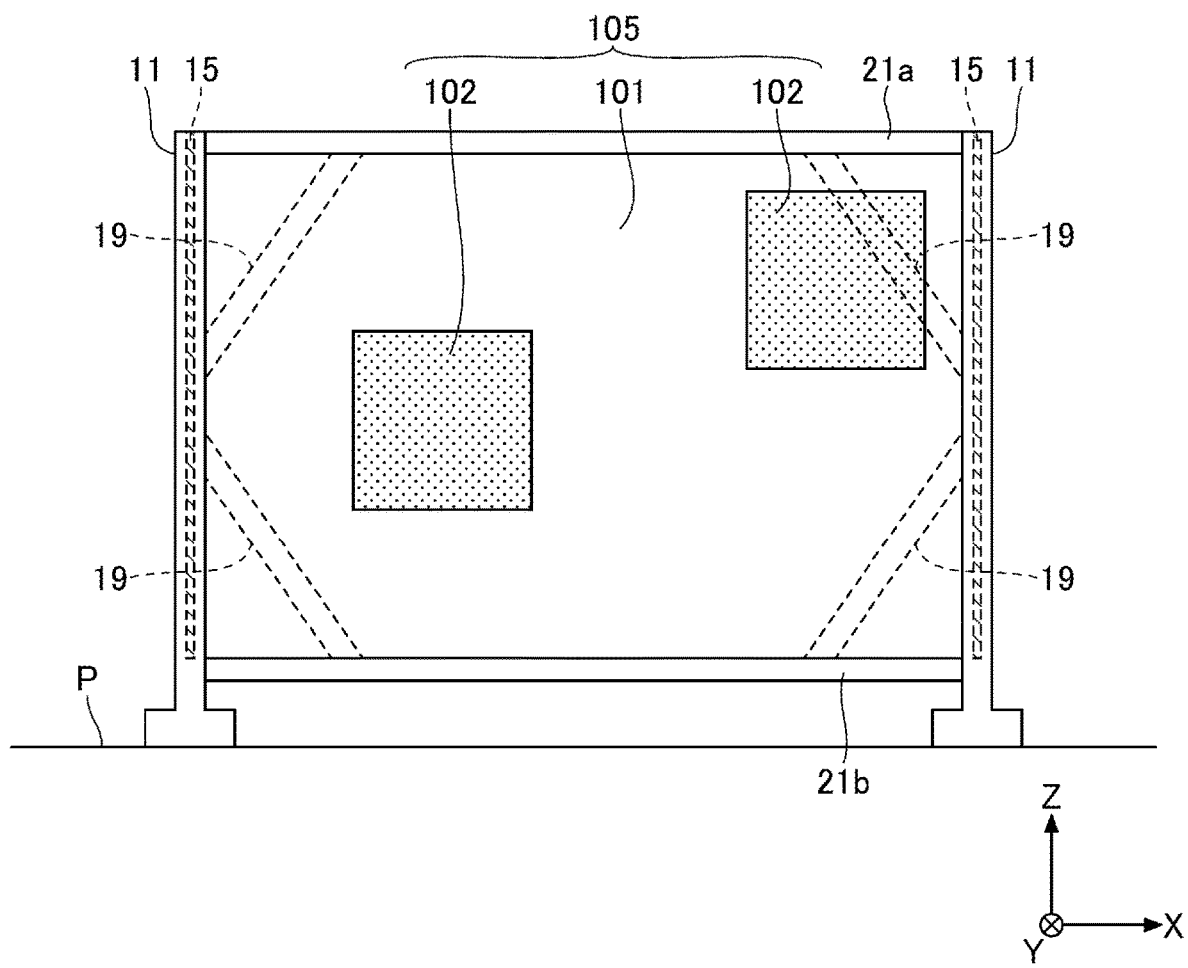
FIG. 5D shows still another modification of the electromagnetic wave reflector.

In an electromagnetic wave reflector 10D of FIG. 5D, braces 19 are provided between the reinforcement beams 21a and 21b and between the support bodies 11. The above-illustrated reinforcement mechanisms can suppress the vibration mode of the panel 13 and stabilize the electromagnetic wave reflection against the vibration of the factory floor, while the weight of the large-size panel can be reduced. In FIG. 5B to FIG. 5D, the electrical connector part 15 for propagating the reference potential of reflection is provided inside the support bodies 11, as has been described in connection with FIG. 4.

The alterations of FIG. 5A to FIG. 5D can be combined with each other. For example, with the panel 13 having the configuration of FIG. 5A, the meta-reflector 102 may be held in a movable manner on the reflective surface 105, while the brace 19 of FIG. 5B may be provided on the back surface opposite to the reflective surface 105.

<Configuration of Reflective Surface>

FIG. 6A to FIG. 6D show configuration examples of the reflective surface 105. The reflective surface 105 may employ any configuration as long as it can reflect electromagnetic waves of 1 GHz to 170 GHz. For example, the reflective surface 105 can be formed of a mesh conductor, a conductive film, or a combination of a transparent resin and a conductive film, which is designed to reflect electromagnetic waves of a desired frequency band in the range from 1 GHz to 170 GHz.

By designing the reflective surface 105 to reflect radio waves of a desired frequency band from 1 GHz to 170 GHz, a wide range of communication bands can be covered, including 1.5 GHz band and 2.5 GHz band currently used in Japan as the main frequency bands of mobile communications, and 4.5 GHz band and 28 GHz band scheduled for the next-generation 5G mobile communications network. In foreign countries, 2.5 GHz band, 3.5 GHz band, 4.5 GHz band, 24 to 28 GHz band, and 39 GHz band are planned for the 5G frequency band. The electromagnetic wave reflector of the embodiment is capable of dealing with these frequency bands, as well as 52.6 GHz band which is the upper limit of the 5G standardized millimeter wave band.

On the other hand, frequencies above 170 GHz are unlikely to be practically used for smart factories at this stage. If in the future indoor mobile communication using a terahertz band is put into practical use, the reflection band of the reflective surface 105 may be expanded to the terahertz band by applying a photonic crystal technology.

Figure 6A:
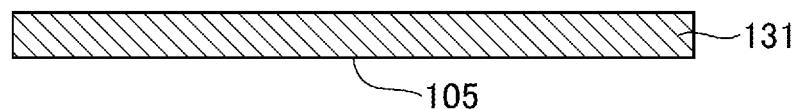
FIG. 6A shows a configuration example of a reflective surface.

In FIG. 6A, a panel 13A has a reflective surface 105 made of a conductor 131. The conductor 131 is not necessarily a homogeneous conductor film, as long as it can reflect 30% or more of radio waves of 1 GHz to 170 GHz. The conductor may be formed into a mesh, a grating, or an array of holes that has a desired density suitable to reflect the electromagnetic waves of a predetermined frequency band within the above-described range. The pitch or the period of the repetition of the conductive pattern formed at the desired density may be uniform or non-uniform. The period or the average period of the conductive pattern is preferably ⅕ or less, more preferably 1/10 or less of the free-space wavelength of the selected frequency band.

The opening diameter of a typical wire mesh fence generally used in factories and warehouses is 3.2 cm, 4 cm, or 5 cm. Most of the electromagnetic waves of 1 GHz to 170 GHz pass through the typical wire mesh fence. Even if the electromagnetic waves of 1 GHz to several GHz is slightly reflected from the wire mesh fence, most of the electromagnetic waves are transmitted through the wire mesh in higher frequency bands. Such a typical wire mesh fence cannot be used as a reflector for providing stable reflection to improve the communication environment.

Figure 6B:
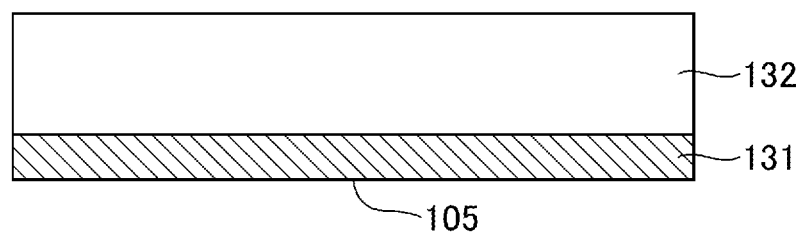
FIG. 6B shows another configuration example of the reflective surface.

In FIG. 6B, a panel 13B is a normal reflector, and has a laminated structure of a conductor 131 and a dielectric 132 transparent to the operating frequency. Either surface of the conductor 131 can be the reflective surface 105. If electromagnetic waves are incident from the conductor 131 side, the interface between the conductor 131 and air is the reflective surface 105. If electromagnetic waves are incident from the dielectric 132 side, the interface between the conductor 131 and the dielectric 132 is the reflective surface 105.

The dielectric 132 which retains or covers the conductor 131 preferably has a rigidity sufficient to withstand vibration, and satisfies the safety requirements of ISO 014120 provided by the international organization for standardization. Because of the use in a factory, a dielectric material is preferably transparent to visible light, while being capable of withstanding against impact due to collision with a product or a part of the manufacturing apparatus. Such materials include, but are not limited to an optical plastic, a reinforced plastic, and a reinforced glass having a predetermined mechanical strength. Examples of the optical plastic include, but are not limited to polycarbonate (PC), polymethylmethacrylate (PMMA), and polystyrene (PS).

Figure 6C:
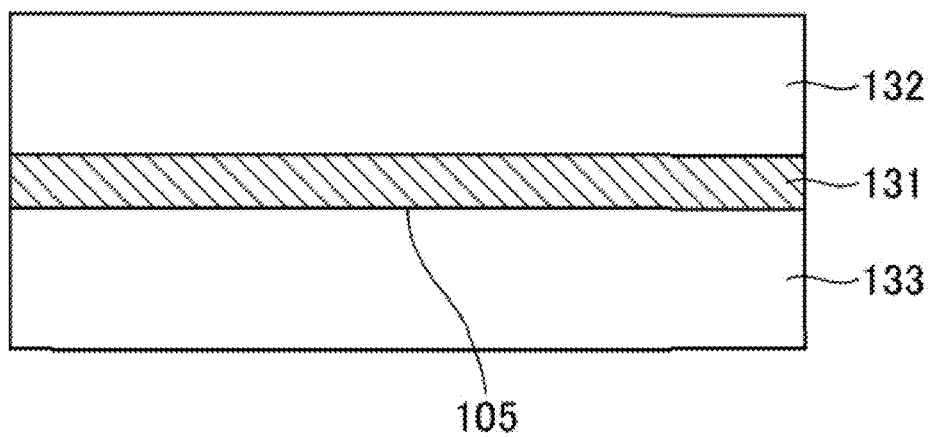
FIG. 6C shows yet another configuration example of the reflective surface.

In FIG. 6C, a panel 13C has a conductor 131 provided between dielectrics 132 and 133. Depending on the incident direction of the electromagnetic wave, the interface with either one of the dielectrics becomes the reflective surface 105. The rigidity required for the dielectrics 132 and 133 is similar to that for the configuration of FIG. 6B.

Figure 6D:
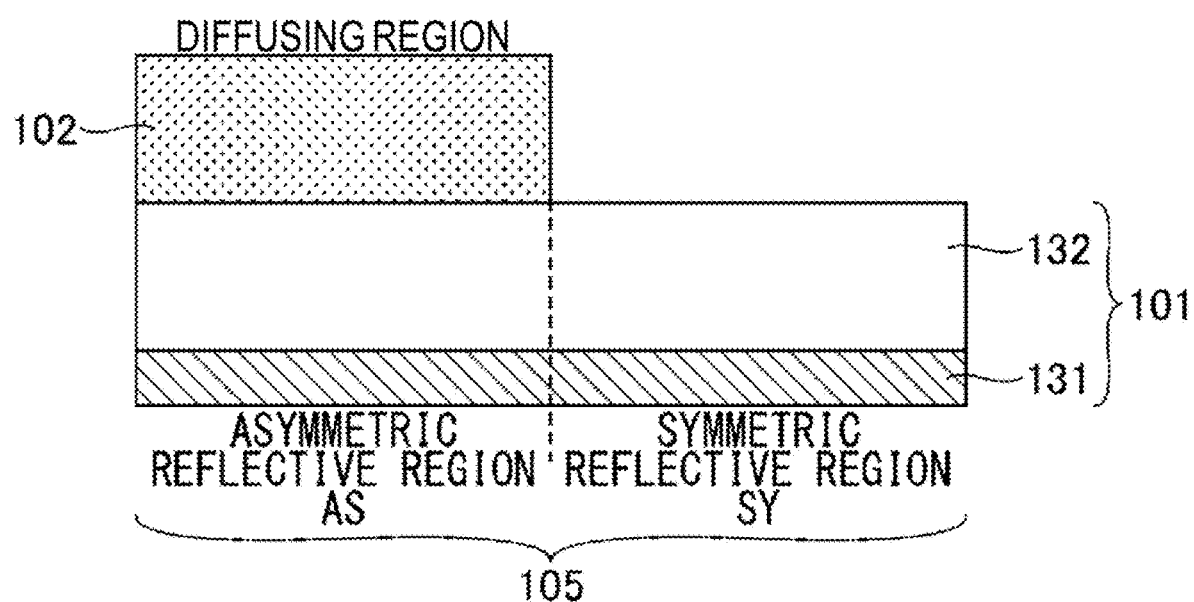
FIG. 6D shows still another configuration example of the reflective surface.

In FIG. 6D, a panel 13D may have a meta-reflector 102 which is partially provided on the laminate of FIG. 6B. The laminate of the conductor 131 and the dielectric 132 can be used as a normal reflector 101. The meta-reflector 102 may be fixed to the surface of the dielectric 132 of the normal reflector 101 by lamination or other suitable processes. A region of the three-layer structure of the conductor 131, the dielectric 132, and the meta-reflector 102 is denoted as asymmetric reflective region AS which provides a metasurface. The region of the two-layer structure of the conductor 131 and the dielectric 132, without the meta-reflector 102, is denoted as the symmetric reflective region SY which provides specular reflection.

In the example of FIG. 6D, the meta-reflector 102 is integrated with the normal reflector 101 onto the panel 13D as shown in FIG. 4. The meta-reflector 102 may be configured so as to be separable from the normal reflector 101. With the separable configuration, a movable meta-reflector 102 illustrated in FIG. 5A may be used. The position of the meta-reflector 102 on the panel 13 may be determined according to the applied environment to adjust the position of the asymmetric reflective region AS.

<Connection Structure of Support Body>

Figure 7:
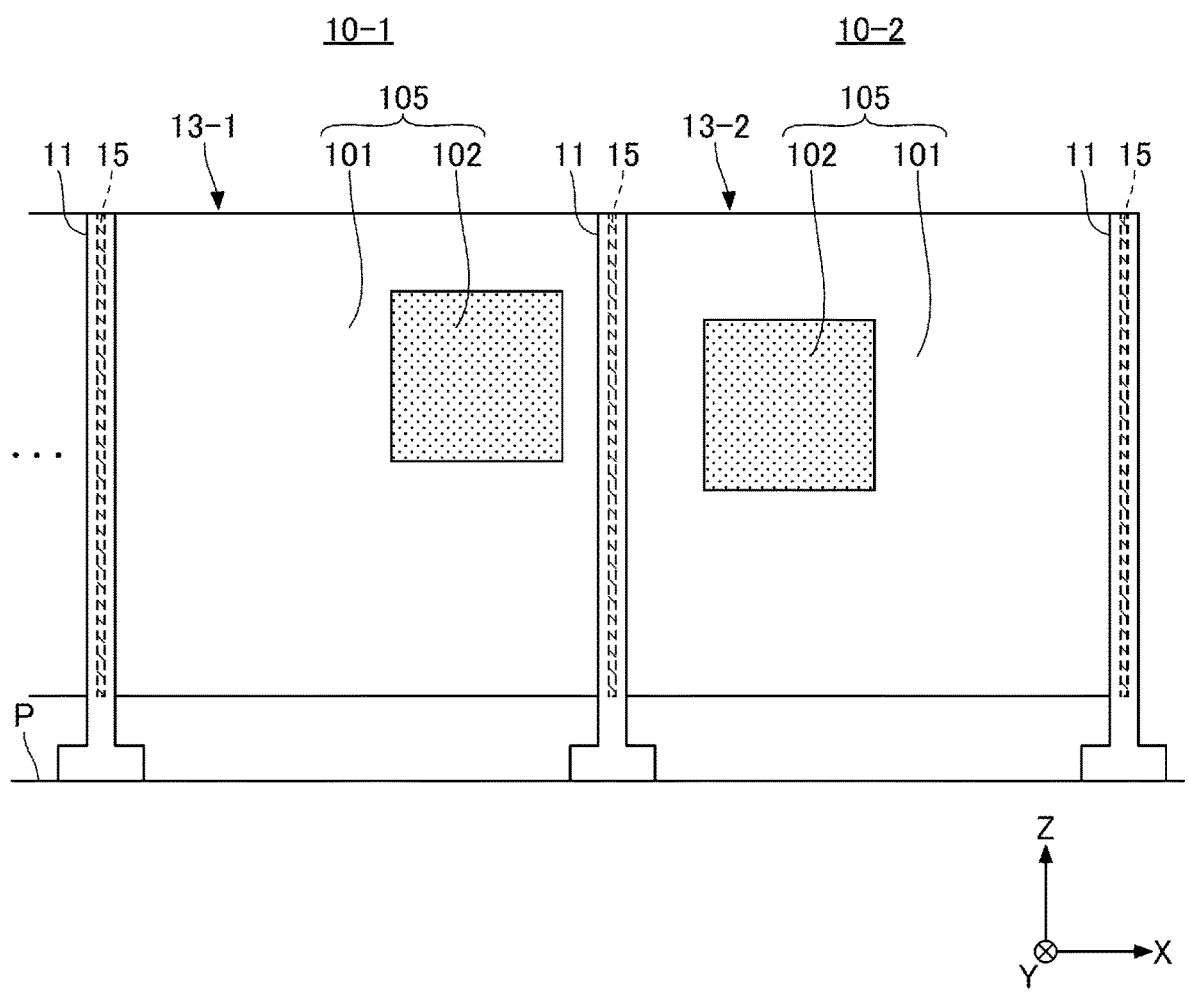
FIG. 7 shows a configuration example in which electromagnetic wave reflectors are connected.

As shown in FIG. 7, a plurality of electromagnetic wave reflectors 10 may be connected by support bodies 11 and raised on the plane P. For example, in connecting the electromagnetic wave reflectors 10-1 and 10-2, the panel 13-1 and the panel 13-2 are connected through the electrical connector part 15 of the support body 11 so that the reflection potential surface is continuous between the panels. As has been described above, the support body 11 has both a mechanical strength to couple the panels 13 and an electrical connectivity to achieve continuity of the reflection reference potential between the panels 13. Configuration examples of the electrical connector part 15 are illustrated below.

Figure 8:
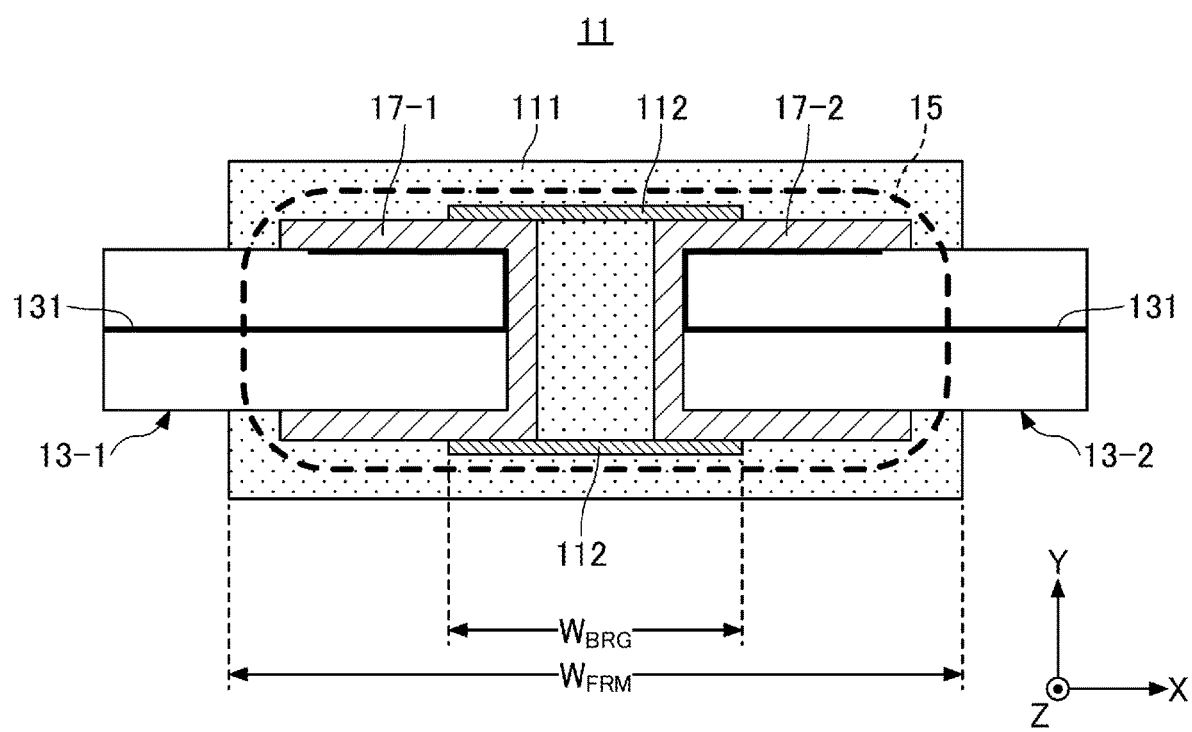
FIG. 8 is a schematic diagram of a connector part of a support body.

FIG. 8 shows an example of the electrical connector part 15 of the support body 11 in a cross-sectional view taken along a horizontal plane when the electromagnetic wave reflector 10 stands up on the plane P (see FIG. 7). The electrical connector part 15 is designed to propagate the reference potential of reflection from one panel to the adjacent panel so that the reference potential of the reflection phenomenon is shared between the adjacent panels 13.

The support body 11 has a frame 111, and an electrical connector part 15 provided to the frame 111 to share the potential surface of reflection between the panels 13. The electrical connector part 15 may have any configuration as long as it can propagate and share the reference potential of reflection between the adjacent panels 13-1 and 13-2 (which may be collectively referred to as "panels 13") in a stable manner. The frame 111 may have any configuration as long as it is strong enough to stably hold the electrical connector part 15. With the configuration of FIG. 8, the frame 111 may be made of an electrically insulating material.

In the example of FIG. 8, the electrical connector part 15 includes conductive edge jackets 17-1 and 17-2 (which may be collectively referred to as "edge jackets 17") that receive the edges of the panels 13, and bridge electrodes 112 electrically connecting the edge jackets 17 to the adjacent panels. The bridge electrode 112 is an example of a conductive bridge that bridges the potential surfaces of the panels 13-1 and 13-2. The edge jacket 17-1 gripping the edge of the panel 13-1 and the edge jacket 17-1 gripping the edge of the panel 13-2 are electrically connected to each other by the bridge electrodes 112. The bridge electrodes 112 are in surface contact with the edge jackets 17-1 and 17-2 to ensure the electrical connection. Upon reflection current waves occurring at the panel 13-1, the reflection current flows from the edge jacket 17-1 through the bridge electrode 112 to the edge jacket 17-2, and eventually flows into the conductor 131 of the panel 13-1. The reflection current flows through a short current path with little detour, and therefore, the reflection performance is satisfactory.

The width $W_{FRM}$ of the frame 111 is preferably 150 mm or less, more preferably from 20 mm to 60 mm, from the viewpoint of connecting the panels 13 while keeping the reflection potential surface common between the panels 13. From the same viewpoint, the thickness of the frame 111 is preferably 15 mm or less, more preferably 10 mm or less, and still more preferably from 2 mm to 7.5 mm.

The width $W_{BRG}$ of the bridge electrode 112, which serves as a conductive bridge, is preferably 100 mm or less, more preferably from 10 mm to 50 mm, from the viewpoint of sharing the potential surface of reflection between the panels 13 with the smallest possible size. From the same viewpoint, the thickness of the bridge electrode 112 is preferably 20 mm or less, more preferably 10 mm or less, and even more preferably from 1 mm to 5 mm. The grounds for the preferable range of the widths and thicknesses of the frame 111 and the bridge electrode 112 will be described later with reference to FIG. 14 and the subsequent figures.

Appropriate sizes of the frame 111 and the bridge electrode 112 can be determined by general-purpose three-dimensional electromagnetic field simulation software, as will be described later with reference to FIG. 19. Solutions for the three-dimensional electromagnetic field simulation include the FDTD method, the finite element method, and the moment method.

The corners of the conductive material of the electrical connector part 15, e.g., the bridge electrode 112 or a metal layer 121 which will be described in the following modification example, may be chamfered with a predetermined radius of curvature R to reduce and stabilize the scattering at the edges of the conductor material. The radius of curvature R of the chamfered part is at least 1 mm, preferably 2 mm or more, more preferably 4 mm or more, and even more preferably 8 mm or more. The ground for the range will also be described later.

The frame 111 is provided so as to ensure the strength of the support body 11. Preferably, the frame 111 is formed of an insulating elastic material or a resin so as to suppress the shunting of the reflected current. The above-described preferred dimensional ranges also apply the following modification examples.

Figure 9A:
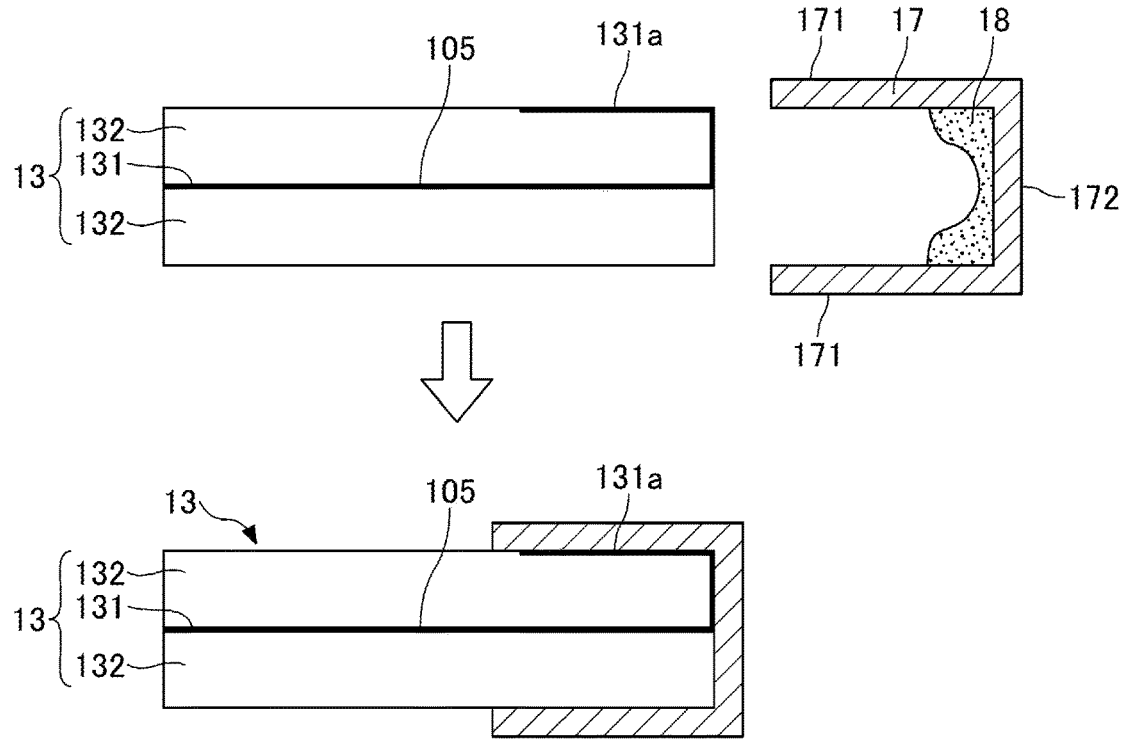
FIG. 9A shows an example of edge finishing of a panel.
Figure 9B:
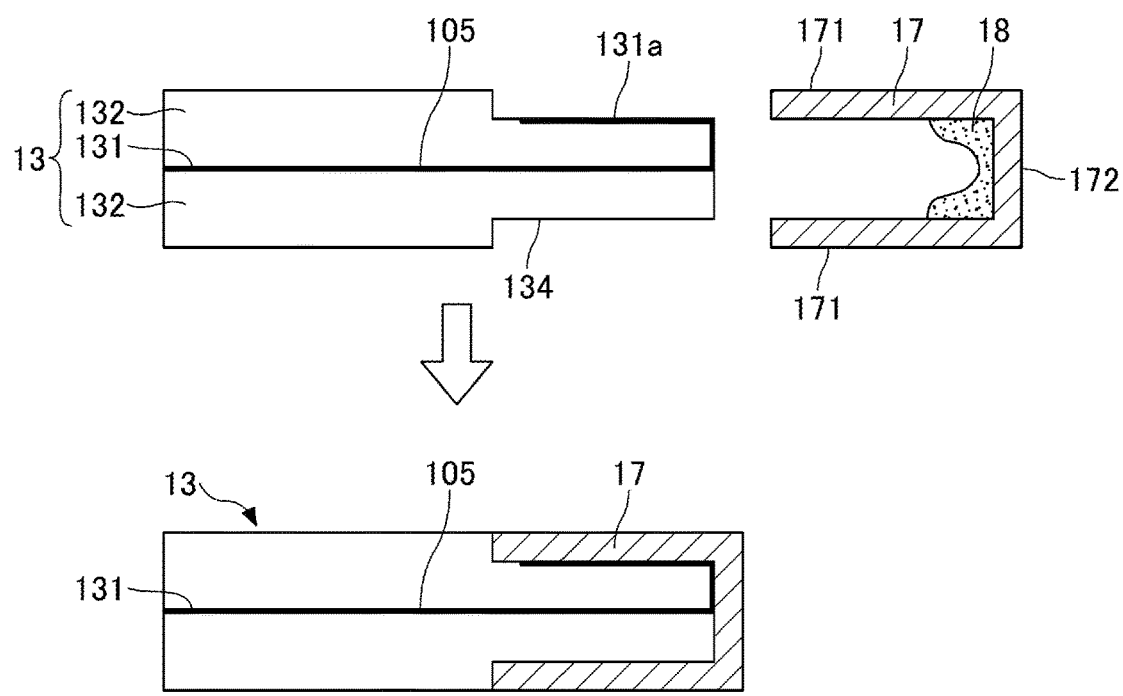
FIG. 9B shows another example of edge finishing of the panel.

FIG. 9A and FIG. 9B show examples of edge processing of the panel 13. In FIG. 9A, the panel 13 has a conductor 131, which is provided between dielectrics 132 and 133 and serves as the reflective surface 105. The edge jacket 17 may be a conductive rail with an open square or U-shaped cross-section, which has a pair of outer surfaces 171 and a bottom face 172 connecting the outer surfaces 171. A conductive adhesive 18 such as a silver paste may be applied in advance to the inner surface of the edge jacket 17.

The conductor 131 may be folded back at the edge of the panel 13 and drawn out to either one of the dielectric surfaces. Upon insertion of the edge of the panel 13 into the edge jacket 17, the folded part 131a of the conductor 131 comes into surface contact with the inner wall of the edge jacket 17. By drawing out the conductor 131 so as to cover a part of the surface of the panel 13 at the folded part 131a, the contact area between the conductor 131 and the edge jacket 17 is increased and electrical connection becomes stable.

The thickness of a part of the dielectrics 132 and 133 may be reduced along the edge of the panel 13 so as to form a cutout 134, as shown in FIG. 9B. The edge part thinned by the cutout 134 can be fit into the edge jacket 17. With this configuration, the outer surface 171 of the edge jacket aligns with the surface of the panel 13, which facilitates handling of the panel 13.

Figure 10A:
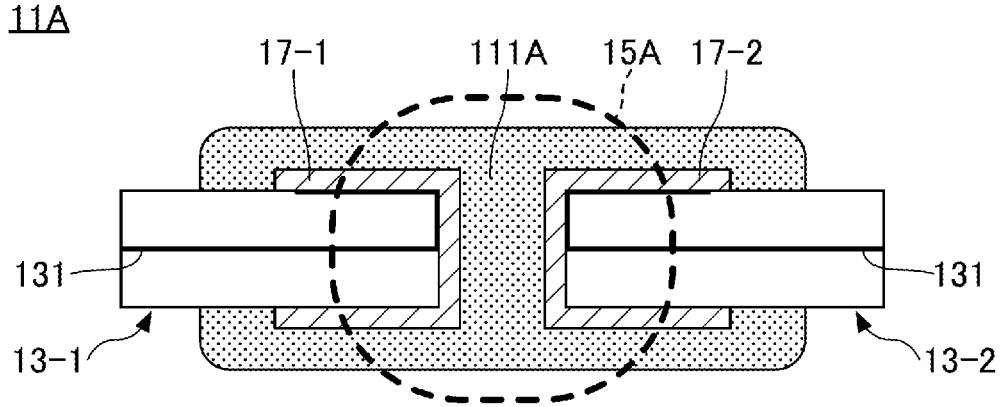
FIG. 10A shows a configuration example of the connector part.

FIG. 10A to FIG. 10G show modifications of the electrical connector part 15 of the support body 11. In FIG. 10A, the support body 11A has a frame 111A made of a carbon-containing material, in place of the insulating frame 111. An electrical connector part 15A is formed by the frame 111A and the edge jackets 17-1 and 17-2. Carbon Fiber Reinforced Plastics (CFRP) can be used as the carbon-containing material. By combining carbon fiber and resin, the carbon fiber, which is a conductor, and the resin, which is an insulator, can be integrally molded using a process such as continuous pultrusion molding, and high strength can be achieved.

The CFRP holding the edge jackets 17-1 and 17-2 serves by itself as the electrical connector part 15A. Electrical connection can be established between the edge jackets 17-1 and 17-2 without using a bridge electrode 112. Regarding the reflective property, carbon fiber has better reflective performance than bulk metal, and the reflective characteristics of the frame 111A can be improved. From the viewpoint of achieving both reflective performance and mechanical strength, it is preferable that the carbon fiber content ratio of CFRP is 50% or more, 60% or more, 70% or more, 80% or more, or even 90% or more. On the other hand, the resin content ratio of CFRP is preferably 50% or less, 40% or less, 30% or less, 20% or less, or even 10% or less.

Figure 10B:
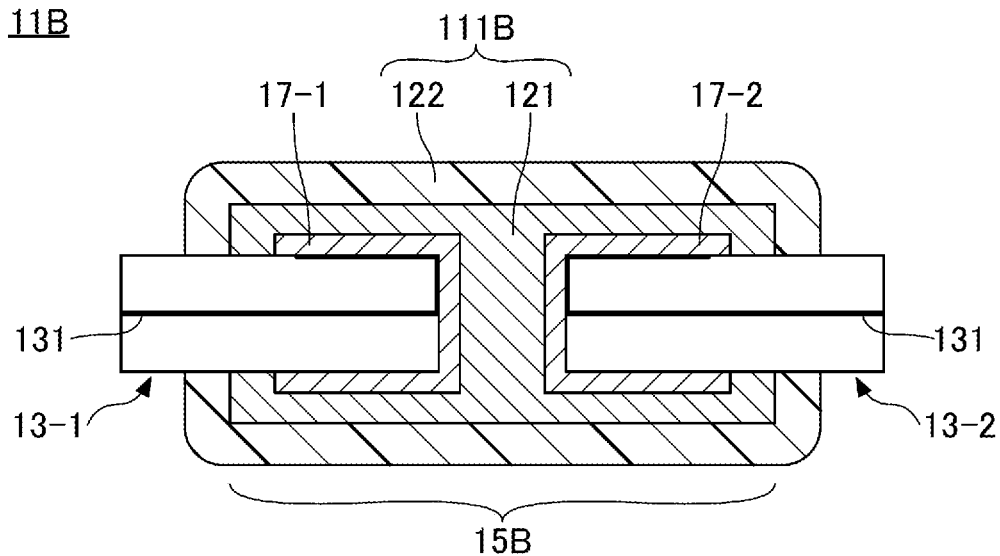
FIG. 10B shows another configuration example of the connector part.

In FIG. 10B, a support body 11B has a frame 111B formed of a laminate of a metal layer 121 and a resin layer 122. The metal layer 121 couples the panels 13-1 and 13-2, while covering the outer surfaces of the edge jackets 17-1 and 17-2. The metal layer 121 being in contact with the edge jackets 17-1 and 17-2 serves as the electrical connector part 15B. The resin layer 122 enhances from the outside the connection between the panels through the metal layer 121. An adhesive may be used for the enhancement (i.e., the resin layer 122). Such an adhesive may be an acrylic adhesive or an epoxy adhesive. This configuration can suppress unwanted sneak current. The configuration with the combination of the metal layer 121 and the resin layer 122 can facilitate the design and fabrication of the frame 111B. The strength of the frame 111B is also guaranteed by covering the metal layer 121 with the resin layer 122 in the laminating direction.

Figure 10C:
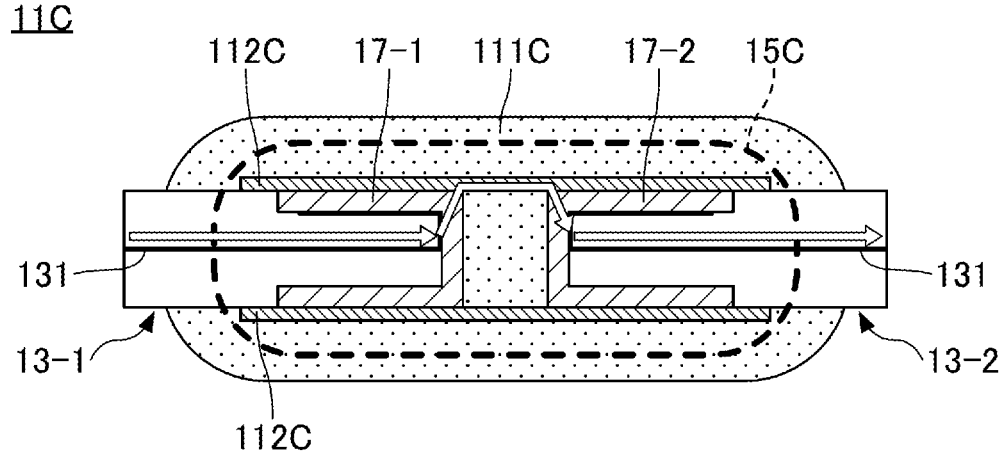
FIG. 10C shows yet another configuration example of the connector part.

FIG. 10C shows a configuration that connects the edge-processed panels 13 of FIG. 8B. The surface of the panel 13 and the outer surface of the edge jacket 17 are aligned, and accordingly, the panel 13 fit into the edge jacket 17 in advance can be inserted into the frame 111C. The frame 111C is made of, for example, an insulating plastic. At the electrical connector part 15C, the electric current produced by reflection of the incident electromagnetic wave flows from the edge jacket 17 through the bridge electrode 112C into the conductor 131 of the adjacent panel 13 by a short current path. The bridge electrode 112C may be sufficiently wide to ensure the surface contact with the entirety of the outer surface of the edge jackets 17-1 and 17-2. Upon reflection of the incident electromagnetic waves by the panel 13-1, a high-frequency current flows through at least a part of the bridge electrode 112C to the conductor 131 of the panel 13-2 as indicated by the white arrow, with less sneak current.

Figure 10D:
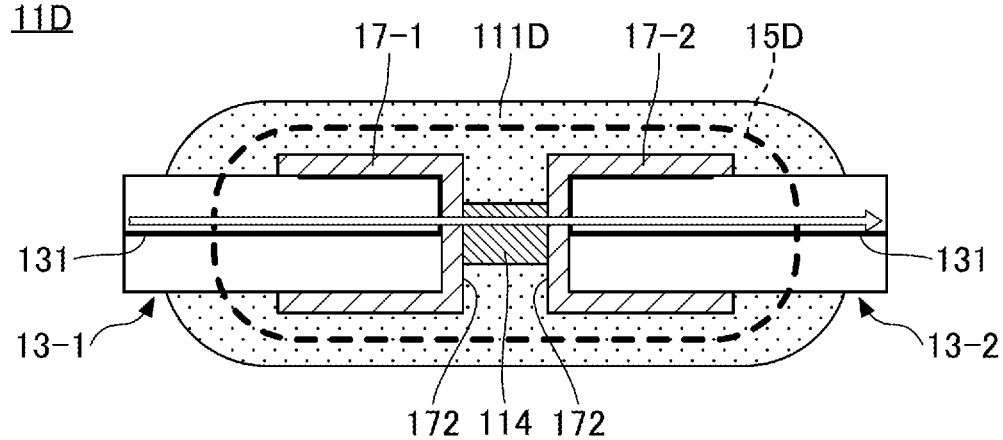
FIG. 10D shows still another configuration example of the connector part.

FIG. 10D shows a configuration of an electrical connector part 15D of a support body 11D. The electrical connector part 15D has a bridge electrode 114 that electrically connects the edge jackets 17-1 and 17-2. The bridge electrode 114 connects the bottom surfaces 172 of the edge jackets 17-1 and 17-2. The configuration of FIG. 10D is advantageous in that the high frequency current can flow in the shortest path from the conductor 131-1 along the shortest path through the edge jacket 17-1, the bridge electrode 114, the edge jacket 17-2, and the conductor 131-2.

Although, in the example of FIG. 10D, the bridge electrode 114 connects part of the bottom surfaces 172 of the edge jackets 17-1 and 17-2, the thickness of the bridge electrode 114 can be increased so that the edge jackets 17-1 and 17-2 are connected at the entirety of the bottom surfaces 172. By thickening the bridge electrode 114, the electrical connection and the physical connection become more stable. By enclosing the periphery of the bridge electrode 114 with an insulating frame 111D, the mechanical strength of the electrical connector part 15D is improved, and the reliability of the electrical connection is ensured.

Figure 10E:
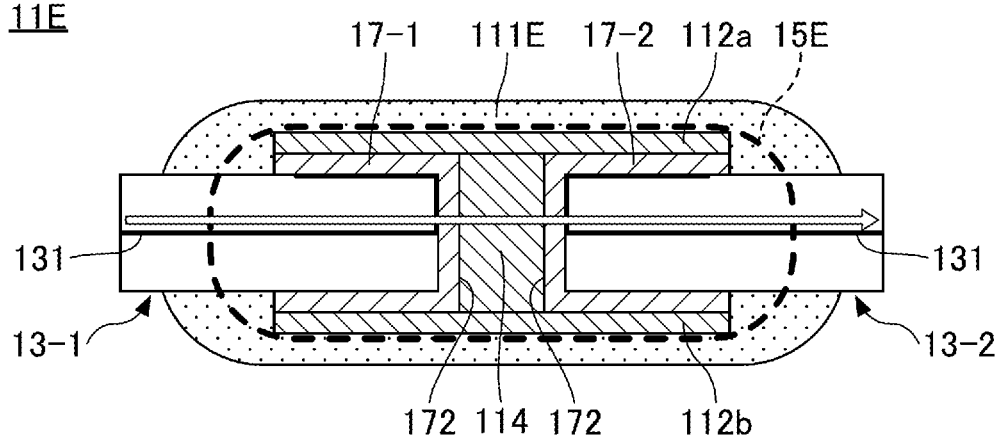
FIG. 10E shows still another configuration example of the connector part.

FIG. 10E shows a configuration of an electrical connector part 15E of a support body 11E. The electrical connector part 15E has an H-shaped horizontal cross section, in which a pair of opposing bridge electrodes 112a and 112b are connected by a bridge electrode 114. The bridge electrode 114 provides electrical connection between the entirety of the bottom surfaces 172 of the edge jackets 17-1 and 17-2, thereby achieving stability of both electrical and mechanical strength. The bridge electrode 114 and the bridge electrodes 112a and 112b can be integrally fabricated. The frame 111E that covers the electrical connector part 15E may be made of an insulating material such as a resin, or may be made of CFRP. A curable adhesive may be used as the resin.

Figure 10F:
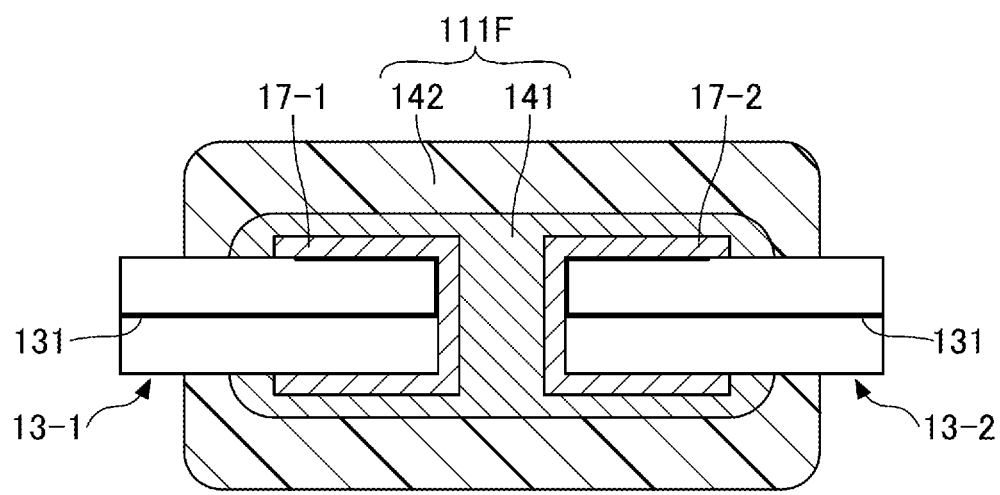
FIG. 10F shows still another configuration example of the connector part.

FIG. 10F shows a configuration using a frame 111F of a composite type of metal and resin. The frame 111F has a metal connector 141 and a resin reinforcement 142 that covers the metal connector 141. The metal connector 141 can be easily manufactured by extrusion molding or the like, and the connector itself has a certain degree of strength while ensuring electrical connection. By covering the metal connector with the resin reinforcement 142, the metal connector 141 and the resin reinforcement 142 together achieve the strength as the supporting member. The resin reinforcement 142 may be formed of an adhesive such as an acrylic adhesive or an epoxy adhesive, thereby reducing the thickness of the metal connector 141 and suppressing residual inductance caused by current detours. The corners may be rounded to prevent diffraction at the corners.

Figure 10G:
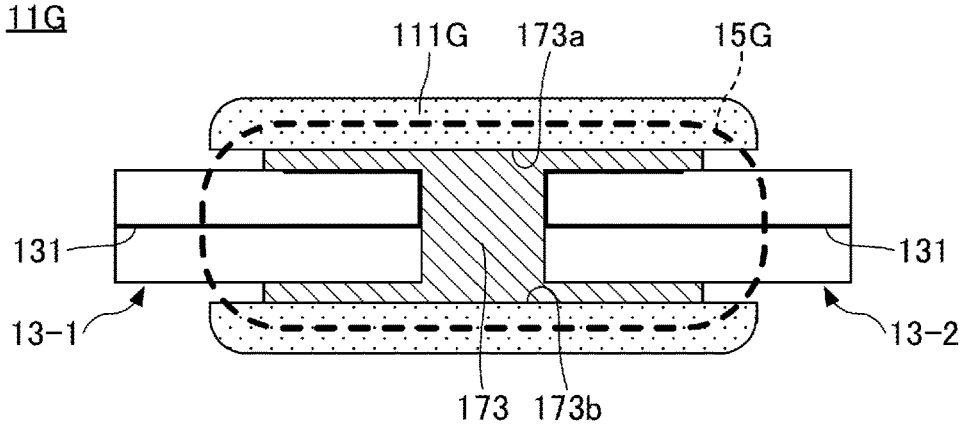
FIG. 10G shows still another configuration example of the connector part.

FIG. 10G shows a configuration of an electrical connector part 15G of a support body 11G. The electrical connector part 15G has a bridge electrode 173 having an H-shaped horizontal cross section, as the configuration of FIG. 10E. In FIG. 10G, panels 13-1 and 13-2 are fitted into the bridge electrode 173 without using edge jackets. The conductor 131 whose end part is folded and drawn to the panel surface comes into direct connect with the bridge electrode 173. A frame 111G holds the outer surface 173a of the bridge electrode 173. The width $W_{BRG}$ of the bridge electrode 173 is set shorter than the width of the frame 111G so that the panel 13-1 and the panel 13-2 can be easily fitted into the frame 111G. The invention is not limited to this configuration, and the bridge electrode 173 and the frame 111G may have the same width. In the configurations of the electrical connection shown in FIG. 8 and FIG. 10A to FIG. 10G, the surfaces of the bridge electrodes may be coated with an insulating coating.

Figure 10H:
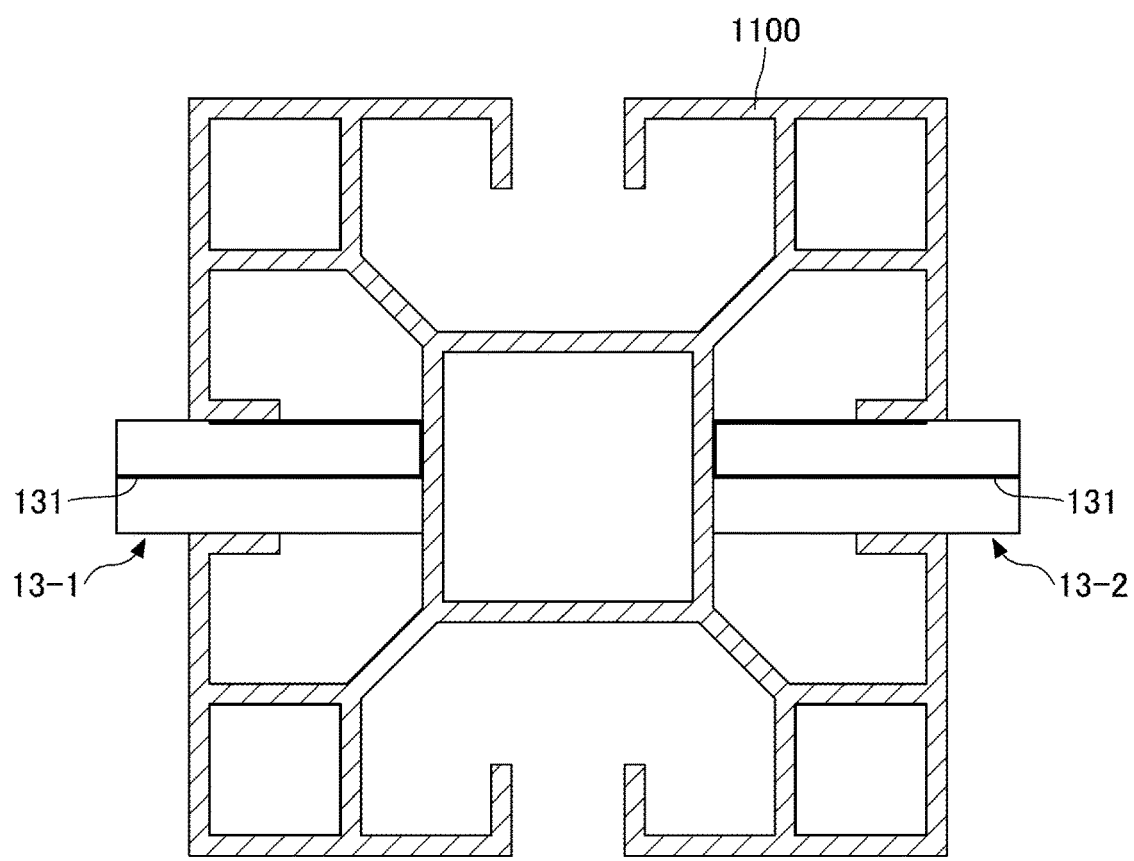
FIG. 10H shows a typical configuration of the connector part, as a reference configuration.

FIG. 10H shows a structure using a commercially available frame 1100 formed by extrusion molding of aluminum as a reference example. With the frame 1100 having a complicated cross-sectional shape, currents flow in various directions, and residual inductance and stray capacitance are generated due to the complicated current detour paths. The response varies in a complicated manner, depending on the incident electromagnetic waves, and the sharing or propagation of the reference potential of reflection is adversely affected. For these reasons, it is preferable to adopt the configurations of the electrical connector part 15 shown in FIG. 8 and FIG. 10A to FIG. 10G for the frame body 11.

<Connection of Panels>

FIG. 11A shows connection of the electromagnetic wave reflectors 10-1 and 10-2. Edge jackets 17-1 are provided on both edges of the panel 13-1. Edge jackets 17-2 are provided on both edges of the panel 13-2. The panel 13-1 and the panel 13-2 are fit into the edge jackets 17-1 and 17-2, respectively, in advance, and are connected by the support body 11.

The support body 11 may have a frame 111 with an electrical connector part 15 and a guide beam 118 for receiving the frame 111. The frame 111 and the guide beam 118 may be formed separately, as illustrated in FIG. 11A, or alternatively, they may be integrated into one unit. Upon receiving the panels 13-1 and 13-2 by the frame 111 from both sides, the bridge electrode 112 of the electrical connector part 15 comes into contact with the outer surfaces of the edge jackets 17-1 and 17-2 of the panels 13-1 and 13-2, and electrical connection is established between the reflective surfaces 105-1 and 105-2 of the electromagnetic wave reflecting devices 10-1 and 10-2.

By fitting the frame 111 for connecting the panels 13-1 and 13-2 to the guide beam 118, the frame 111 and the guide beam 118 are combined to form the support body 11 to couple the panels 13-1 and 13-2.

FIG. 11B shows the state of the electromagnetic wave reflectors 10 before connection. For each of the electromagnetic wave reflectors 10-1 to 10-3, a frame 111 having an electrical connector part 15 is attached in advance to one of the side edges of the panel 13, and a guide beam 118 is attached to the other side edge. The reflective surfaces 105 of the electromagnetic wave reflector 10-1 to 10-3 may have any configuration shown in FIG. 6A to FIG. 6D.

The frame 111 is configured to be adaptable to the guide beam 118 attached to another electromagnetic wave reflector 10, while the guide beam 118 is configured to be able to receive the frame 111 attached to another electromagnetic wave reflector 10. For instance, the guide beam 118 of the electromagnetic wave reflector 10-1 receives the frame 111 of the electromagnetic wave reflector 10-2. The guide beam 118 of the electromagnetic wave reflector 10-2 receives the frame 111 of the electromagnetic wave reflector 10-3. By combining multiple electromagnetic wave reflectors 10 of a standard size, the length of the production line can be covered in a flexible manner. The assembly work may be carried out on-site in the factory. The individual electromagnetic wave reflectors 10-1 to 10-3 are simple in configuration and easy to transport.

FIG. 11C shows the state of the electromagnetic wave reflectors 10 after connection. The frame 111, together with the guide beams 118, form the support body 11. A plurality of electromagnetic wave reflectors 10-1, 10-2, and 10-3 can be connected by the support body 11 to form an electromagnetic wave reflective fence 100. The electrical connector part 15 of the frame 111 can suppress discontinuity of the reflected current waves at the boundary between the panels 13.

A base 119 may be provided in advance to one or both of the guide beam 118 and the frame 111, thereby allowing the connected electromagnetic wave reflectors 10-1 to 10-3 to stand up by themselves on the installation plane. A cover 29 may be provided to the edge of the last panel 13 of the electromagnetic wave reflector 10-3 at the end position to protect the edge jacket 17 and the guide beam 118.

FIG. 12 and FIG. 13 show a mechanism that reinforces the connections of a plurality of electromagnetic wave reflectors 10-1 and 10-2. In FIG. 12, (A) is a front view of the electromagnetic wave reflective fence 100, (B) is a side view before the reinforcing mechanism 125 is tightened, and (C) is a side view after the reinforcing mechanism 125 is tightened. FIG. 13 shows a configuration example of the reinforcement mechanism 125. FIG. 13 shows a front view of guide grooves 129 formed in an attaching surface 127a of a cover 127 of the reinforcement mechanism 125, and cross-sectional views taken along the cross-sections A and B of the front view. The cover 127 is attached to the panels 13 at the attaching surface 127a.

In order to improve the connection strength and electrical connectivity, the reinforcement mechanism 125 shown in FIG. 12 and FIG. 13 can be used as necessary unless the reflection characteristics are deteriorated. A pin 128 is passed through a hole 126 formed in the panel 13, and the cover 127 is attached to the surface of the panel 13 opposite to the reflective surface. By moving the pin 128 along the guide groove 129 formed in the attaching surface 127a of the cover 127 (transition from the position of cross section A to the position of cross section B), the panel 13 can be pressed against the support body 11 from both sides. By the tightening of the reinforcement mechanism 125, the position of the hole 126 formed in the panel 13 slightly shifts towards the support body 11. The elastic force of the panel 13 enhances the connection between the edge of the panel 13 and the electrical connector part 15 of the support body 11 (see FIG. 17).

The mechanism for reinforcing the connection between multiple electromagnetic wave reflectors 10 is not limited to the above-described example shown in FIG. 12 and FIG. 13, and other appropriate mechanisms including a fastener and a ratchet may be used unless the electromagnetic wave reflection characteristics are impaired. The design of the edge jacket 17 and the electrical connector part 15 may be appropriately modified assuming the above-described pressure contact process.

<Evaluation of Support Body>

Figure 14:
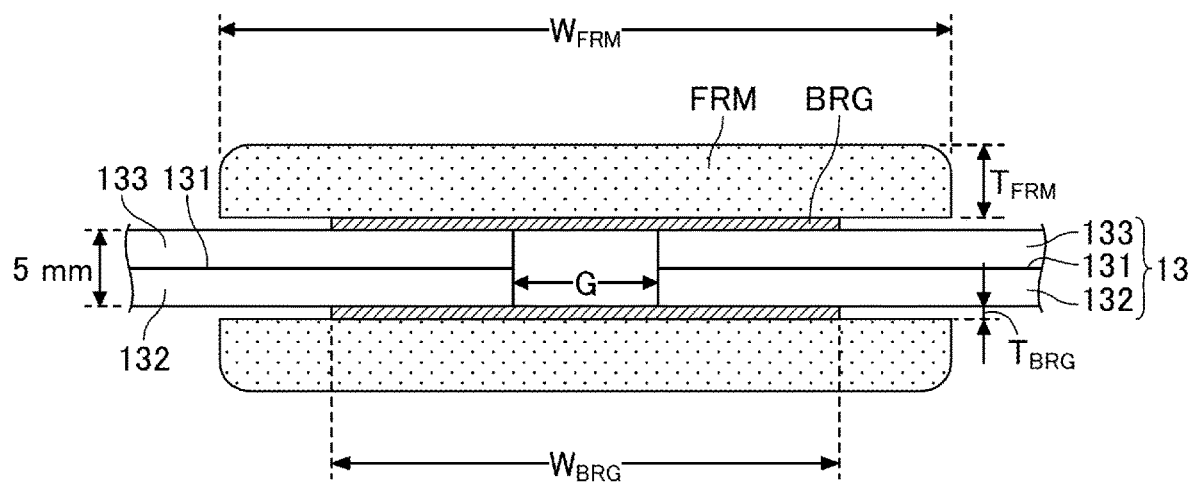
FIG. 14 is a schematic diagram of a model for evaluating appropriate dimensions of the frame and bridge electrodes.

The dimensions and characteristics of the support body 11 are evaluated below. FIG. 14 is a schematic diagram of a model used for evaluating appropriate dimensions of the frame 111 and the bridge electrode 112. With this model, appropriate ranges of the width $W_{FRM}$ and the thickness $T_{FRM}$ of the frame, as well as appropriate ranges of the width $W_{BRG}$ and the thickness $T_{BRG}$ of the bridge electrode, are estimated based on the reflection characteristics obtained when the two panels 13 are electrically connected via the electrical connector part 15.

FIG. 15 shows the relationships between the width of the frame and the reflection characteristic, and between the thickness of the frame and the reflection characteristic, when the incident angle of the electromagnetic wave is 0°. Reflection characteristic is represented by peak ratio on the vertical axis. The peak ratio is expressed by the ratio of the peak intensity of the scattering cross section with the electrical connector part 15 to the peak intensity of the scattering cross section of a single panel without the electrical connector part 15. Incident angle of 0° corresponds to incidence normal to the electrical connector part 15.

Figure 19:
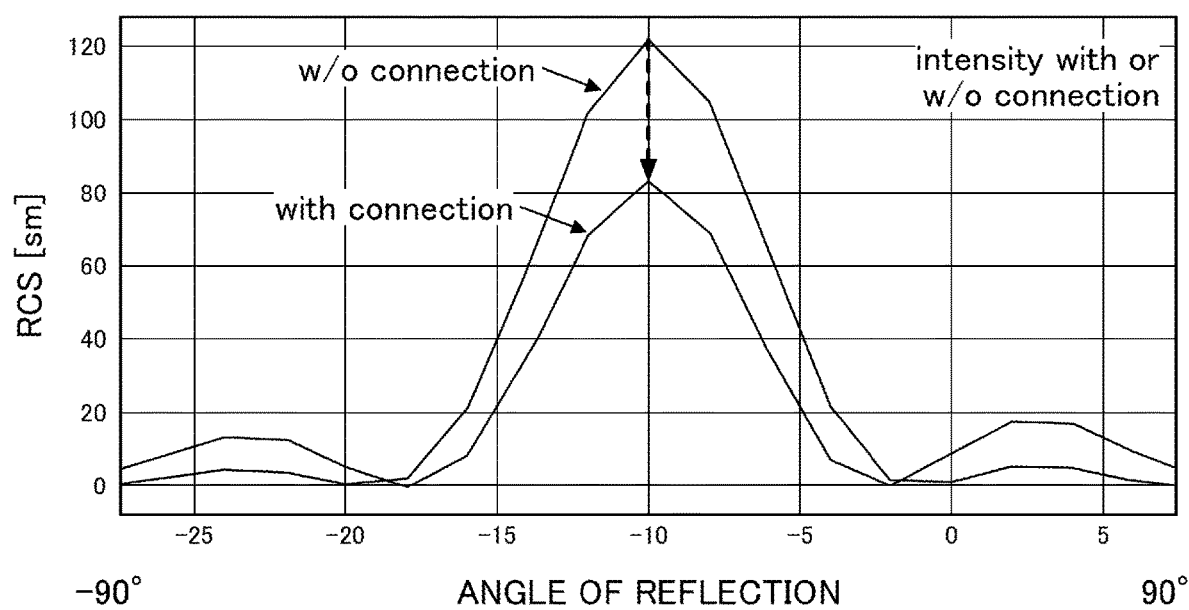
FIG. 19 shows how the reflection characteristic is evaluated.

As shown in FIG. 19, the performance to reflect the incident electromagnetic waves is evaluated by a radar reflection cross section (RCS), that is, a scattering cross section. The unit of RCS is square meters (sm). By connecting the two panels with the electrical connector part 15, the intensity of the main peak of the RCS decreases, compared to a single panel. The smaller the proportion of the decrease, that is, the higher the peak ratio of the RCS main peak intensity with the electrical connector part 15 to the RCS main peak intensity without the electrical connector part 15, the better the reflection characteristics.

In the evaluation, general-purpose three-dimensional electromagnetic field simulation software is used to analyze the scattering cross section, based on reflection of a plane wave of 3.8 GHz.

In FIG. 15 (A), the frame thickness $T_{FRM}$ is fixed to 1 mm, and the peak intensity ratio of the scattering cross section is calculated, while changing the frame width $W_{FRM}$ from 0 mm to 150 mm. In FIG. 15 (B), the frame width $W_{FRM}$ is fixed to 50 mm, and the peak intensity ratio of the scattering cross section (hereinafter referred to simply as "peak ratio") is calculated, while changing the frame thickness $T_{FRM}$ from 0 mm to 15 mm. The peak ratio of 1.0 represents the reflection characteristic of a single panel without the electrical connector part 15. The dashed line indicates the peak ratio of an aluminum frame with a thickness of 10 mm and a width of 50 mm for reference.

In FIG. 15 (A), with the width $W_{FRM}$ of the frame 111 of 150 mm or less, the peak ratio is 0.85 or more, and with the width $W_{FRM}$ of 60 mm or less, the peak ratio is 0.9 or more. Accordingly, the width $W_{FRM}$nM of the frame 111 is preferably 150 mm, more preferably from 20 mm to 60 mm.

In FIG. 15 (B), with the thickness $T_{FRM}$ of the frame 111 of 15 mm or less, the peak ratio is higher than that of the aluminum frame. With the thickness of 10 mm or less, the peak ratio is 0.9 or more, and with the thickness of 7.5 mm, the peak ratio is the maximum. Accordingly, the thickness $T_{FRM}$ of the frame 111 is preferably 15 mm or less, more preferably 10 mm or less, and still more preferably from 2 mm to 7.5 mm.

FIG. 16 shows the relationships between the width of the frame and the reflection characteristic, and between the thickness of the frame and the reflection characteristic, when the incident angle of the electromagnetic wave is 45°. The simulation conditions are the same as in FIG. 15 except for the incident angle. The dashed line indicates the peak ratio of an aluminum frame with a thickness of 10 mm and a width of 50 mm for reference.

At the incident angle of 45°, the peak ratio is 0.85 or more when the width of the frame 111 is 150 mm or less, and 0.9 or more when the width is 100 mm or less, as shown in FIG. 16 (A). Along with the simulation result of FIG. 15 (A), the width $W_{FRM}$ of the frame 111 is preferably 150 mm, and more preferably from 20 mm to 60 mm.

In FIG. 16 (B), the frame 111 with a thickness of 12 mm or less exhibits a peak ratio higher than the aluminum frame. With the thickness of 10 mm or less, the peak ratio is 0.9 or more, and with the thickness of 7.5 mm, the peak ratio is the maximum. Along with the simulation result of FIG. 15 (B), the thickness $T_{FRM}$ of the frame 111 is preferably 12 mm or less, more preferably 10 mm or less, and still more preferably from 2 mm to 7.5 mm.

FIG. 17 shows the relationships between the width and the reflection characteristic, between the thickness and the reflection characteristic, and between material of the bridge electrode and the reflection characteristic when the incident angle is 0°. FIG. 18 shows the relationships between the width and the reflection characteristic, between the thickness and the reflection characteristic, and between material of the bridge electrode and the reflection characteristic when the incident angle is 45°. In FIG. 17 (A), the peak ratio of the scattering cross section is calculated while changing the width $W_{BRG}$ of the bridge electrode in the range from 10 mm to 100 mm. In FIG. 17 (B), the peak ratio of the scattering cross section is calculated while changing the thickness $T_{BRG}$ of the bridge electrode in the range from 1 mm to 50 mm. In FIG. 17 (C), the peak ratio of the scattering cross section is calculated while changing the material of the bridge electrode among aluminum (Al), copper (Cu), and SUS. In chart (A) to (C) of FIG. 18, peak ratios are calculated under the same conditions as in FIG. 17, except for the incident angle being changed to 45°.

From the results of FIG. 17 and FIG. 18, the width $W_{BRG}$ of the bridge electrode 112 is preferably 100 mm or less, more preferably 50 mm or less. The thickness of the bridge electrode is preferably 20 mm or less, more preferably 10 mm or less, and even more preferably from 1 mm to 5 mm. As long as a conductor such as Al, Cu, SUS, etc. is used as the material of the bridge electrode, the difference in the material does not significantly affect the reflection characteristics.

Referring to FIG. 17 (B) and FIG. 18 (B), the peak ratio is particularly high when the thickness of the bridge electrode is 40 mm, because the wavelength of the 3.8 GHz electromagnetic wave is 78.9 mm, and because the thickness of the bridge electrode corresponds to the half wavelength of the incident electromagnetic wave. It is considered that the incident wave and the reflected wave enhance each other (resonance phenomenon) to increase the scattering cross section.

Figure 20A:
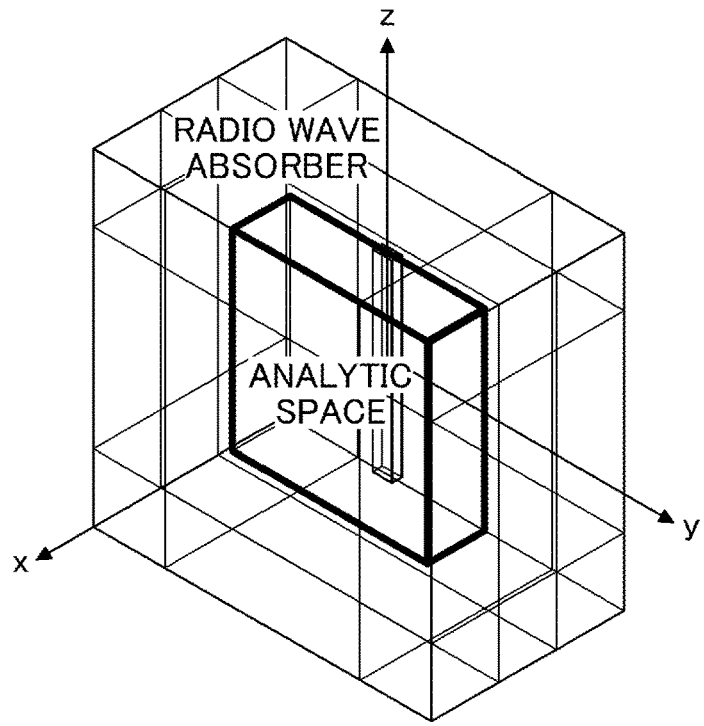
FIG. 20A shows an analytic space of reflection characteristic.
Figure 20B:
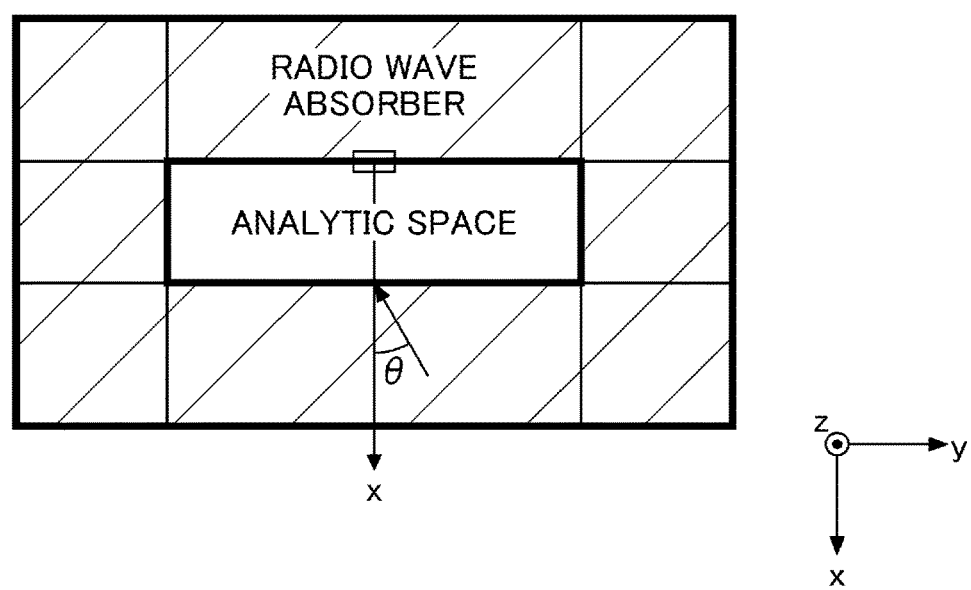
FIG. 20B shows an analytic space of reflection characteristic.

FIG. 20A and FIG. 20B show analytic space of reflection characteristics of Examples 1 to 8 and Referenced Configurations 1 to 4 described below. In FIG. 20A and FIG. 20B, the thickness direction of the panel is the x direction, the width direction is the y direction, and the height direction is the z direction. The dimensions of the analytic space are represented as (x-direction dimension)×(y-direction dimension)×(z-direction dimension). Under the condition of the frequency of 2 GHz to 15 GHz, the dimensions of the analytic space are 150 mm×500 mm×500 mm. Under the condition of the frequency of 28 GHz, the dimensions of the analytic space are 100 mm×200 mm×200 mm. The analytic space is narrowed at a higher frequency because the wavelength decreases. As shown in FIG. 20B, the boundary conditions are designed so as to have a radio wave absorber around the analytic space.

Figure 21:
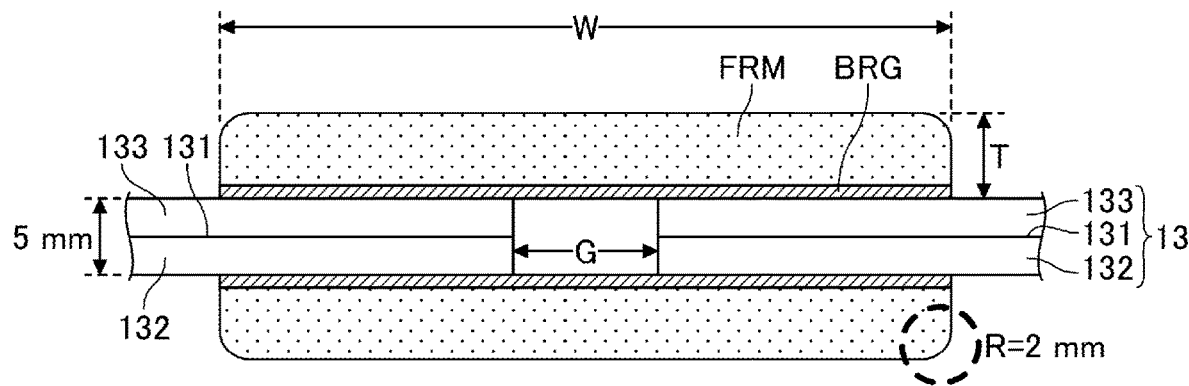
FIG. 21 shows a simulation model used in Examples and Comparative Examples.

FIG. 21 shows a simulation model used in Examples and Referenced Configurations. In panel 13, a conductor 131 is provided and bonded between two dielectrics 132 and 133. The dielectrics 132 and 133 are made of glass or polycarbonate with a thickness of 2 mm. The conductor 131 is made of SUS with a thickness of 1 mm. The total thickness of the panel 13 is 5 mm. A 10 mm gap is provided between the two panels 13. This configuration of the panel 13 is in common throughout Examples 1-8 and Referenced Configurations 1-4.

Example 1

With the configuration of FIG. 21, an aluminum plate having a thickness of 1 mm and a width of 50 mm is used as the bridge electrode (referred to as "BRG" in the figure) of the electrical connector part 15. An FRP frame (referred to as "FRM" in the figure) with a thickness of 5 mm and a width of 50 mm is provided onto the outer surface of the aluminum plate. The radius of curvature R at the corners of the frame is 2 mm. The frequency of the incident electromagnetic wave is 3.8 GHz. The analytic space is set to 150 mm×500 mm×500 mm. The angle of incidence is changed from 0° to 60° with a step size of 10°, and the intensity ratio of the main peak of the scattering cross section is calculated. The calculation results are shown in Table 1.

TABLE 1

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.94 | 0.95 | 0.95 | 0.97 | 0.96 | 0.97 | 0.83 |

Example 2

With the configuration of FIG. 21, an aluminum plate having a thickness of 1 mm and a width of 50 mm is used as the bridge electrode BRG of the electrical connector part 15. An FRP frame with a thickness of 7.5 mm and a width of 50 mm is provided onto the outer surface of the aluminum plate. The radius of curvature R at the corners of the frame is 2 mm. The frequency of the incident electromagnetic wave is 3.8 GHz. The angle of incidence is changed from 0° to 60° with a step size of 10°, and the intensity ratio of the main peak of the scattering cross section is calculated. The calculation results are shown in Table 2.

TABLE 2

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.97 | 0.97 | 0.97 | 0.96 | 0.94 | 0.95 | 0.66 |

Example 3

Figure 22:
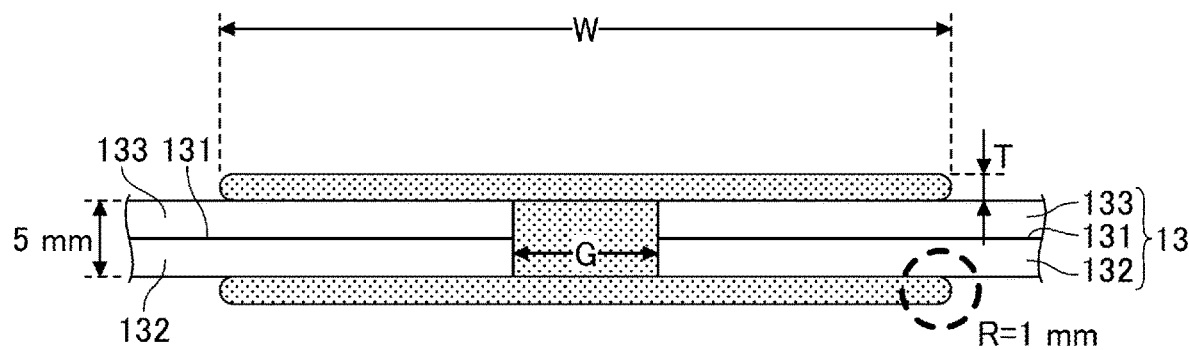
FIG. 22 shows a simulation model of Example 3.

FIG. 22 shows a simulation model of Example 3. In Example 3, adjacent panels are connected by CFRP which serves as both the bridge electrode and the frame. The horizontal cross section of the CFRP is H-shaped, and the gap G between the two panels is filled with CFRP. The thickness of the CFRP on the main surface of the panel is 2 mm, the width is 50 mm, and the radius of curvature R of the corners is 1 mm. The frequency of the incident electromagnetic wave is 3.8 GHz. The angle of incidence is changed from 0° to 60° with a step size of 10°, and the intensity ratio of the main peak of the scattering cross section is calculated. The calculation results are shown in Table 3.

TABLE 3

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.93 | 0.94 | 0.94 | 0.94 | 0.94 | 0.96 | 0.81 |

Example 4

Figure 23:
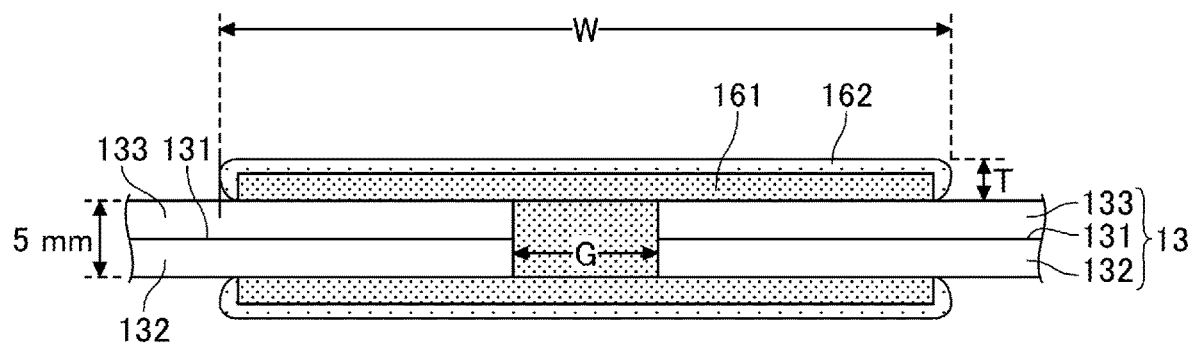
FIG. 23 shows a simulation model of Example 4.

FIG. 23 shows a simulation model of Example 4. In Example 4, adjacent panels are connected by a two-layer structure of CFRP and FRP. The inner layer 161 which is in contact with the panel 13 is formed of CFRP, and the outer layer 162 is formed of FRP. The inner layer 161 serves as the bridge electrode and as a part of the frame. The thickness of the inner layer 161 formed of CFRP is 1 mm on the main surface of the panel 13, and the width is 50 mm. The corners are not chamfered. The thickness of the FRP of the outer layer 162 is 1 mm, and the corners are chamfered with a radius of curvature R of 1 mm. The frequency of the incident electromagnetic wave is 3.8 GHz. The angle of incidence is changed from 0° to 60° with a step size of 10°, and the intensity ratio of the main peak of the scattering cross section is calculated. The calculation results are shown in Table 4.

TABLE 4

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.93 | 0.94 | 0.94 | 0.95 | 0.94 | 0.97 | 0.84 |

Example 5

Example 5 is based on the model configuration of FIG. 21. An aluminum plate having a thickness of 1 mm and a width of 50 mm is used as the bridge electrode, and a polycarbonate frame having a thickness of 7.5 mm and a width of 50 mm is provided to the outer surface of the bridge electrode. The frequency of the incident electromagnetic wave is 3.8 GHz. The angle of incidence is changed from 0° to 60° with a step size of 10°, and the intensity ratio of the main peak of the scattering cross section is calculated. The calculation results are shown in Table

TABLE 5

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.97 | 0.96 | 0.97 | 0.97 | 0.97 | 0.97 | 0.76 |

Example 6

Example 6 is based on the model configuration of FIG. 21. An aluminum plate having a thickness of 1 mm and a width of 50 mm is used as the bridge electrode, and a polymethyl methacrylate frame with a thickness of 7.5 mm and a width of 50 mm is provided to the outer surface of the bridge electrode. The frequency of the incident electromagnetic wave is 3.8 GHz. The angle of incidence is changed from 0° to 60° with a step size of 10°, and the intensity ratio of the main peak of the scattering cross section is calculated. The calculation results are shown in Table

TABLE 6

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.97 | 0.97 | 0.97 | 0.96 | 0.93 | 0.94 | 0.63 |

Example 7

Example 7 is based on the model configuration of FIG. 21. An aluminum plate having a thickness of 1 mm and a width of 50 mm is used as the bridge electrode, and a polystyrene frame with a thickness of 7.5 mm and a width of 50 mm is provided to the outer surface of the bridge electrode. The frequency of the incident electromagnetic wave is 3.8 GHz. The angle of incidence is changed from 0° to 60° with a step size of 10°, and the intensity ratio of the main peak of the scattering cross section is calculated. The calculation results are shown in Table 7.

TABLE 7

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.95 | 0.96 | 0.96 | 0.97 | 0.97 | 0.97 | 0.81 |

[Referenced Configuration 1]

Figure 24:
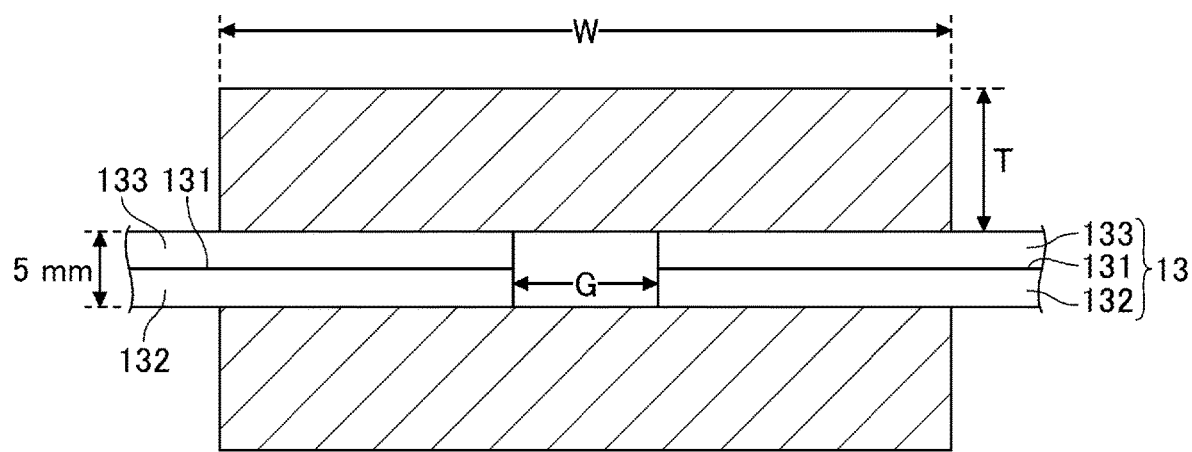
FIG. 24 shows a simulation model of Reference Configuration 1.

FIG. 24 shows a simulation model of Referenced Configuration 1. Referenced Configuration 1 uses an aluminum frame to connect panels. The thickness of the aluminum frame is 10 mm, and the width W is 50 mm. The frequency of the incident electromagnetic wave is 3.8 GHz. The angle of incidence is changed from 0° to 60° with a step size of 10°, and the intensity ratio of the main peak of the scattering cross section is calculated. Calculation results are shown in Table 8.

TABLE 8

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.64 | 0.69 | 0.69 | 0.83 | 0.76 | 0.89 | 0.80 |

[Referenced Configuration 2]

Figure 25:
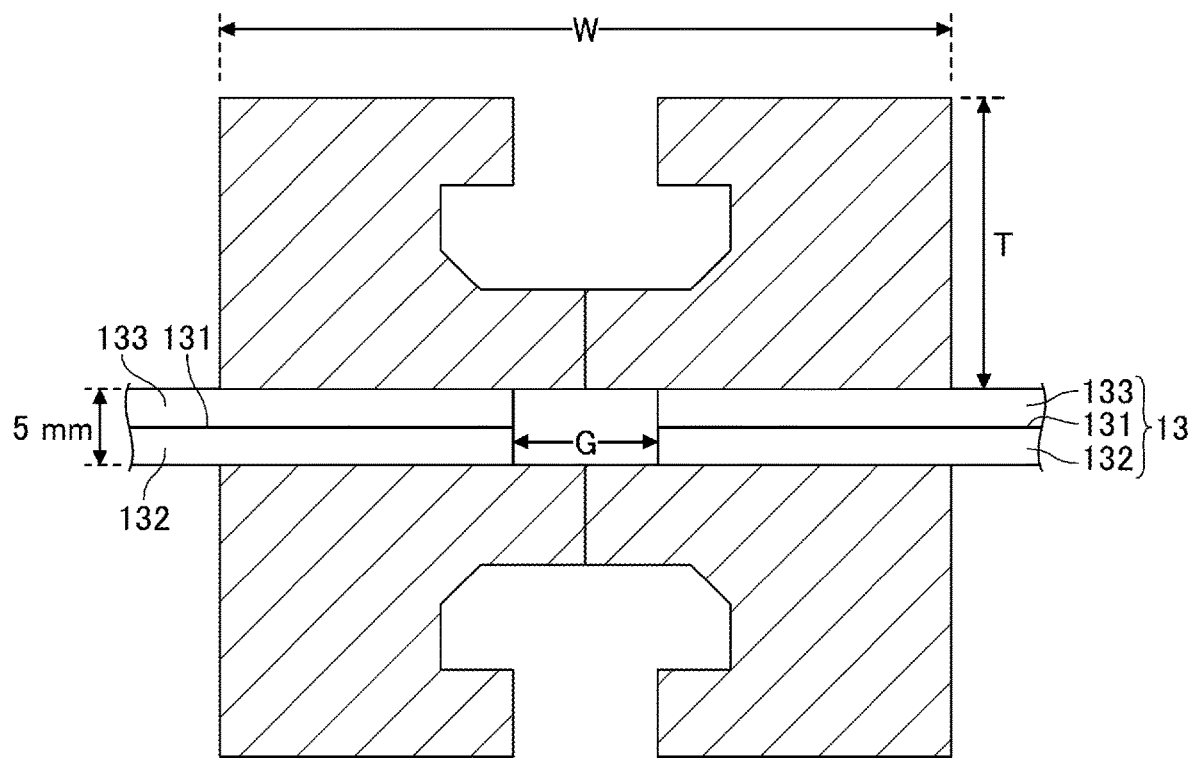
FIG. 25 shows a simulation model of Reference Configuration 2.

FIG. 25 shows a simulation model of Referenced Configuration 2. Referenced Configuration 2 uses an aluminum frame processed into a specific shape to connect panels. The thickness T of the aluminum frame is 20 mm, the width W is 50 mm, and a cutout is provided in the thickness direction. The frequency of the incident electromagnetic wave is 3.8 GHz. The angle of incidence is changed from 0° to 60° with a step size of 10°, and the intensity ratio of the main peak of the scattering cross section is calculated. Calculation results are shown in Table 9.

TABLE 9

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.92 | 0.95 | 0.87 | 0.89 | 0.74 | 0.95 | 0.68 |

Example 8

Example 8 has the same configuration for connecting the panels as Example 1, but the frequency of the incident electromagnetic wave is set to 28 GHz. Along with this change of the frequency of the electromagnetic wave to 28 GHz, the dimensions of the analytic space is set to 100 mm×200 mm×200 mm. An aluminum plate having a thickness of 1 mm and a width of 50 mm is used as the bridge electrode, and an FRP frame having a thickness of 5 mm and a width of 50 mm is provided onto the outer surface of the aluminum plate. The radius of curvature R of the corners of the frame is 2 mm. The angle of incidence of the 28 GHz electromagnetic wave is changed from 0° to 60° with a step size of 10°, and the intensity ratio of the main peak of the scattering cross section is calculated. The calculation results are shown in Table 10.

TABLE 10

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.70 | 0.76 | 0.66 | 0.70 | 0.68 | 0.79 | 1.13 |

[Referenced Configuration 3]

Referenced Configuration 3 has the configuration of FIG. 24. The thickness T of the aluminum frame is set to 8.5 mm, and the width W is 50 mm. The frequency of the incident electromagnetic wave is 28 GHz. The angle of incidence is changed from 0° to 60° with a step size of 10°, and the intensity ratio of the main peak of the scattering cross section is calculated. Calculation results are shown in Table 11.

TABLE 11

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.23 | 0.17 | 0.16 | 0.18 | 0.42 | 0.84 | 0.78 |

[Referenced Configuration 4]

Referenced Configuration 4 uses the aluminum frame of FIG. 25, and the frequency of the incident electromagnetic wave is set to 28 GHz. The angle of incidence is changed from 0° to 60° with a step size of 10°, and the intensity ratio of the main peak of the scattering cross section is calculated. Calculation results are shown in Table 12.

TABLE 12

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.50 | 0.31 | 0.15 | 0.31 | 0.33 | 0.12 | 0.59 |

[Referenced Configuration 5]

Referenced Configuration 5 does not have either a frame for physically supporting the panel or an electrical connector part (or a bridge electrode), and two panels are arranged in the same Y-Z plane (see FIG. 20A) with a gap of 10 mm between the two panels. The frequency of the incident electromagnetic wave is set to 3.8 GHz, and the dimensions of the analytic space are set to 150 mm×500 mm×500 mm. The angle of incidence is changed from 0° to 60° with a step size of 10°, and the intensity ratio of the main peak of the scattering cross section is calculated. Calculation results are shown in Table 13.

TABLE 13

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.92 | 0.96 | 0.92 | 0.97 | 0.90 | 0.97 | 0.91 |

[Referenced Configuration 6]

Referenced Configuration 6 does not have either a frame for physically supporting the panel or an electrical connector part (or a bridge electrode), and two panels are arranged in the same Y-Z plane (see FIG. 20A) with a gap of 50 mm between the two panels. The frequency of the incident electromagnetic wave is set to 3.8 GHz. The angle of incidence is changed from 0° to 60° with a step size of 10°, and the intensity ratio of the main peak of the scattering cross section is calculated. Calculation results are shown in Table 14.

TABLE 14

| | ANGLE OF INCIDENCE [°] | | | | | | |
|---|---|---|---|---|---|---|---|
| | 0 | 10 | 20 | 30 | 40 | 50 | 60 |
| PEAK RATIO | 0.79 | 0.84 | 0.78 | 0.86 | 0.80 | 0.89 | 0.87 |

Figure 26:
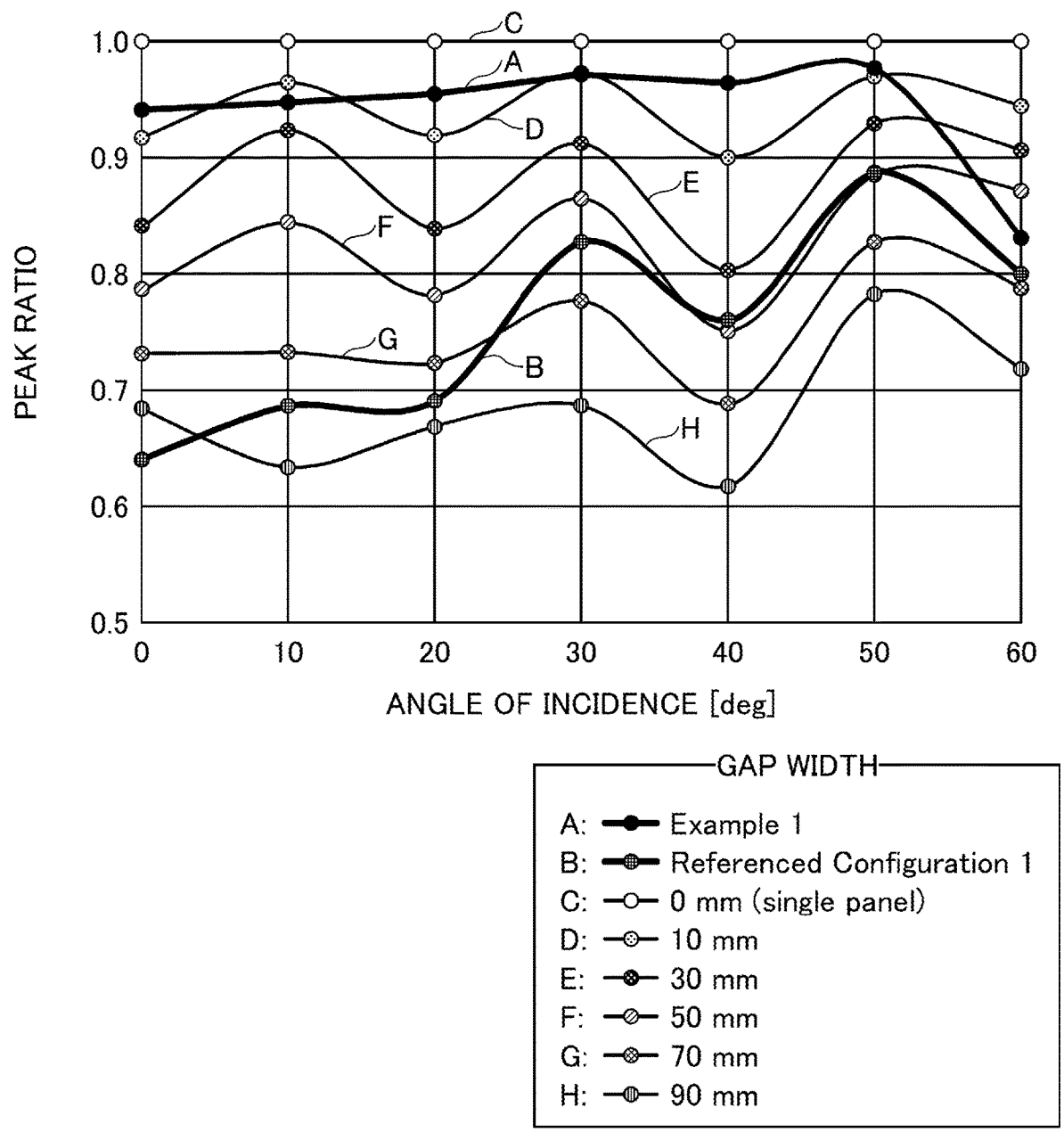
FIG. 26 shows reflection characteristics depending on the presence or absence of connection between panels.

FIG. 26 shows reflection characteristics of configurations with or without connection between panels. The gap width between two panels held within the same plane is changed among 0 mm, 10 mm, 30 mm, 50 mm, 70 mm, and 90 mm. A gap width of 0 mm represents a large single panel without panel connection. A gap width of 10 mm corresponds to Referenced Configuration 5, and a gap width of 50 mm corresponds to Referenced Configuration 6. Example 1 has a configuration in which two panels are connected by bridge electrodes covered with FRP as the frame. Referenced Configuration 1 has a configuration using an aluminum frame.

From the results of FIG. 26, with the gap of 10 mm or more between the panels, the reflection characteristic is degraded in the range of the incident angle of 0° to 50°, compared with the configuration of Example 1. Meanwhile, from the viewpoint of the strength of the panel, it is difficult to set up panels without gap or without a connection structure. Assuming that panels are set up without gaps so as to stand by themselves in a production line, only the bottom ends of the panels will be supported. In addition to the problems in the self-supporting ability and the mechanical strength, the reflectance will vary due to deflection of the panel 13 and/or the tilt with respect to the other panel surfaces. A large-sized single panel is difficult to fabricate and transport.

By employing the connection structure of the embodiment, that is, the support body 11 having the electrical connector part 15, multiple panels can be set up so as to stand by themselves, while suppressing deterioration of the reflection characteristics.

Figure 27:
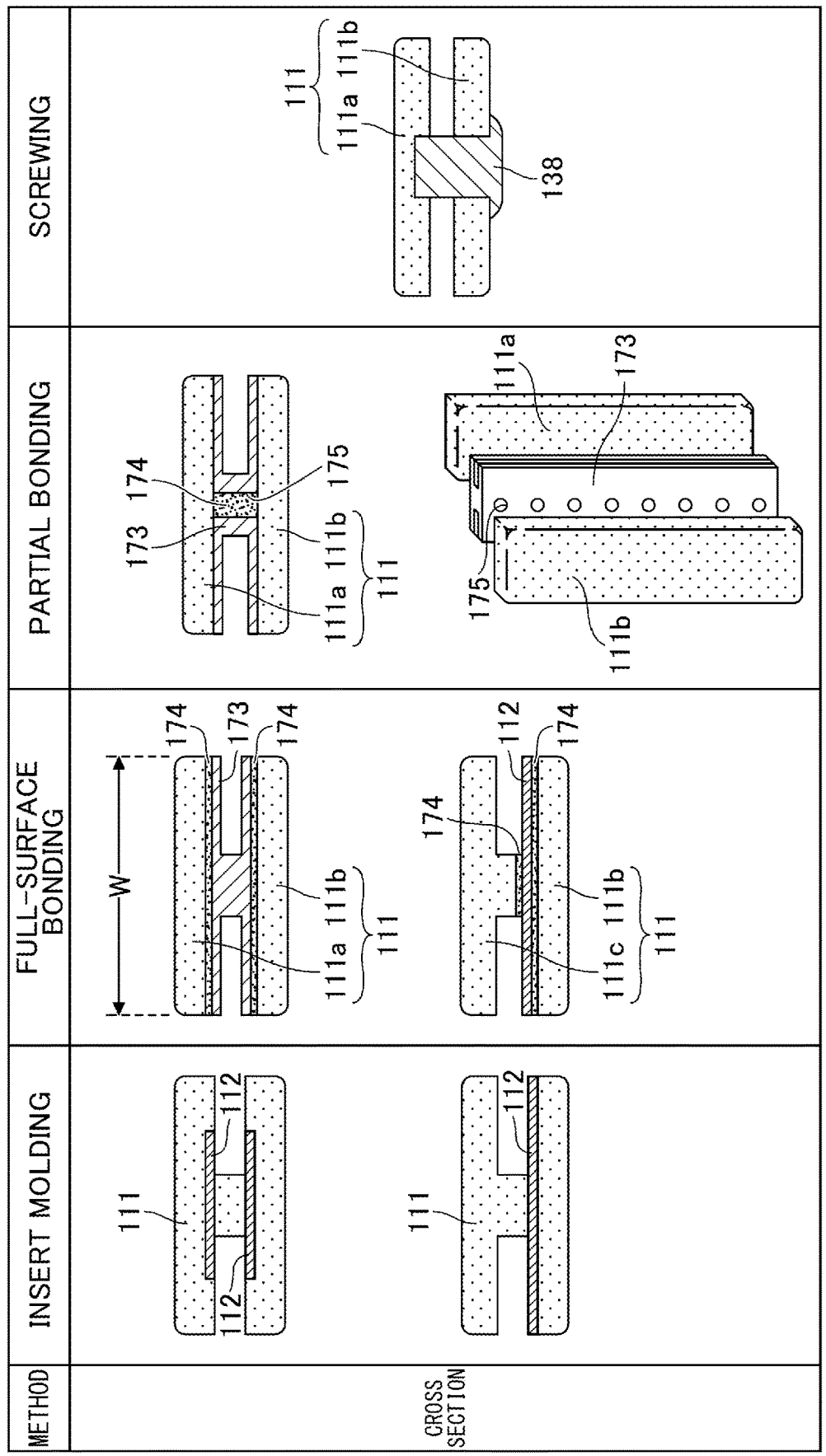
FIG. 27 shows several methods of assembling bridge electrodes and a frame.

FIG. 27 shows examples of a technique for assembling bridge electrodes and frames. The bridge electrode and frame can be assembled by insert molding, full-surface bonding, partial bonding, screwing, or other suitable processes to form the support body. By insert molding, the frame 111 and the bridge electrode 112 can be integrally formed. A bridge electrode 112 may be provided on one or both of the two opposing inner walls of the frame 111 which is H-shaped in a horizontal cross sectional view, as long as the potential surface of reflection is continuous between adjacent panels 13.

The bridge electrode may be bonded to the frame at the entirety of the assembling surface. If a bridge electrode 173 having an H-shaped horizontal cross section as shown in FIG. 10G is used, an adhesive 174 may be applied onto the entirety of the outer surface 173a (see FIG. 10G) to bond the first part 111a and the second part 111b of the frame 111. If the bridge electrode 112 is provided to only one of the inner walls of the frame, an adhesive 174 may be applied between the T-shaped first part 111c and the I-shaped second part 111b of the frame 111 in the horizontal cross-sectional view to bond the bridge electrode 112.

The bridge electrode may be partially bonded to the frame. With a bridge electrode 173 having an H-shaped horizontal cross section, multiple through-holes 175 may be provided along the height direction of the bridge electrode 173, and the through-holes 175 are filled with an adhesive 174 so that the ridge electrode 173 is partially bonded to the first part 111a and the second part 111b of the frame 111.

The first part 111a and the second part 11b of the frame 111 may be combined together using a conductive screw 138. The screw 138 tightly holds adjacent panels between the first part 111a and the second part 111b of the frame, while maintaining the continuity of the potential surface of reflection between the panels. With this configuration, it is desirable to use an opposite surface without the screwhead exposed as the reflective surface onto which electromagnetic waves are incident.

Using any one of the assembling processes, the support body 11 having the electrical connector part 15 (illustrated in FIG. 10A to FIG. 10G) can be fabricated.

<Application to Production Line>

Figures 28, 29:
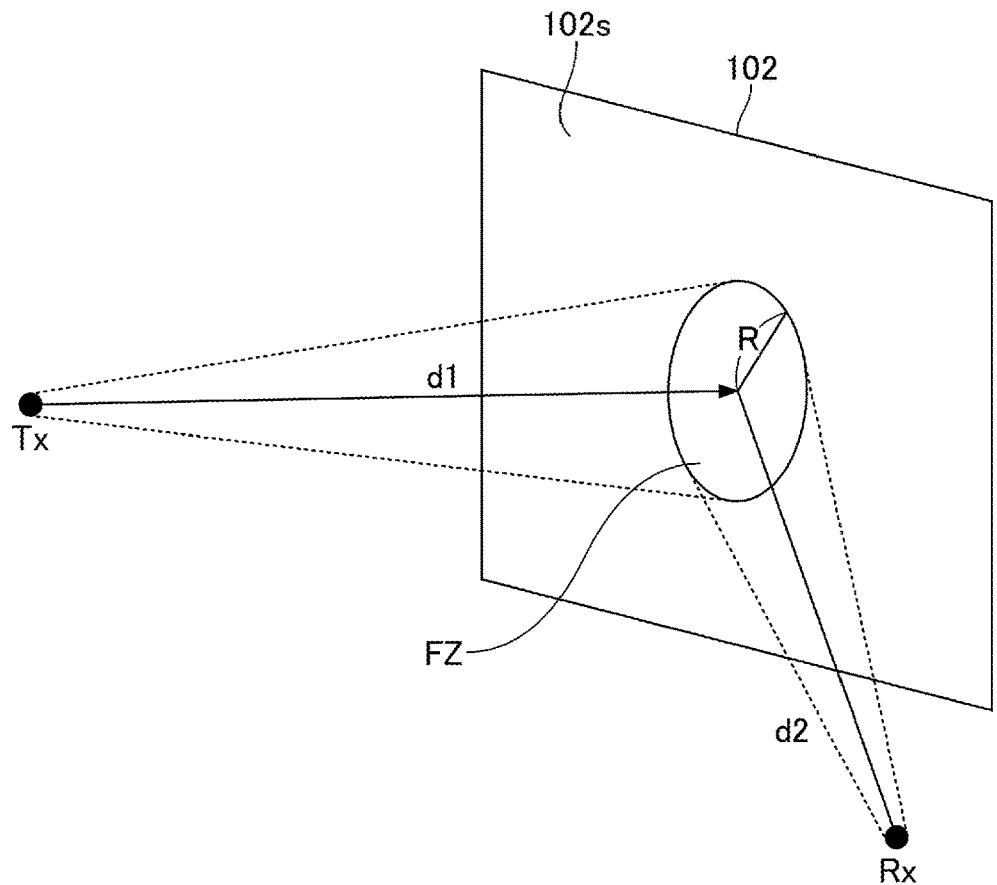
FIG. 28 illustrates how the size of a meta-reflector is determined.
FIG. 29 shows zone sizes depending on the operating frequency and the positional relationship between a transmitter and a receiver.

FIG. 28 shows the size of the meta-reflector 102, assuming that a transmitter "Tx" and a receiver "Rx" are used. The transmitter Tx is, for example, a base station BS. Receiver Rx is, for example, equipment located in the production line 3. The distance from the transmitter Tx to the surface 102s of the meta-reflector 102 is denoted as d1, and the distance from the surface 102s of the meta-reflector 102 to the receiver Rx is denoted as d2.

Given an application to a production line, the total distance D of d1 and d2 is, for example, 40 m (D=d1+d2=40 m). The standard length of the production line is 80 m. Assuming that the base stations BS are positioned at both ends of the production line in the length direction, and that the two base stations BS provide a standard rectangular service area, then the total length distance D is estimated to be 40 m (D=40 m).

The radius R of the first Fresnel zone is defined by Formula (1) when the radio waves emitted from the transmitter Tx and reflected from the meta-reflector 102 reach the receiver Rx in phase.

$$R = \sqrt{\frac{\lambda d_1 d_2}{d_1 + d_2}} \quad (1)$$

where λ is the wavelength being used.

FIG. 29 shows specific examples of the radius R of the first Fresnel zone derived from Formula (1). When the operating frequency is 28 GHz, d1 is 30 m, and d2 is 10 m, then the radius R of the first Fresnel zone is 0.283 m. At the same frequency, with d1 of 35 m and d2 of 5 m, the radius R is 0.216 m.

When the operating frequency is 3.8 GHz, d1 is 30 m, and d2 is 10 m, then the radius R of the first Fresnel zone is 0.770 m. At the same frequency, with d1 of 35 m and d2 of 5 m, the radius R is 0.588 m.

It is desirable for the equipment M used in the production line to be able to receive the reflected wave from the electromagnetic wave reflector 10 in phase with the direct wave from the base station BS from the viewpoint of improving the received power. In the application of the electromagnetic wave reflector 10 having one or more meta-reflectors 102 to a production line, the minimum size of one meta-reflector 102 is 0.5 meters per side or more for the 28 GHz band, considering the first Fresnel zone that allows in-phase signal reception. For the 3.8 GHz band, the minimum size of one meta-reflector 102 is preferably about 1 meter per side.

With the configuration of multiple meta-reflectors 102 applied to one panel 13 as illustrated in FIG. 5B to FIG. 5D, it is preferable for each of the meta-reflectors 102 to cover at least the first Fresnel zone.

The similar estimation applies to the normal reflector 101 because the radius R of the first Fresnel zone does not depend on the relationship between the angle of incidence and the angle of reflection. In order to guide the radio waves incident onto the normal reflector 101 to the receiver Rx, while maintaining the same phase by regular reflection, the size of the normal reflector 101 is desirably 50 centimeters per side or more.

If the meta-reflector 102 is used in a production line covered by a service area with a large aspect ratio, the oblique angle of either incidence or reflection becomes deep. So, the layout and the positional relationship among the production line 3, the base station BS, and the electromagnetic wave reflector 10 will be discussed below.

<Layout of Wireless Transmission System>

The layout of the wireless transmission system 1 will be described with reference to FIGS. 30A, 30B, 31A, and 31B. As has been described with reference to FIG. 1 and FIG. 2, the wireless transmission system 1 includes a base station BS, which transmits and receives radio waves in the frequency band of 1 GHz to 170 GHz, a production line 3 in which manufacturing equipment capable of transmitting and receiving the radio waves is placed, and an electromagnetic wave reflector 10 provided along at least a part of the production line. The electromagnetic wave reflector 10 has a reflective surface 105 that reflects the radio waves of the above-described frequency band.

The base station BS is preferably positioned closer to the production line 3 than to the line L horizontally extending from the reflective surface 105, as will be described in more detail below. For instance, the base stations BS may be arranged at both ends of the elongated production line 3. The manufacturing equipment in the production line 3 can telecommunicate with the base station BS directly or via the electromagnetic wave reflector 10 in the above-described frequency band.

Figure 30A:
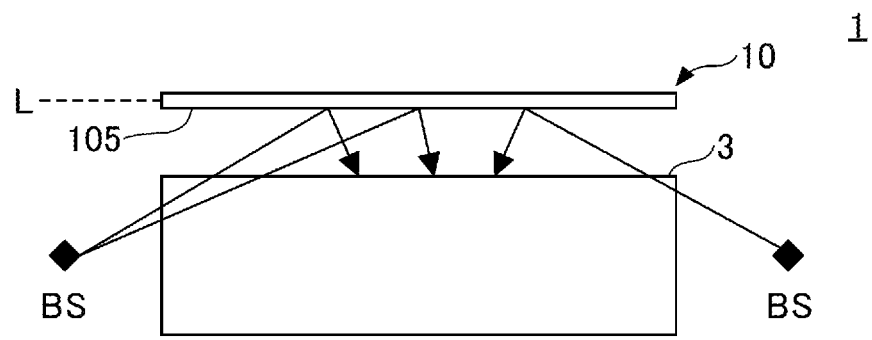
FIG. 30A shows a positional relationship of a wireless transmission system.

FIG. 30A shows Pattern 1 of reflection in the wireless transmission system 1. In Pattern 1, the base stations BS and the production line 3 are provided in such a positional relationship that the radio waves emitted from the base station BS are incident onto the reflective surface 105 at a deep angle with respect to the normal to the reflective surface 105 of the electromagnetic wave reflector 10 and reflected at a shallow angle, as indicated by the solid arrows. In other words, the radio wave is incident onto the reflective surface 105 at an angle greater than or equal to 45 degrees, and is reflected at an angle smaller than the angle of regular reflection.

In order to allow the radio waves from the base station BS to be incident on the reflective surface 105 at a deep angle, the base station BS is preferably positioned closer to the production line 3 than to the Line L horizontally extending from the surface of the electromagnetic wave reflector 10, and is preferably located at both ends of the elongated production line 3. By allowing the radio waves to be incident onto the reflective surface 105 at a deep angle, the radio waves can be guided to the center area of the production line 3.

Figure 30B:
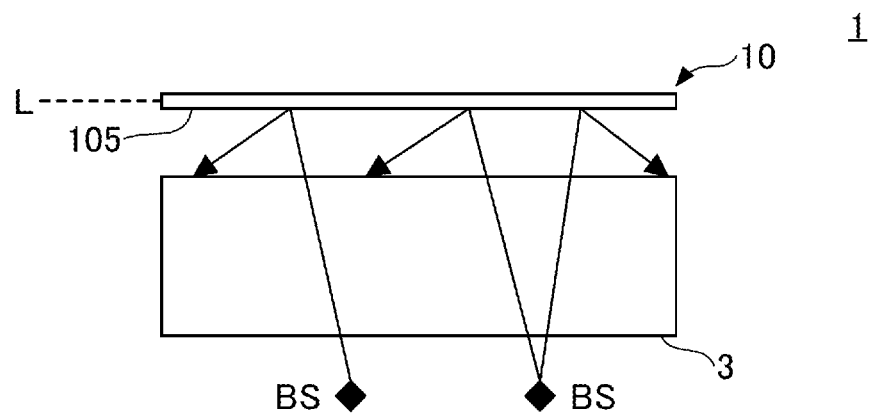
FIG. 30B shows another positional relationship of a wireless transmission system.

FIG. 30B shows Pattern 2 of reflection. In pattern 2, the base stations BS and the production line 3 are laid in such a positional relationship that the radio waves emitted from the base stations BS are incident onto the reflective surface 105 at a shallow angle with respect to the normal to the reflective surface 105 and are reflected at an angle deeper than the incident angle. In other words, in Pattern 2, the radio waves are incident onto the reflective surface 105 at an angle of incidence of 45 degrees or less, and are reflected at an angle greater than the regular reflection.

In Pattern 2, the base stations BS are positioned closer to the production line 3 than to the Line L horizontally extending from the reflective surface 105 of the electromagnetic wave reflector 10, but are positioned closer to the center, rather than the ends, of the production line 3 in the longitudinal direction. Pattern 2 is more sensitive to variations in the oblique incidence angle, as will be explained below.

FIG. 31A shows the baseline robustness of Pattern 1, and FIG. 31B shows the baseline robustness of Pattern 2. The baseline robustness means the stability of the angle of reflection when the angle of incidence is changed by 1 degree. The baseline robustness is high if the change in the reflection angle is small with respect to the change in the incident angle of 1 degree.

In FIG. 31A for Pattern 1, the anomalous angle θabn is changed to 7 different angles, namely 20°, 25°, 30°, 35°, 40°, 45°, and 50°, to estimate the fluctuation in the reflection angle with respect to the change in the incident angle. The fluctuation in the reflection angle is almost the same at the seven different anomalous angles θabn, and accordingly, the plotted lines overlap each other, which appear as one thick line in the figure.

The anomalous angle θabn is the difference between the reflection angle of regular reflection and the reflection angle of asymmetric reflection in which radio waves are reflected at an angle different from the incident angle, as has been described with reference to FIG. 3B. Varying the anomalous angle θabn from 20° to 50° corresponds to controlling the direction of asymmetric reflection over an angular range of 30°.

In the range of the incident angle from 50° to 75° (deep incidence), the fluctuation of the reflection angle with respect to the change of the incident angle of 1 degree is as small as less than 1 degree, and is almost constant regardless of the incident angle. When the incident angle is deep, the reflection controllability in the asymmetric reflection is high. It is easily inferred that the tendency of FIG. 31A exhibiting little fluctuation in the reflection angle can be maintained even at an incident angle exceeding 75° and approaching 90°.

In FIG. 31B for Pattern 2, the anomalous angle θabn is changed to seven different angles, namely 20°, 25°, 30°, 35°, 40°, 45°, and 50° to estimate the fluctuation in the reflection angle with respect to the change in the incident angle. In the range of the incident angle from 15° to 40° (shallow incidence), the fluctuation in the reflection angle with respect to the 1 degree change in the incident angle varies depending on the incident angle, and also varies greatly depending on the anomalous angle θabn.

With a small anomalous angle θabn, that is, with a small difference from the angle of regular reflection, the incidence angle dependence of the fluctuation in the reflection angle is small. As the anomalous angle θabn increases, that is, as the directional change of reflection by the meta-reflector 102 increases, the fluctuation in the angle of reflection with respect to the 1 degree change of the incident angle becomes very large, and the amount of fluctuation in the angle of reflection also varies greatly depending on the angle of incidence. In the shallow range of the incident angle of 15° to 40°, the controllability in the asymmetric reflection is not satisfactory.

From FIG. 31A and FIG. 31B, when base stations BS are introduced in the production line 3, the base stations BS are preferably located so that the incident angle of the radio waves emitted from the base stations BS and incident onto the electromagnetic wave reflector 10 is 50° or greater, from the viewpoint of suppressing the fluctuation of the reflection angle depending on the incident angle. Therefore, the layout shown in FIG. 30A is preferable to the layout of FIG. 30B.

FIG. 32 shows quantification of the baseline robustness. The baseline robustness of FIG. 31A and FIG. 31B can be estimated by the following procedure. A phase jump Φ(x) is determined by inputting a certain incident angle θi and a reflection angle θr to a function f for calculating a phase jump distribution, where x denotes the position in the x-direction on the reflective surface. A phase jump represents the amount of phase to be added to a reflected wave to guide the reflected wave to a desired direction. The phase jump distribution dΦ/dx is expressed as $$\sin \theta r - \sin \theta i = (\lambda/2\pi)(d\Phi/dx),$$

where λ is the wavelength being used.

Using a surface impedance Zs and a wave impedance η described in PHYSICAL REVIEW B 94.075142 (2016), V. S. Asadchy, et al., "PERFECT CONTROL OF REFLECTION AND REFRACTION USING SPATIALLY DISPERSIVE METASURFACES", the function f for determining phase jump distribution Φ(x) is expressed by the following formula.

$$f(x) = \arg\left(\frac{Z_s(x) - \eta}{Z_s(x) + \eta}\right),$$

where arg( ) is a function representing an argument of a complex number.

The surface impedance Zs(x) is expressed by the following formula.

$$Z_s(x) = \frac{\eta}{\sqrt{\cos\theta_i \cos\theta_r}} \frac{\sqrt{\cos\theta_r} + \sqrt{\cos\theta_i}\, e^{j\Phi_r(x)}}{\sqrt{\cos\theta_i} - \sqrt{\cos\theta_r}\, e^{j\Phi_r(x)}}$$

Next, the incident angle is incremented by 1 degree, and another phase jump Φ'(x) is calculated from the phase jump distribution function f by inputting the new incident angle and the corresponding (reflection angle)'.

Then, the (reflection angle)' that minimizes Φ'(x)−Φ(x) is determined, which is regarded as the fluctuation of the reflection angle with respect to the change in the incident angle. FIG. 31A and FIG. 31B are plots of the calculated fluctuation of the reflection angle as a function of the angle of incidence.

Figure 33A:
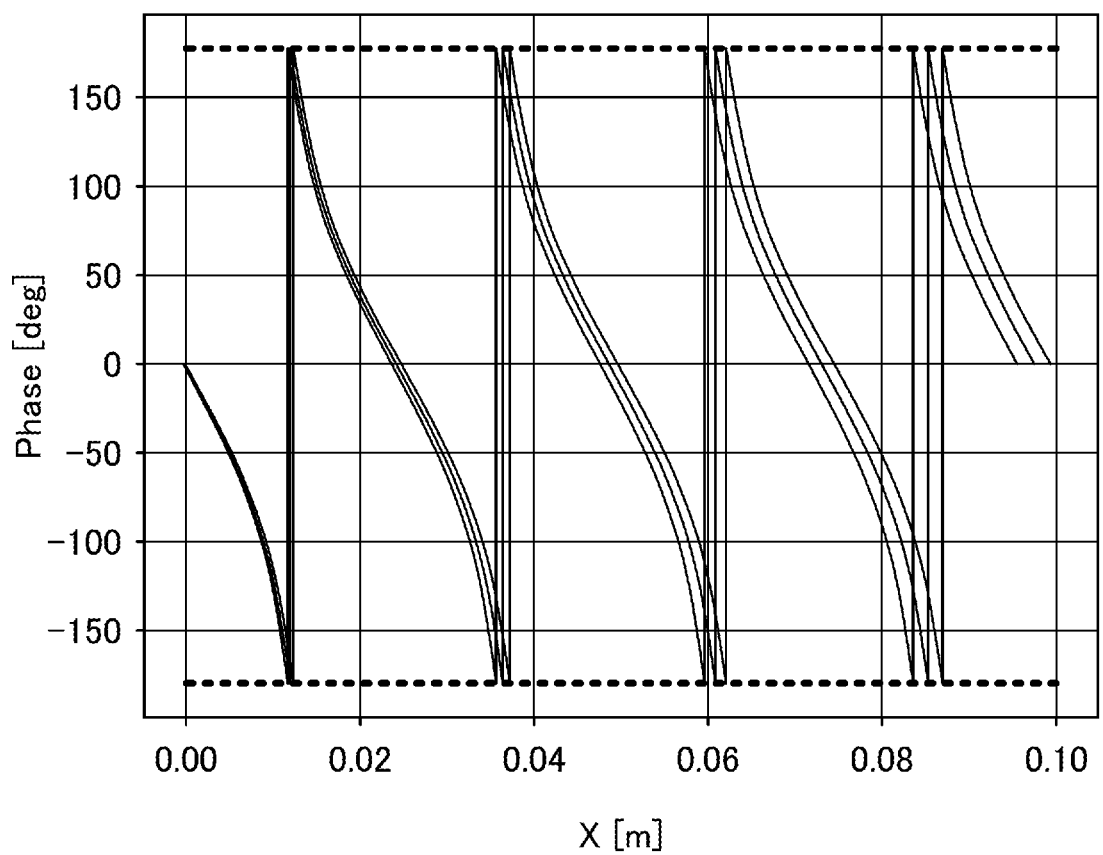
FIG. 33A shows changes in the phase jump of reflection pattern 1.

FIG. 33A shows changes in phase jumps of Pattern 1. The horizontal axis represents the position (m) and the vertical axis represents the phase (degrees). In Deep-in Shallow-out of FIG. 33A, the angle of reflection θr is fixed at 30 degrees, and the angle of incidence θi is changed to 68.5°, 70°, and 71.5°. At deep angles of incidence, the distribution of phase jumps does not change significantly even if the angle of incidence changes in the range of 3°.

Figure 33B:
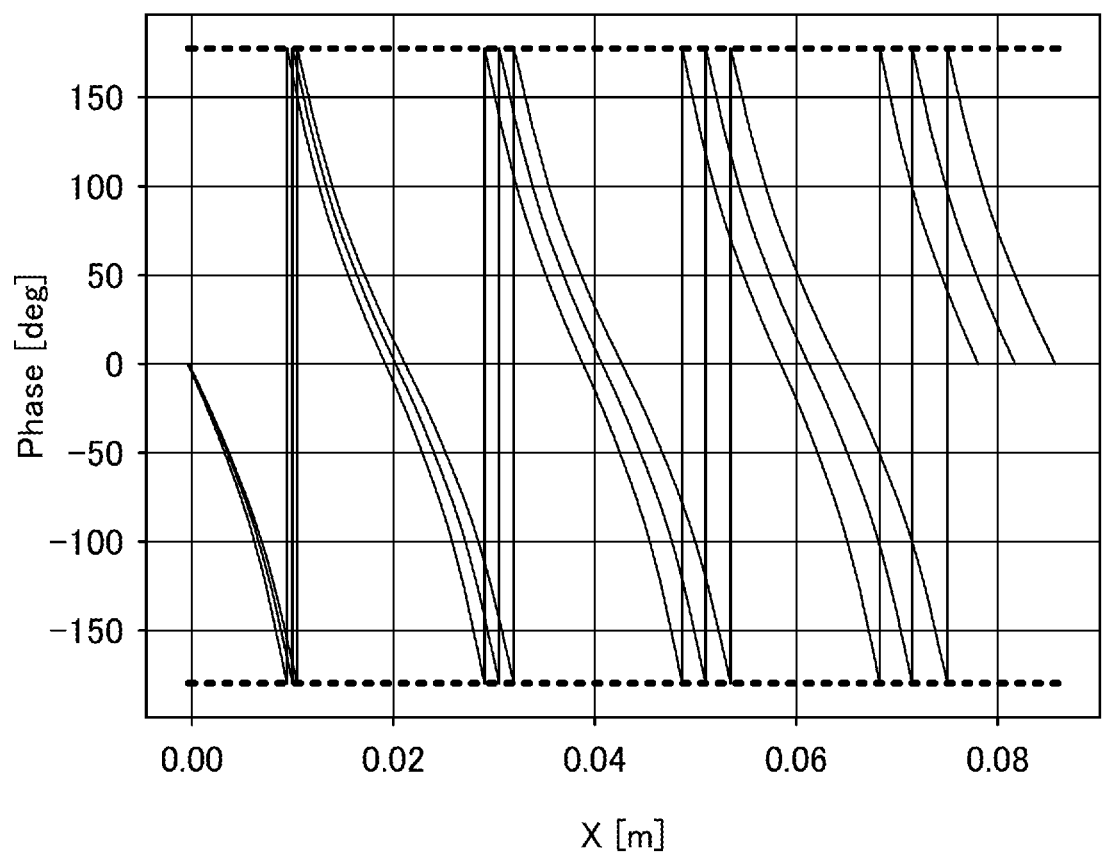
FIG. 33B shows changes in phase jumps of reflection pattern 2.

FIG. 33B shows changes in phase jumps of Pattern 2. The horizontal axis represents the position (m) and the vertical axis represents the phase (degrees). In Shallow-in Deep-out of FIG. 33B, the angle of reflection θr is fixed at 60 degrees, and the angle of incidence θi is changed to 18.5°, 20°, and 21.5°. In the case of the shallow angle incidence, if the incidence angle changes in the range of 3° as in FIG. 33A, the distribution of phase jumps is greatly shifted depending on the incidence angle.

It is also understood from FIG. 33A and FIG. 33B that the layout design of FIG. 30A is preferable to that of FIG. 30B in terms of equalizing the phase jump distribution of the radio waves incident onto the electromagnetic wave reflector 10. In the layout of FIG. 30A, the base stations BS are provided at positions where the radio waves emitted from the base stations BS are incident onto the reflective surface 105 of the electromagnetic wave reflector 10 at an incident angle of 50 degrees or more.

Although the present invention has been described above based on specific configuration examples, various alterations and substitutions are possible without departing from the scope of the invention. The meta-reflector 102 may adopt any configuration as long as the reflection characteristic such as the reflection phase can be controlled. A periodic structure having frequency selectivity or wavelength selectivity may be appropriately designed. In some or all of the configuration examples described above, the outer surfaces of the bridge electrodes may be coated with an insulating film.

The electromagnetic wave reflector 10 may be provided along one side of the elongated production line 3 as shown in FIG. 30A, or it may be provided along both sides of the production line 3 as shown in FIG. 2. If the production line 3 is L-shaped, the electromagnetic wave reflector 10 may be installed along each region forming a rectangular area, or alternatively, the electromagnetic wave reflector 10 may be installed in the main areas of the production line. In either case, the base station BS is provided at a position where radio waves from the base station are incident onto the reflective surface 105 of the electromagnetic wave reflector 10 at a deep incident angle.

The equipment in the production line 3 does not always receive only the radio waves reflected from the electromagnetic wave reflector 10, but can receive the radio waves directly from the base station BS. In this case, receive diversity can be achieved by in-phase signal reception. If two base stations BS are provided at both ends of the elongated production line 3, cooperative type base stations may be used.

An individual electromagnetic wave reflector 10 may be transported with the frame 111 fixed to one edge of the panel 13 and the guide beam 118 attached to the opposing edge, as shown in FIG. 11A. In this case, on-site work for attaching parts is unnecessary, and assembly is facilitated. Alternatively, the panel 13 may be transported with only the frame 111 attached, and assembled on site using the guide beams 118. Moreover, the metasurface may be attached onto the panel 13 at the installation site of the electromagnetic wave reflector 10, as illustrated in FIG. 5A.

The electromagnetic wave reflector and the wireless transmission system according to the embodiments can contribute to implementation of a smart factory.

What is claimed is:

1. An electromagnetic wave reflector, comprising:
   a panel having a reflective surface configured to reflect a radio wave of a frequency band selected from 1 GHz to 170 GHz; and
   a support body that supports the panel comprising a connector part configured to be electrically connected to the reflective surface of the panel,
   wherein the connector part is configured to propagate a reference potential of a reflection having occurred at the reflective surface, and the reflective surface of the panel has a symmetric reflective region configured to reflect the radio wave at a reflection angle equal to an incident angle of the radio wave and an asymmetric reflective region configured to reflect the radio wave at an angle different from the incident angle.

2. The electromagnetic wave reflector of claim 1, wherein upon connection of another electromagnetic wave reflector to the support body, the connector part shares the reference potential between the electromagnetic wave reflector and said other the another electromagnetic wave reflector.

3. The electromagnetic wave reflector of claim 1, wherein at least a part of the panel has a conductor that forms the reflective surface, and the conductor is connected to the connector part of the support body.

4. The electromagnetic wave reflector of claim 3, wherein the panel has a dielectric that retains the conductor, and at least a part of the conductor is folded back at an edge of the panel and drawn onto a surface of the dielectric opposite to a retaining surface for the conductor.

5. The electromagnetic wave reflector of claim 4, further comprising:
   a conductive jacket configured to hold the edge of the panel,
   wherein the part of the conductor drawn onto the surface of the dielectric is in surface-contact with the conductive jacket.

6. The electromagnetic reflector of claim 4, wherein the dielectric comprises an optical plastic, a reinforced plastic, or a reinforced glass.

7. The electromagnetic wave reflector of claim 1, wherein the asymmetric reflective region of the reflective surface of the panel includes a diffusing region configured to reflect the radio wave at a predetermined angular distribution.

8. The electromagnetic wave reflector of claim 1, wherein an area of the asymmetric reflective region of the reflective surface covers at least a first Fresnel zone determined by a frequency band of the radio wave.

9. The electromagnetic wave reflector of claim 1, wherein the asymmetric reflective region of the reflective surface of the panel is attached to a movable member that can move over a panel surface.

10. The electromagnetic wave reflector of claim 1, wherein the reflective surface of the panel has a mesh, a grating, or an array of holes formed at a density that reflects the radio wave of the frequency band, and an average period of the mesh, the grating, or the array of holes formed at the density is one fifth (⅕) or less of a free-space wavelength of the frequency band.

11. The electromagnetic wave reflector of claim 1, wherein at least a part of the panel is transparent to visible light.

12. The electromagnetic wave reflector of claim 1, wherein the support body has a base that allows the panel to stand on an installation plane.

13. The electromagnetic wave reflector of claim 1, wherein the panel is flat.

14. The electromagnetic reflector of claim 1, wherein the reflective surface comprises a normal reflector and a meta-reflector.

15. An electromagnetic wave reflective fence, comprising:
   a plurality of electromagnetic wave reflectors comprising a plurality of support bodies such that the plurality of electromagnetic wave reflectors is connected by the plurality of support bodies,
   wherein each of the plurality of electromagnetic wave reflectors includes a panel having a reflective surface configured to reflect a radio wave of a frequency band selected from 1 GHz to 170 GHz such that the panel is supported by a respective one of the support bodies, the support body has a connector part configured to be electrically connected to the reflective surface and propagate a reference potential of a reflection having occurred at the reflective surface, and the reflective surface of the panel has a symmetric reflective region configured to reflect the radio wave at a reflection angle equal to an incident angle of the radio wave and an asymmetric reflective region configured to reflect the radio wave at an angle different from the incident angle.

16. The electromagnetic wave reflective fence of claim 15, further comprising:
   a reinforcing mechanism that reinforces an electrical connection provided by the connector part between adjacent electromagnetic wave reflectors.

17. A method of assembling an electromagnetic wave reflector, comprising:

mechanically connecting a first panel having a first reflective surface configured to reflect radio waves in a frequency band selected from a range of 1 GHz to 170 GHz and a second panel having a second reflective surface configured to reflect the radio waves in the frequency band with a support member; and allowing a reference potential of reflection to be continuous between the first reflective surface and the second reflective surface through an electrical connector part provided in the support member, and each of the first reflective surface and the second reflective surface has a symmetric reflective region configured to reflect the radio wave at a reflection angle equal to an incident angle of the radio wave and an asymmetric reflective region configured to reflect the radio wave at an angle different from the incident angle.

18. The method of claim 17, wherein at least one of the first panel and the second panel has a metasurface with a controlled reflection characteristic on the first reflective surface or the second reflective surface, and a position of the metasurface on a reflective surface is determined at an installation site of the electromagnetic wave reflector.

19. The method of claim 18, wherein the metasurface has a periodic structure having frequency selectivity or wavelength selectivity.

* * * * *